(12) United States Patent
Toda

(10) Patent No.: US 6,515,937 B2
(45) Date of Patent: Feb. 4, 2003

(54) TEST CIRCUIT FOR TESTING SEMICONDUCTOR MEMORY

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/165,651

(22) Filed: Jun. 6, 2002

(65) Prior Publication Data

US 2002/0149991 A1 Oct. 17, 2002

Related U.S. Application Data

(62) Division of application No. 09/887,768, filed on Jun. 21, 2001, now Pat. No. 6,426,912, which is a division of application No. 09/328,562, filed on Jun. 9, 1999, now Pat. No. 6,285,623, which is a division of application No. 08/725,542, filed on Oct. 3, 1996, now Pat. No. 5,926,431.

(30) Foreign Application Priority Data

Oct. 4, 1995 (JP) .............................................. 7-257735
Sep. 30, 1996 (JP) .............................................. 8-278881

(51) Int. Cl.[7] ................................................. G11C 8/00
(52) U.S. Cl. ..................................... 365/230.03; 365/51
(58) Field of Search .............................. 365/230.03, 51, 365/63, 233

(56) References Cited

U.S. PATENT DOCUMENTS

| | | | |
|---|---|---|---|
| 5,265,055 A | 11/1993 | Horiguchi et al. |
| 5,301,142 A | 4/1994 | Suzuki et al. |
| 5,313,437 A | 5/1994 | Toda et al. |
| 5,369,619 A | 11/1994 | Ohba |
| 5,384,745 A | 1/1995 | Konishi et al. |
| 5,406,566 A | 4/1995 | Obara |
| 5,471,482 A | 11/1995 | Byers |
| 5,502,675 A | 3/1996 | Kohno |
| 5,517,456 A | 5/1996 | Chishiki |
| 5,586,078 A | 12/1996 | Takase |
| 5,596,541 A | 1/1997 | Toda |
| 5,598,374 A | 1/1997 | Rao |
| 5,706,244 A | 1/1998 | Shimizu |
| 5,734,619 A | 3/1998 | Numata |

FOREIGN PATENT DOCUMENTS

| | | |
|---|---|---|
| EP | 0-421447 | 4/1991 |
| JP | 63-292487 | 11/1988 |

Primary Examiner—Amir Zarabian
(74) Attorney, Agent, or Firm—Hogan & Hartson, LLP

(57) ABSTRACT

Banks are arranged on a memory chip, forming a matrix. A data input/output circuit is provided at one side of the memory chip. A data bus is provided among the banks and connected to the data input/output circuit. Each bank has a plurality of memory cell arrays a cell-array controller, a row decoder, column decoders, and a DQ buffer. The cell-array controller and the row decoder oppose each other. The column decoders oppose the DQ buffer. Local DQ lines are provided between the memory cell arrays, and global DQ liens extend over the memory cell arrays. The local DQ lines extend at right angles to the global DQ lines.

5 Claims, 32 Drawing Sheets

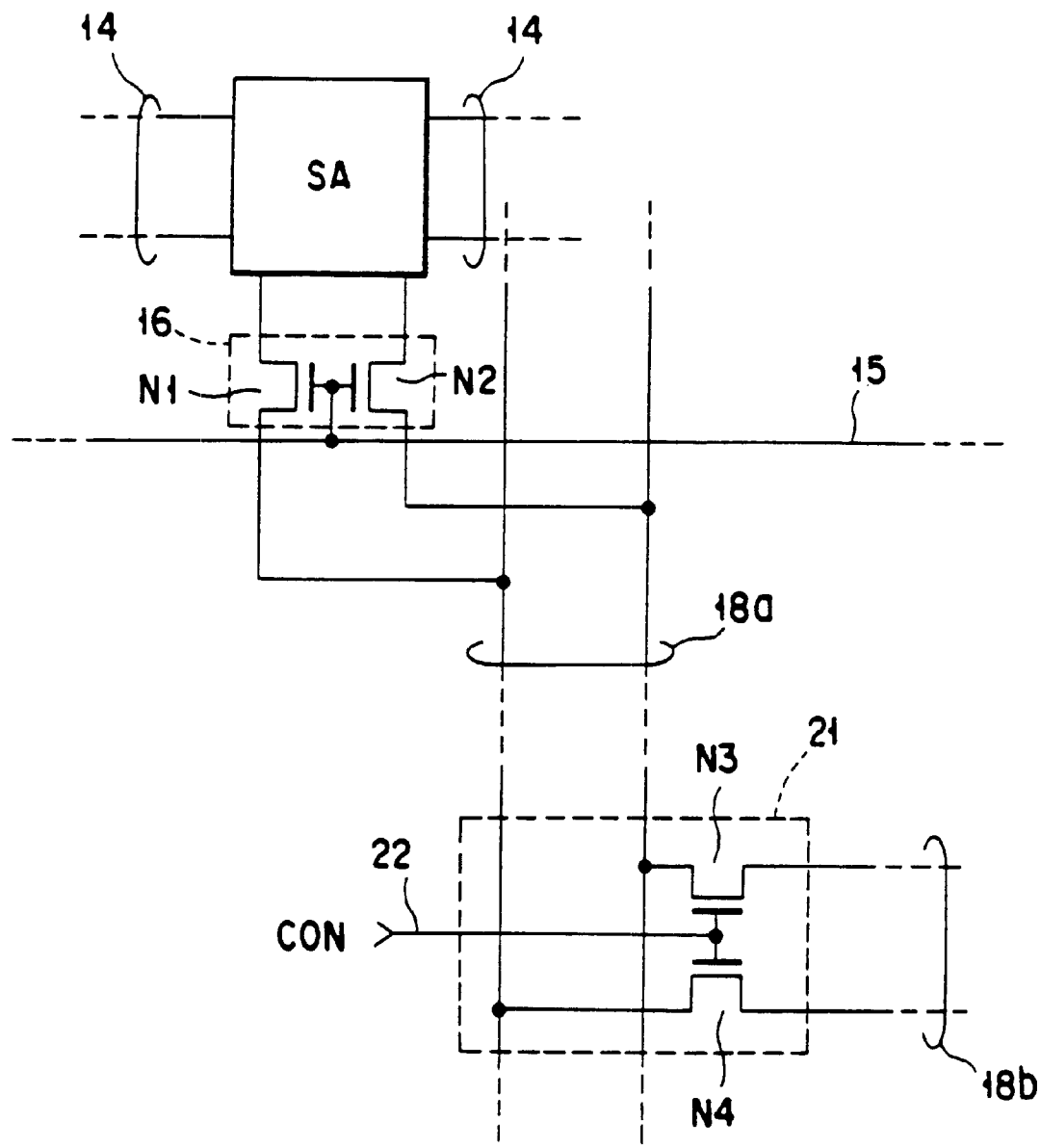
F I G. 13

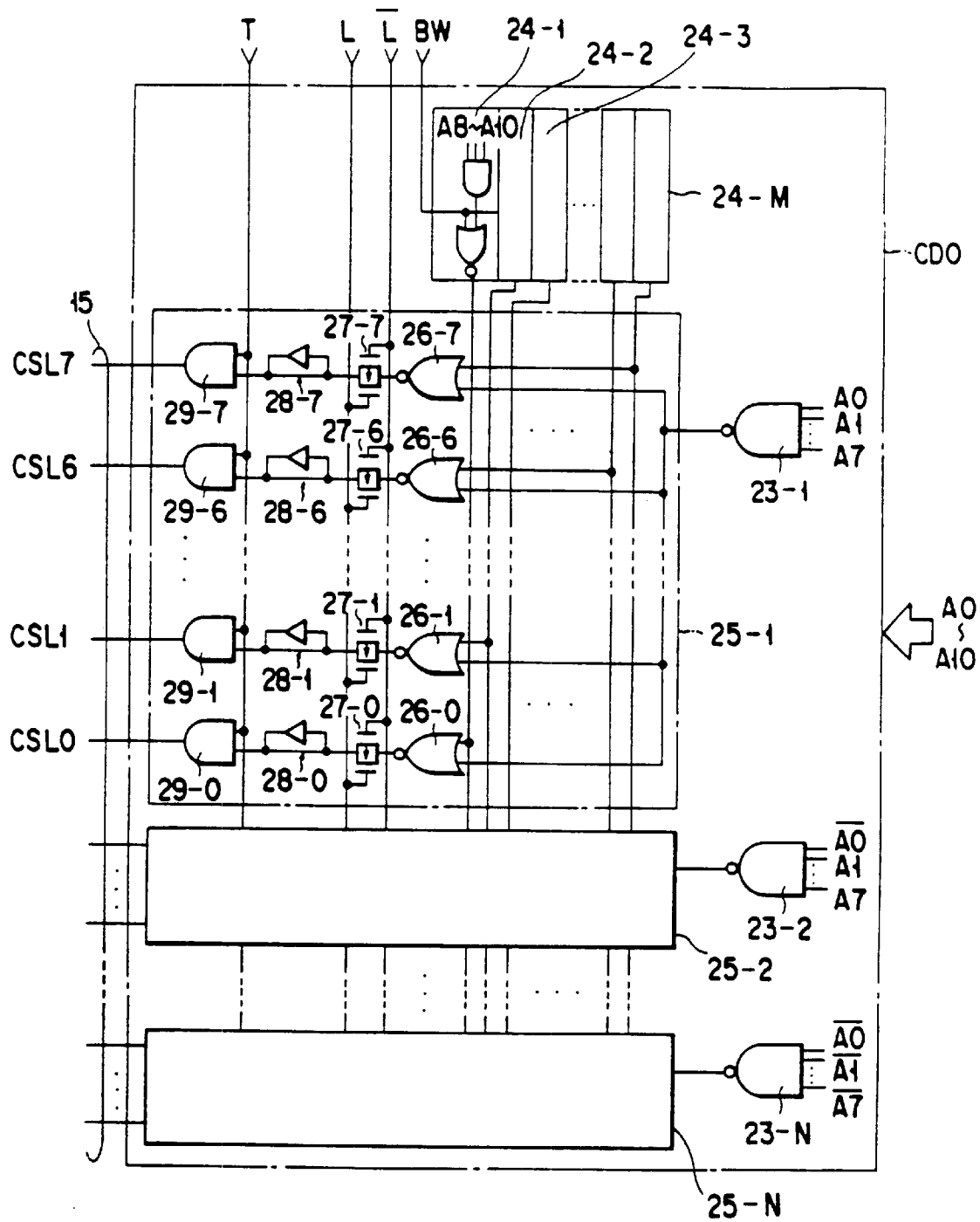
F I G. 14

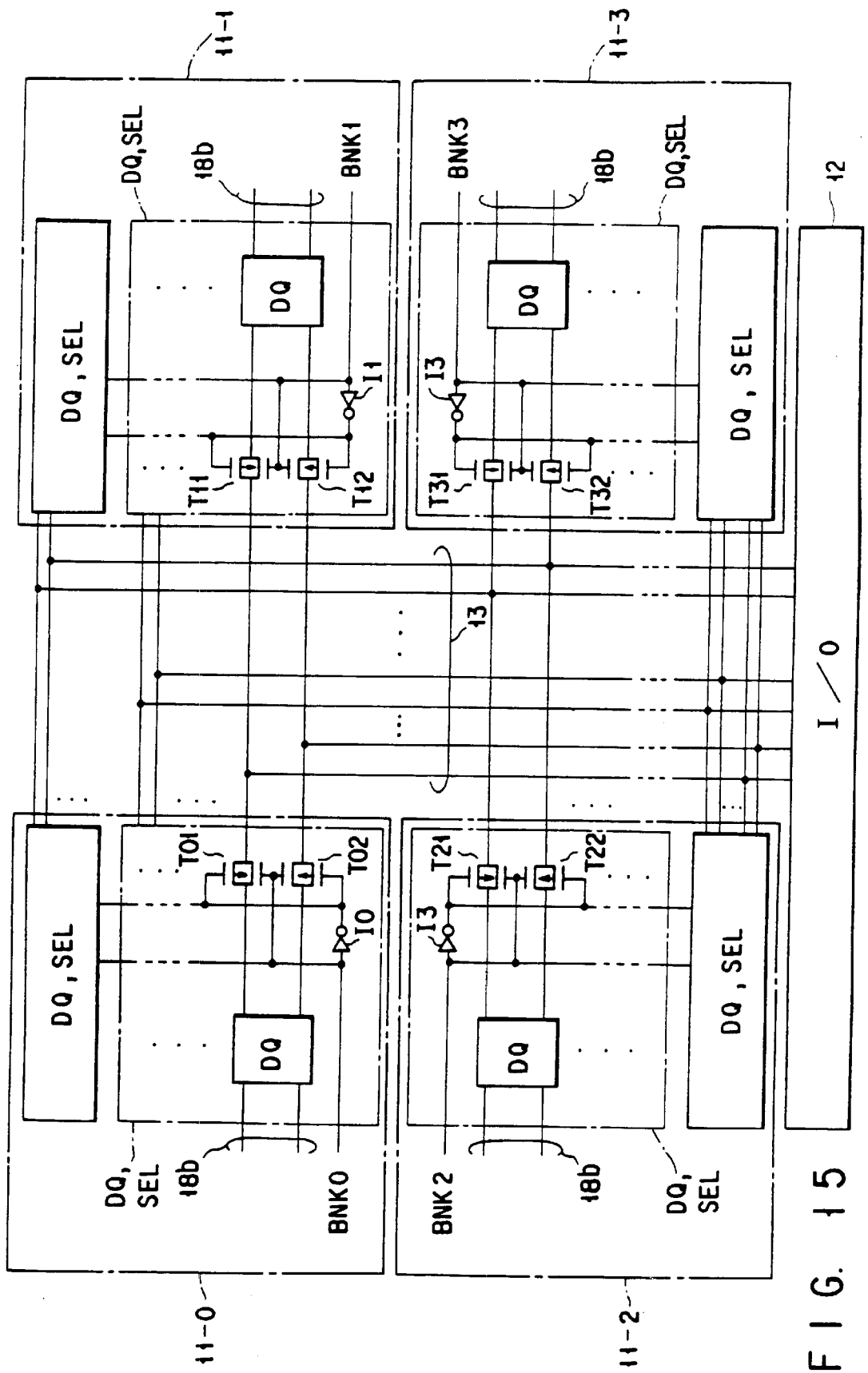
F I G. 15

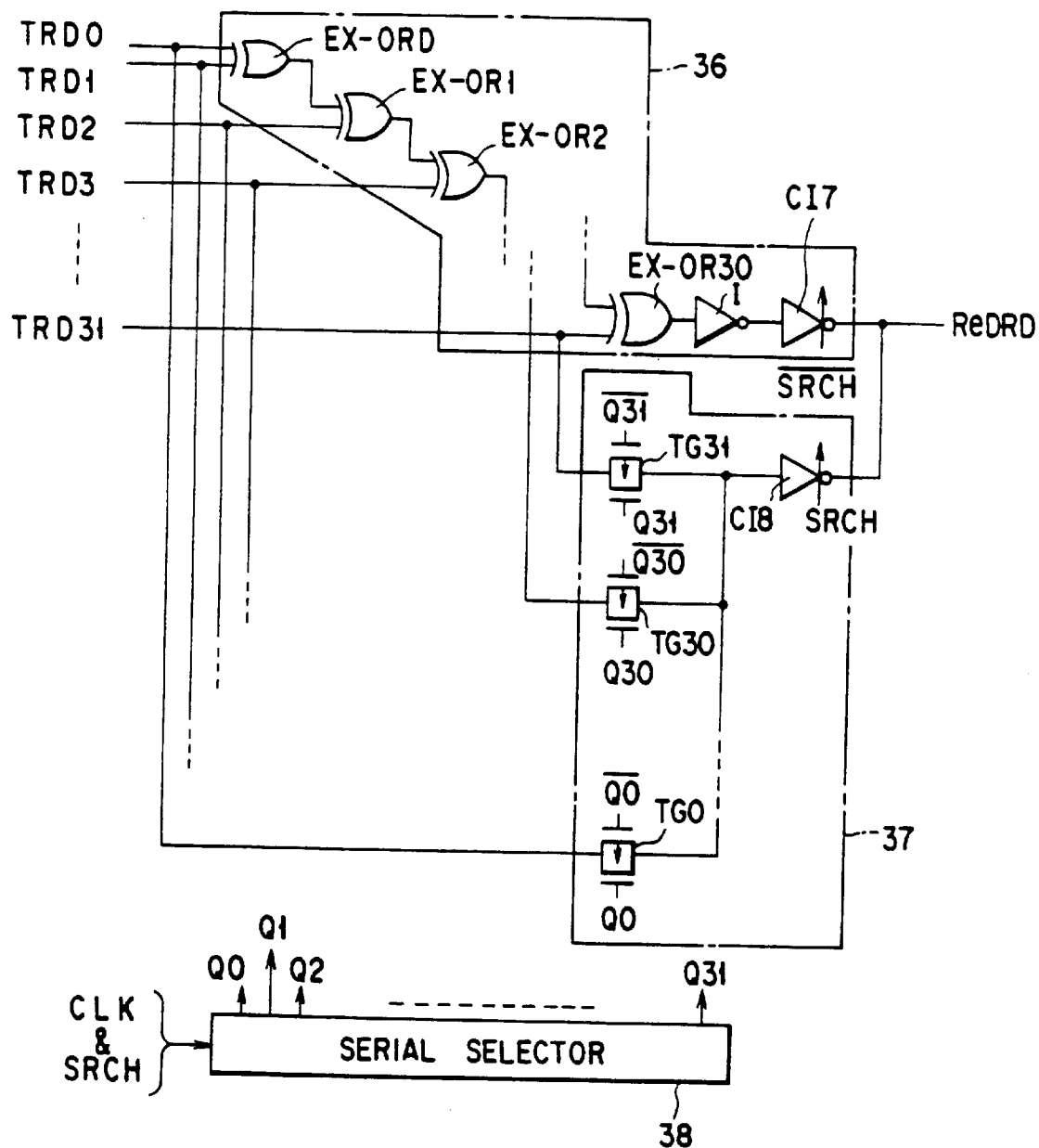
F I G. 19

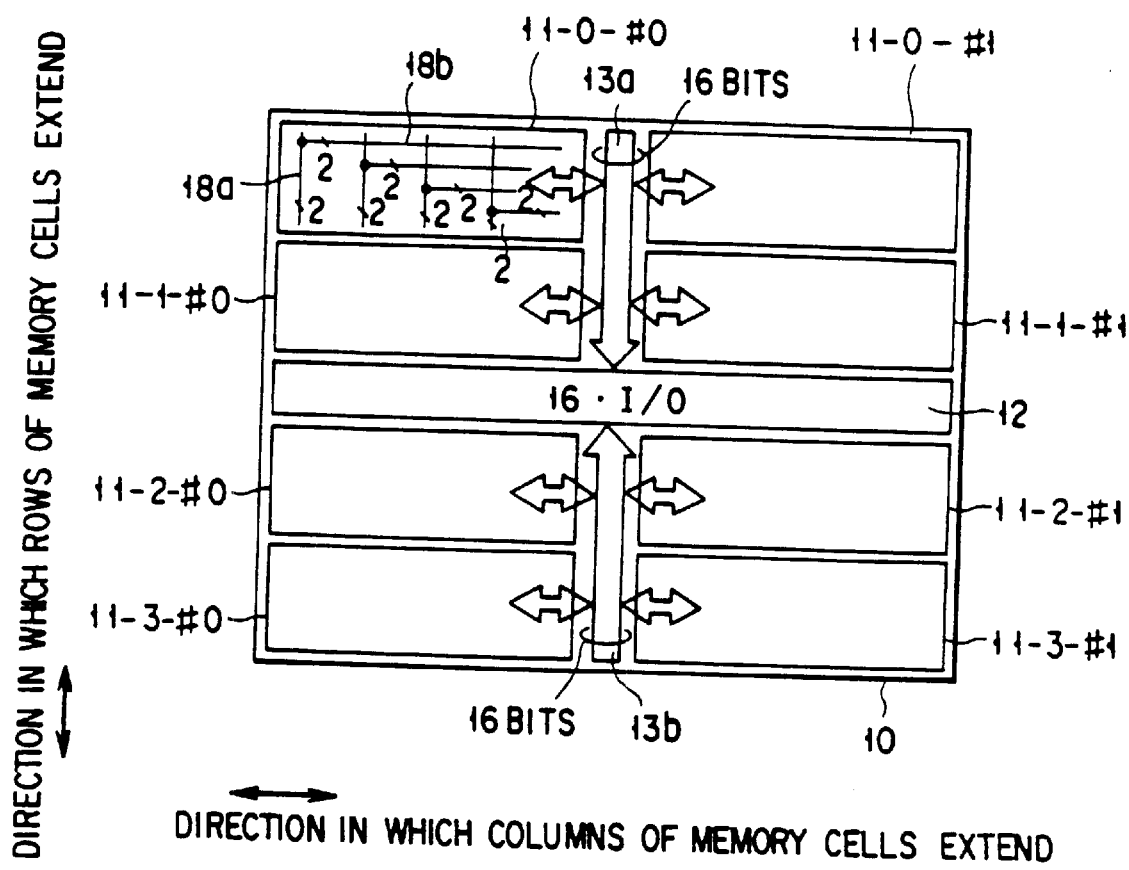
F I G. 27

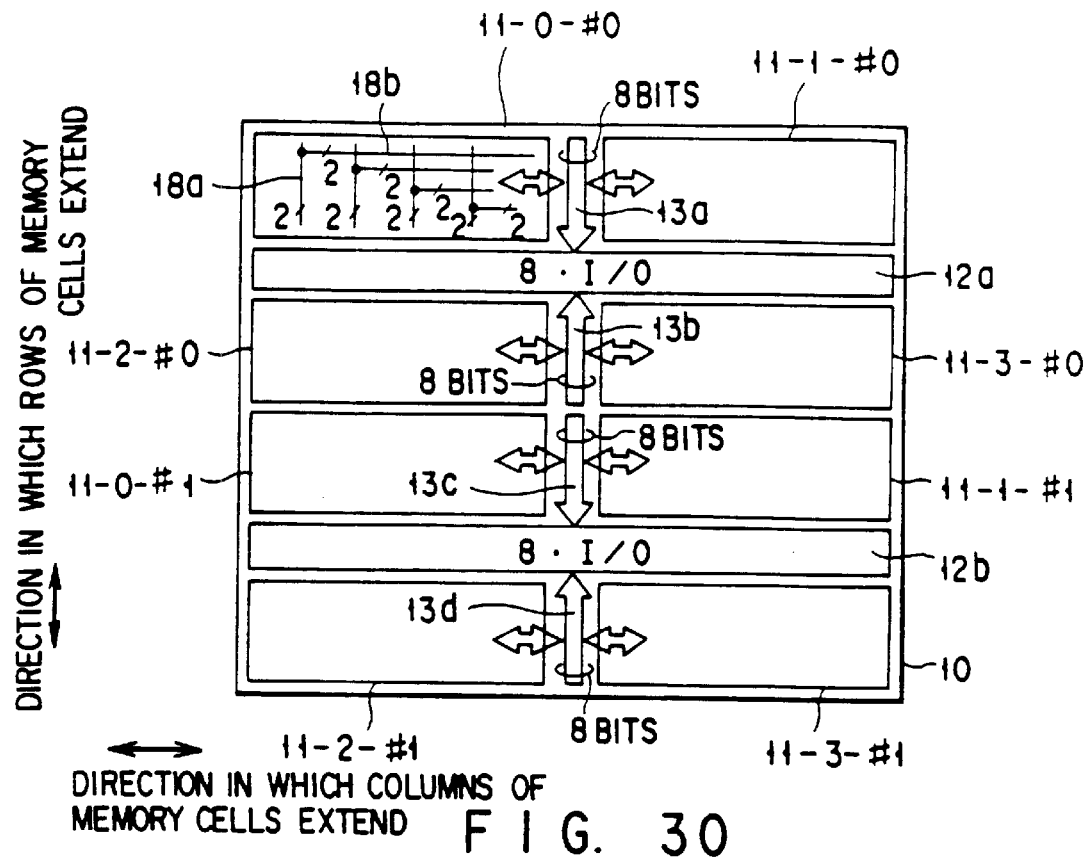
F I G. 30
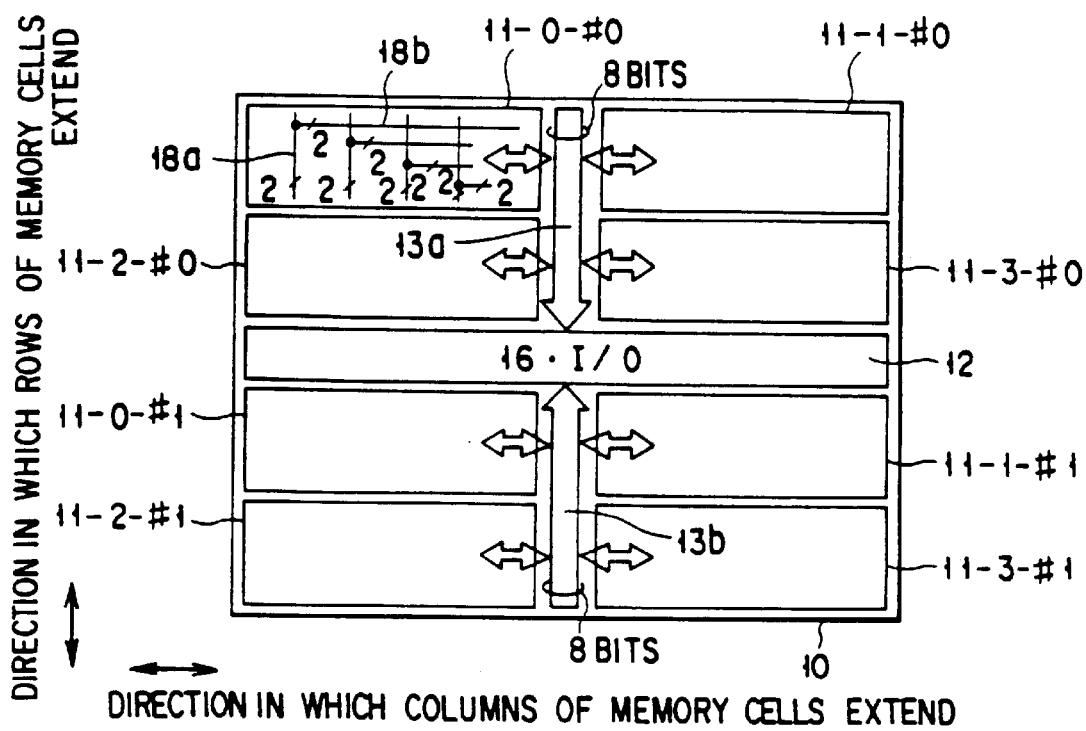
F I G. 33

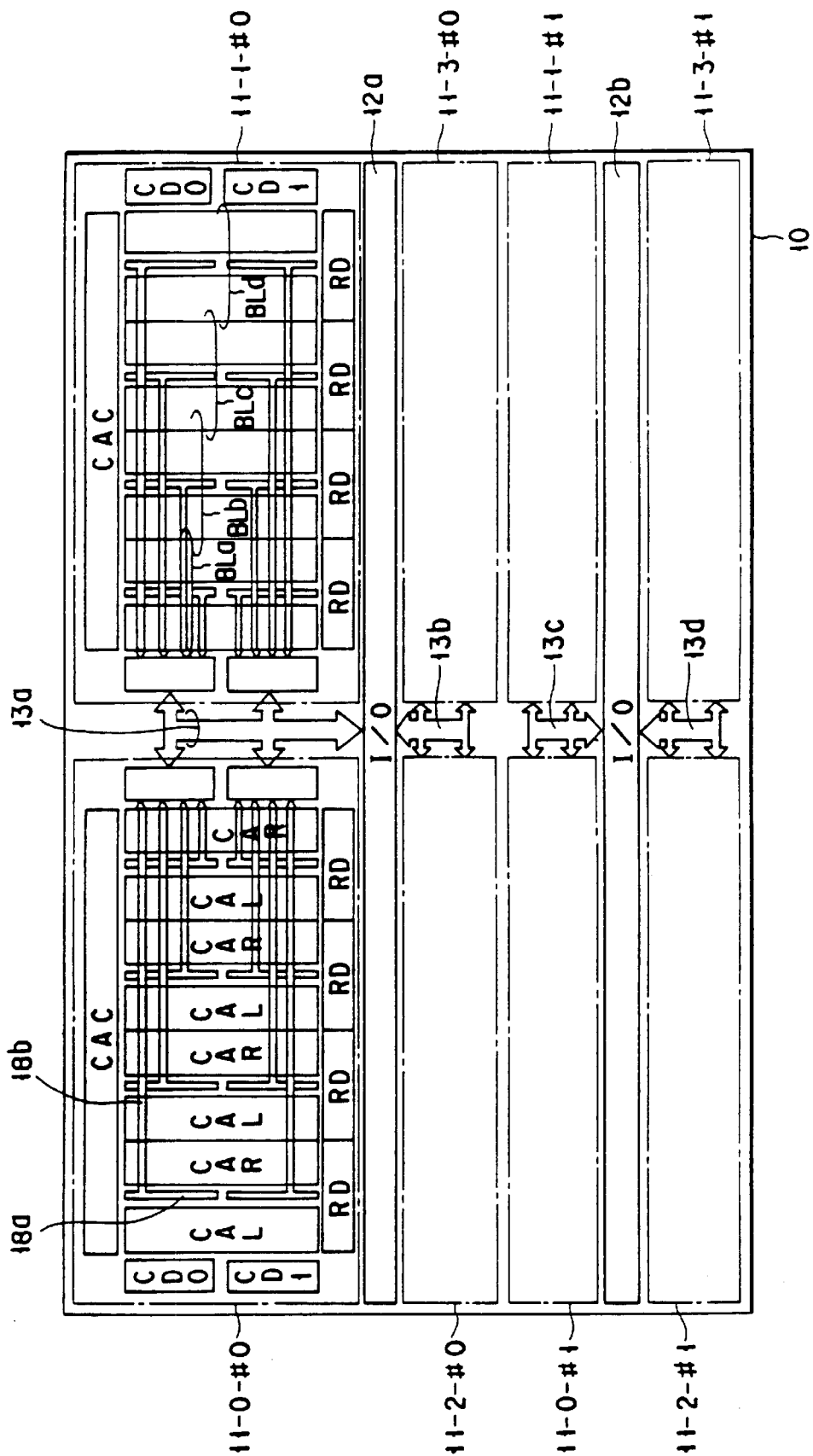
F I G. 32

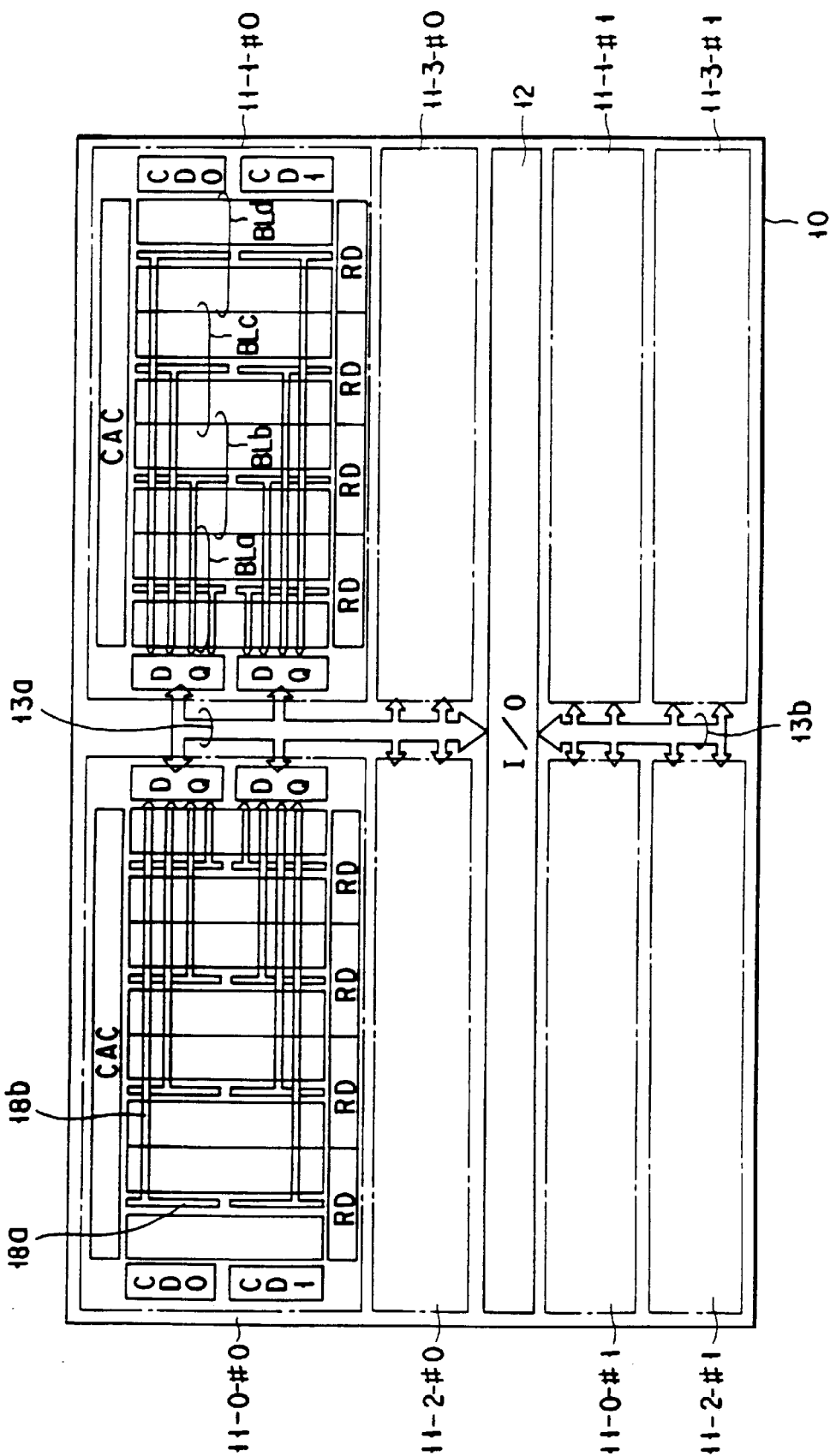
F I G. 35

TEST CIRCUIT FOR TESTING SEMICONDUCTOR MEMORY

This is a divisional of application Ser. No. 09/887,768 filed Jun. 21, 2001, now U.S. Pat. No. 6,426,912 which is a divisional of Ser. No. 09/328,562 filed Jun. 9, 1999, now U.S. Pat. No. 6,285,623 issued Sep. 4, 2001, which is a divisional of Ser. No. 08/725,542 filed Oct. 3, 1996 now U.S. Pat. No. 5,926,431 issued Jul. 20, 1999, which application is hereby incorporated by reference in its entirety.

BACKGROUND OF THE INVENTION

1. Field of the Invention

The present invention relates to a semiconductor memory of multi-bit type which stores and outputs a plurality of bits at the same time, which form a multi-bit data.

2. Description of the Related Art

A digital system having a semiconductor memory such as a DRAM (Dynamic Random-Access Memory) has the following three features to increase the speed of transferring data.

First, the semiconductor memory is a multi-bit type which can store and output the bits forming a multi ($\times 2^n$)-bit data (n is a natural number), at the same time.

Second, the semiconductor memory stores and outputs data in synchronism with an external clock signal supplied from a CPU (Central Processing Unit). The higher the frequency of the clock signal, the faster the memory (e.g., a SDRAM or a RDRAM) can store and output continuous data. Thus, the memory can serve to increase the speed of transferring data.

Third, the semiconductor memory incorporates a plurality of banks. The banks have identical elements each. The banks can store and output data, independently of one another. These measures taken, the time required to access the first data (known as "latency") is short, thus enhancing the speed of transferring data.

FIG. 1 shows the layout of a conventional semiconductor memory. This memory has all three features mentioned above.

The conventional semiconductor memory comprises a memory chip 10 and four banks 11-0 to 11-3 provided in the chip 10. Each of the banks 11-0 to 11-3 comprises a memory cell array and peripheral circuits such as a cell-array controller, a row address decoder, a column address decoder and a DQ buffer (i.e., a buffer provided in the input/output section of the bank).

The memory chip 10 has input/output region 12. Provided in the data I/O region 12 are a plurality of input/output (I/O) circuits. For example, 16 I/O circuits are provided if the memory chip 10 is designed to store and output 16 bits (i.e., 16-bit data, or 2-byte data) at the same time.

The memory chip 10 also has a data bus 13. The bus 13 extends between one block consisting of the first and second banks 11-0 and 11-1 and the other block consisting of the third and fourth banks 11-2 and 11-3. The data bus 13 is designed to transfer data (e.g., 16-bit data) between each bank and the data I/O region 12.

How the memory chip 10 stores and outputs multi-bit data will be explained.

First, one of the four banks 11-0 to 11-3 is selected. In the bank selected, the memory cell array is accessed on the basis of an address signal. As a result, $2^n$-bit (e.g., 16-bit data, or 2-byte data) is output from the bank. The $2^n$-bit data is supplied to the data I/O region 12. The I/O region 12 outputs the data. Thus, the $2^n$-bit data is output from the memory chip 10.

It is desired that the ratio of the region occupied by the data bus 13 to the all chip area be reduced as much as possible. In other words, the bus 13 needs to be made as thin as possible to decrease the chip area.

However, the greater the number of bits the chip 10 simultaneously store and outputs, the thicker the data bus 13, and hence the larger the region the bus 13 occupies. More specifically, as the number of bits which the memory chip 10 can simultaneously store and output increases (from 16 bits to 32 bits and hence to 64 bits), the area of the memory chip 10 inevitably increases.

SUMMARY OF THE INVENTION

The present invention has been made to solve the above-mentioned problem inherent in the conventional semiconductor memory. Its object is to provide a semiconductor memory of multi-bit, clock-synchronized and multi-bank type which can transfer data at high speed, without having its chip area increased.

To achieve the object, a semiconductor memory according to a first aspect of the invention comprises a memory chip and a plurality of banks arranged on the memory chip, for storing and outputting multi-bit data, independently of one another.

Each of the banks has a plurality of memory-cell blocks, at least one column decoder, a plurality of row decoders, a plurality of DQ buffers, and a a cell-array controller.

Each of the memory-cell blocks comprises two sub-blocks, sense amplifiers, word lines, data lines and column-selecting line. Each sub-block is composed of one memory cell array. The sense amplifiers are located between the two sub-blocks. The word lines, data lines and column-selecting lines are arranged on the memory cell arrays constituting the two sub-blocks. The memory-cell blocks are paced apart along columns of memory cells and the column-selecting lines and data lines. The sub-blocks are spaced apart also along the columns of memory cells.

The column decoder is located at at least a first end of every column of memory cells. It is connected to the column-selecting lines.

The row decoders are located at a first end of every row of memory cells along which the word line extend, and are connected to the word lines. Each row decoder is provided for one memory-cell block.

The DQ buffers are located at a second end of every row of memory cells. Each DQ buffer is provided for one memory-cell block;

The cell-array controller is located at a second end of very row of memory cells, for controlling the reading and writing of the multi-bit data.

The semiconductor memory further comprises a data input/output region and a data bus. The data region is provided on the memory chip, for receiving multi-bit data from an external device and outputting multi-bit data to an external device. The data bus is provided for the plurality of banks, extends parallel to the columns of memory cells, for transferring multi-bit data between the plurality of banks, one the one hand, and the data input/output region, on the other.

Each bank has local DQ-line pairs and global DQ-line pairs. Each DQ-line pair is provided between the two sub-blocks of one memory-cell block and extends parallel to the rows of memory cells. The global DQ-line pairs extend over the memory-cell blocks, along the columns of memory cells. They connect the local DQ-line pairs to the DQ buffers.

A semiconductor memory according to a second aspect of the invention comprises a memory chip and a plurality of main banks. The main banks are arranged on the memory chip, for storing and outputting multi-bit data, independently of one another. Each main bank is composed of a plurality of sub-banks.

Each of the sub-banks comprises a plurality of memory-cell blocks, at least one column decoder, a plurality of row decoders, a plurality of DQ buffers, and a cell-array controller.

Each of the memory-cell blocks comprises two sub-blocks, sense amplifiers, word lines, data lines and column-selecting line. Each of the sub-blocks is composed of one memory cell array. The sense amplifiers is located between the two sub-blocks. The word lines, data lines and column-selecting lines are arranged on the memory cell arrays constituting the two sub-blocks. The memory-cell blocks are spaced apart along columns of memory cells and the column-selecting lines and data lines. The sub-blocks are spaced apart also along the columns of memory cells.

The column decoder is located at at least a first end of every column of memory cells. It is connected to the column-selecting lines.

The row decoders are located at a first end of every row of memory cells along which the word line extend. They are connected to the word lines. Each row decoder is provided for one memory-cell block.

The DQ buffers are located at a second end of every row of memory cells. Each DQ buffer is provided for one memory-cell block.

The cell-array controller is located at a second end of very row of memory cells, for controlling the reading and writing of the multi-bit data.

The semiconductor memory further comprises a data/input region and a plurality of data buses. The data input/output region is provided on the memory chip, for receiving multi-bit data from an external device and outputting multi-bit data to an external device. The data buses are provided for at least two of the sub-banks and extend parallel to the columns of memory cells, for transferring multi-bit data between the sub-banks, one the one hand, and the data input/output region, on the other.

Each sub-bank has local DQ-line pairs and global DQ-line pairs. Each local DQ-line pair is provided between the two sub-blocks of one memory-cell block and extends parallel to the rows of memory cells. The global DQ-line pairs extend over the memory-cell blocks, along the columns of memory cells, and connect the local DQ-line pairs to the DQ buffers.

A semiconductor memory according to a third aspect of the invention comprises a test circuit, a memory cell array composed of a plurality of memory-cell blocks, data-writing means for writing bits of data simultaneously into memory cells of at least one of the memory-cell blocks, and a register for-holding the data to be written into the at least one of the memory-cell blocks.

The test circuit comprises write/read means, comparing means and an output circuit. The write/read means is designed to write the data held in the register into the memory cells of the at least one of the memory-cell blocks and to read data from the memory cells. The comparing means compares the data held in the register with the data read from the memory cells to determine whether the semiconductor memory is flawless and for generating one-bit data representing whether the semiconductor memory is flawless. The output circuit is designed to output the one-bit data generated by the comparing means, from the semiconductor memory.

The test circuit further comprises latch means for holding the n-bit data generated by the comparing means, and switching means for supplying n bits of the data generated by the comparing means, sequentially to the output circuit when the comparing means determines that the semiconductor memory is defective.

The semiconductor memory having the test circuit is an n-bit type which can store and output n bits of data at the same time, which has n output pads for use in normal operating mode. In the test mode, one of the n output pads is connected to the test output circuit of the test circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 13 is a circuit diagram illustrating one of the identical column-selecting switches and one of the identical switches, all incorporated in the memory chip shown in FIGS. 11 and 12.

FIG. 14 is a circuit diagram showing one of the column decoders incorporated in the memory used in the memory chip shown in FIGS. 11 and 12;

FIG. 15 is a circuit diagram showing the bank selectors provided in the memory chip of FIGS. 11 and 12;

FIG. 19 is diagram showing the test-mode switching circuit incorporated in the test circuit of FIG. 17;

FIG. 27 is a diagram depicting the layout of a second modification of the memory chip illustrated in FIG. 23;

FIG. 30 is a diagram depicting the layout of a third modification of the memory chip illustrated in FIG. 23;

FIG. 32 is a diagram showing the layout of a third modification of the memory chip illustrated in FIG. 22;

FIG. 33 is a diagram depicting the layout of a fourth modification of the memory chip illustrated in FIG. 22;

FIG. 35 is a diagram depicting the layout of a fourth modification of the memory chip shown in FIG. 22;

DETAILED DESCRIPTION OF THE PREFERRED EMBODIMENTS

Semiconductor memories according to the present invention will be described in detail, with reference to the accompanying drawings.

Figure 2:
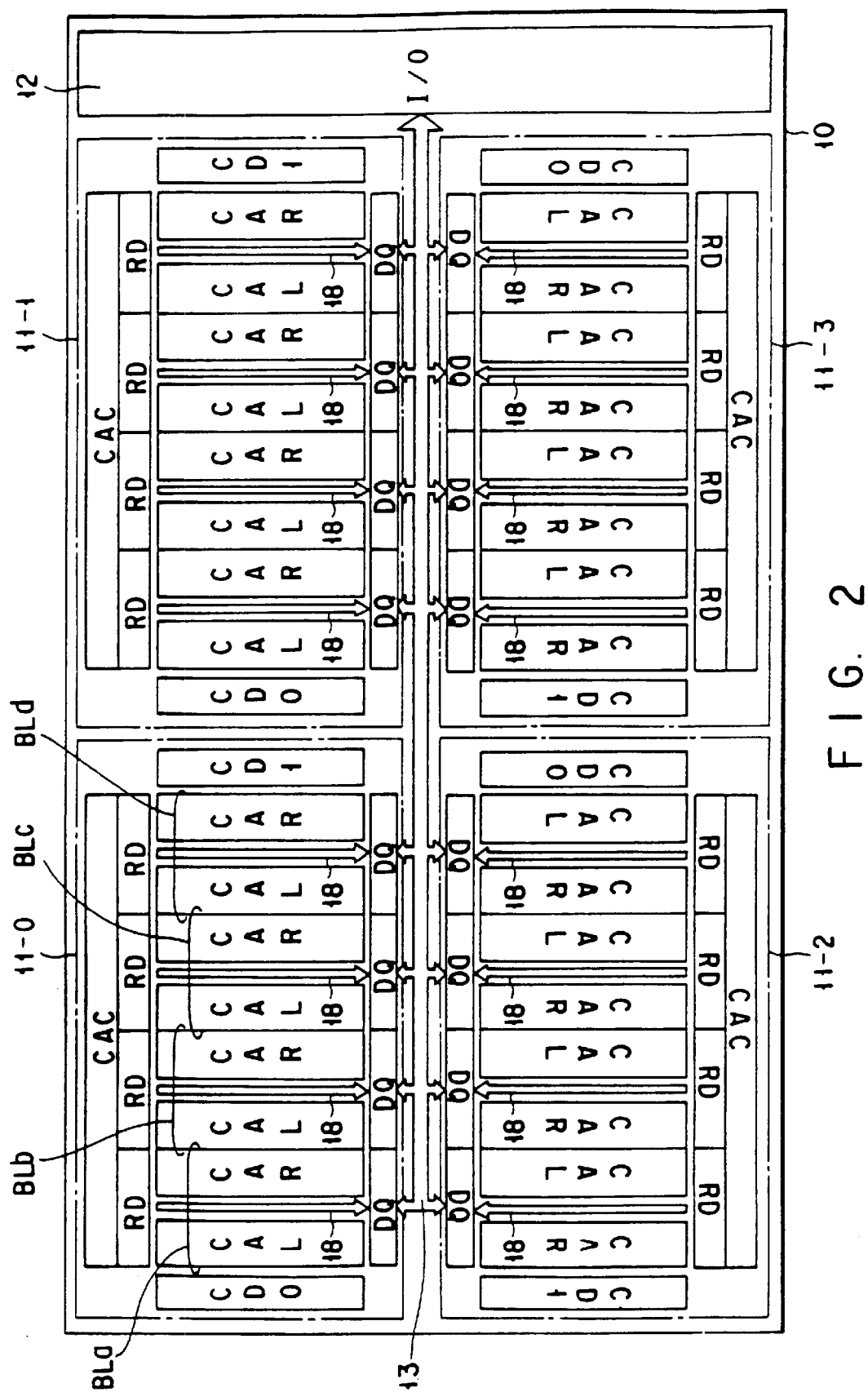
FIG. 2 is a diagram illustrating the layout of a first comparative semiconductor memory chip.
Figure 3:
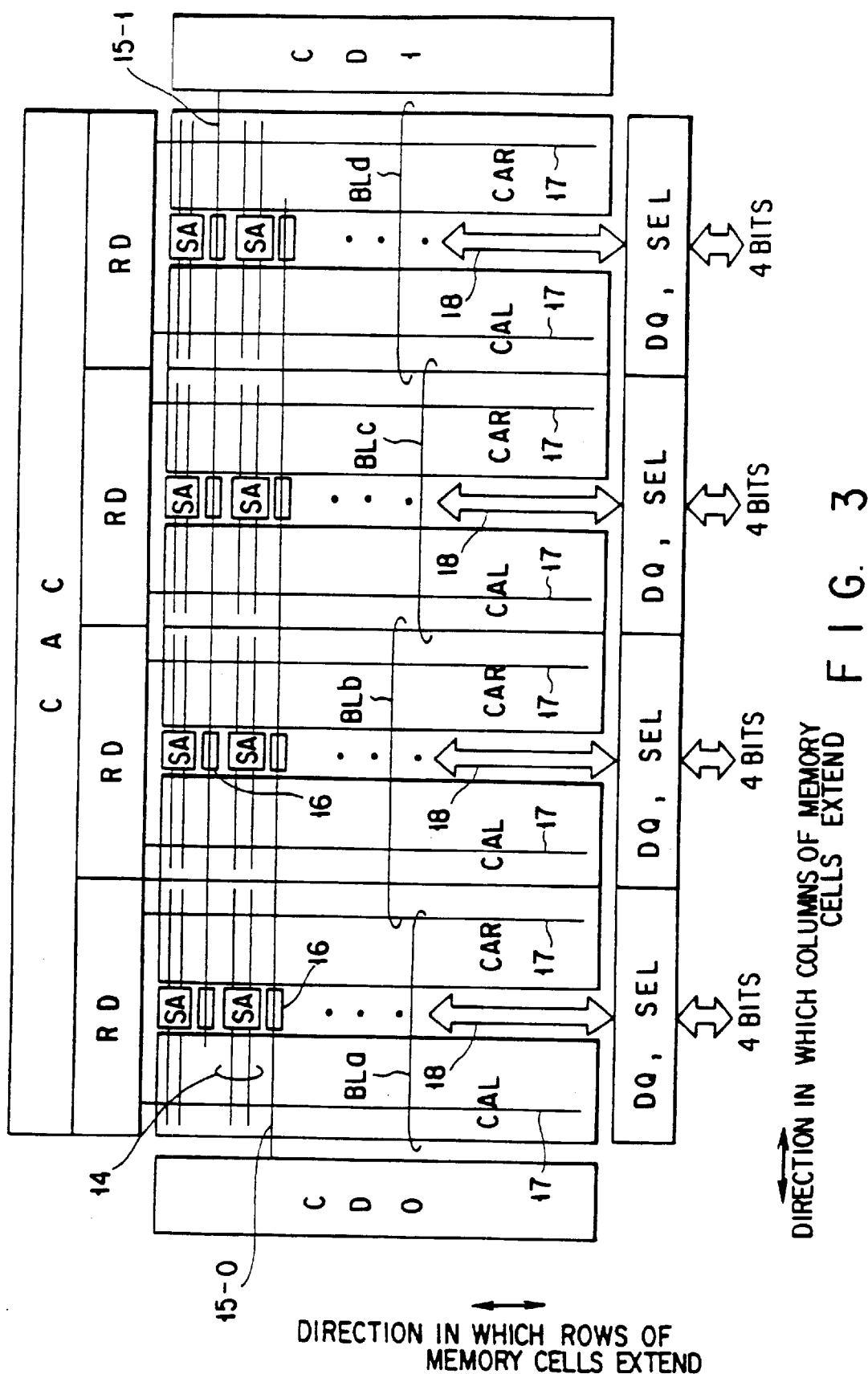
FIG. 3 is a diagram depicting the layout of one of the banks incorporated in the first comparative memory chip.

Before describing the embodiments, a few comparative semiconductor memories will be described. FIG. 2 illustrates the layout of a first comparative memory chip 10. FIG. 3 depicts the layout of one of the identical banks incorporated in the first comparative memory chip 10. The semiconductor memory is a 16-bit (×16) type which can store and output 16 bits at the same time.

As shown in FIG. 2, the memory chip 10 has four banks 11-0 to 11-3, a data input/output (I/O) region 12, and a data bus 13. The banks 11-0 to 11-3 are arranged in the same plane and side by side. They are identical in structure, each comprises four memory cell arrays CAL and four memory cell arrays CAR. Each bank further comprises circuits peripheral to the cell arrays CAL and CAR. The peripheral circuits are: a cell-array controller CAC, four row decoders RD, two column decoders CD0 and CD1, and four DQ buffers DQ. (The DQ buffers DQ are provided in the input/output section of the bank.)

In each bank, the memory cell arrays CAL and CAR constitute four memory-cell blocks BLa, BLb, BLc and BLd. Each memory-cell block consists of two sub-blocks CAL (i.e., a memory cell array CAL) and CAR (i.e., a memory cell array CAR). Hence, each bank has eight sub-blocks.

The four row decoders RD are provided for the four memory-cell blocks BLa, BLb, BLc and BLd, respectively. Each row decoder RD selects the sub-block CAL or CAR and further selects one of the memory-cells rows (or word lines 17) provided in the sub-block selected, in accordance with a row-address signal.

As indicated above, each bank has two column decoders CD0 and CD1. Each of the column decoders CD0 and CD1 selects at least one of the memory-cell columns provided in the memory-cell blocks BLa to BLd in accordance with a column-address signal.

When the column decoders CD0 and CD1 select, for example, column-selecting lines 15-0 and 15-1, the column-selecting switches 16 connected to the column-selecting lines 15-0 and 15-1 are turned on. In this case, the data on one or more data-line pairs 14 is supplied to the DQ buffers DQ through sense amplifiers SA and data-line pairs 18. (The data-line pairs 18 will hereinafter be referred to as "DQ-line pairs" to be distinguished from the data-line pairs 14.)

In any bank of the first comparative memory chip 10, each column decoder can select two columns of memory cells. Since the bank has two column decoders, the memory-cell blocks BLa, BLb, BLc and BLd Store and output four bits each. Namely, each bank stores and outputs a 16-bit (2-byte) data. Thus, 16-bit data is transferred between one of the four banks 11-0 to 11-3 and the data I/O region 12 through the data bus 13.

In each of the memory-cell blocks BLa to BLd, the sense amplifiers SA and the column-selecting switches 16 are located between the sub-block CAL and the sub-block CAR as is illustrated in FIG. 2. In each bank, the row decoders RD are located at one end of every sub-block, and the DQ buffers DQ at the other end thereof. Thus, one row decoder RD and one DQ buffer DQ oppose each other, with one sub-block of memory-cell arrays. The column decoder CD0 is located at one end of every column of memory cells, and the column decoder CD1 at the other end thereof. In other words, the data-line pairs 14 and the column-selecting lines 15-0 to 15-1 are connected at one end to the column decoder CD0 and at the other end to the column decoder CD1.

In each bank, the cell-array controller CAC is arranged adjacent to the row decoders RD. The cell-array controller CAC controls the data input/output operation of the bank. Four bank selectors SEL are provided, each for one DQ buffer DQ. Each bank selector SEL is located at the output of the associated DQ buffer DQ.

Data is supplied to the DQ-line pairs 18 from the data-line pairs 14 via the sense amplifiers SA and the column-selecting switches 16. As seen from FIGS. 2 and 3, each DQ-line pair 18 extends between the sub-blocks CAL and CAR which constitute one memory-cell block BLa, BLb, BLc or BLd. Hence, the data is transferred through the DQ-line pairs 18 in the direction parallel to the rows of memory cells which extend at right angles to the direction the memory-cell blocks BLa to BLd of each bank. The data is then output through the DQ buffers DQ, namely from the bank.

As shown in FIG. 2, the data bus 13 shared by the four banks 11-0 to 11-3 extends between the first and second banks 11-0 and 11-1 on the one hand, and the third and fourth banks 11-2 and 11-3 on the other. The bus 13 is designed to transfer data between each bank and the data I/O region 12. The data bus 13 is designed to enable the memory chip 10 to store and output 16 bits (2 bytes) simultaneously, because the memory chip 10 is a 16-bit type as mentioned earlier. Provided in the data I/O region 12 are 16 input/output (I/O) circuits (not shown). The I/O circuits input and output one bit each. They cooperate to input and output 16 bits at the same time.

How the first comparative semiconductor memory stores and output data will be explained below.

First, the bank selectors SEL select one of the four banks 11-0 to 11-3. In the bank selected, the memory cells are accessed in accordance with an address signal.

In the data-output (i.e., data-reading) mode, the bank selected outputs 16-bit data (i.e., 2-byte data) through the DQ-line pairs 18. The 16-bit data is supplied via the data bus 13 to the data I/O region 12. The data is output from the region 12, namely from the semiconductor memory chip 10.

In the data-input (i.e., data-writing) mode, 16-bit data (i.e., 2-byte data) is supplied from an external device to the data I/O region 12. The data is further supplied via the data bus 13 to the bank selected. In the bank selected, the 16-bit data is stored into the memory cells of the array incorporated in the bank, through the DQ-line pairs 18 and the sense amplifiers SA.

The first comparative semiconductor memory chip 10 is disadvantageous in the following respects.

First, the area occupied by the data bus 13 extending through the center part the memory chip 10, in parallel to the columns of memory cells (hence, parallel to the data-line pairs and the column-selecting lines) increases in proportion to the thickness of the bus 13. The more bits are stored and output simultaneously, the thicker the data bus 13. The thicker the bus 13, the larger the area will the bus 13 occupy. Since the first comparative memory chip 10 is a 16-bit (×16) type, the data bus 13 is composed as many as 16 wires to transfer 16-bit data. If the chip is a 32-bit (×32) type, the data bus 13 needs to be composed of 32 wires to transfer 32-bit data.

Second, the area occupied by the DQ-line pairs 18 provided in each memory-cell block BLa, BLb, BLc or BLd, extending between the sub-blocks CAL and CAR of memory cells, increases in proportion the number of bits to be output from the memory-cell block. If the memory-cell block is to output 4-bit data, four DQ-line pairs 18 are provided between the sub-blocks CAL and CAR. If the memory-cell block is to output 8-bit data, eight DQ-line pairs 18 are provided between the sub-blocks CAL and CAR.

Third, the elements and.wires of the row decoders RD and cell-array controller CAC, provided in each bank, are arranged in a complicated pattern, for the following reason. In each bank, the row decoders RD are located at one end of every sub-blocks, and the DQ buffers DQ at the other end thereof; the column decoders CD0 and CD1 are located at the ends of the columns of memory cells, respectively; and the cell-array controller CAC is arranged adjacent to the row decoders RD, extending over the four memory-cell blocks BLa to BLd. Since the row decoders RD and the controller CAC are located at one end of every row of memory cells, their constituent elements and wires are arranged in a complicated pattern.

Figure 4:
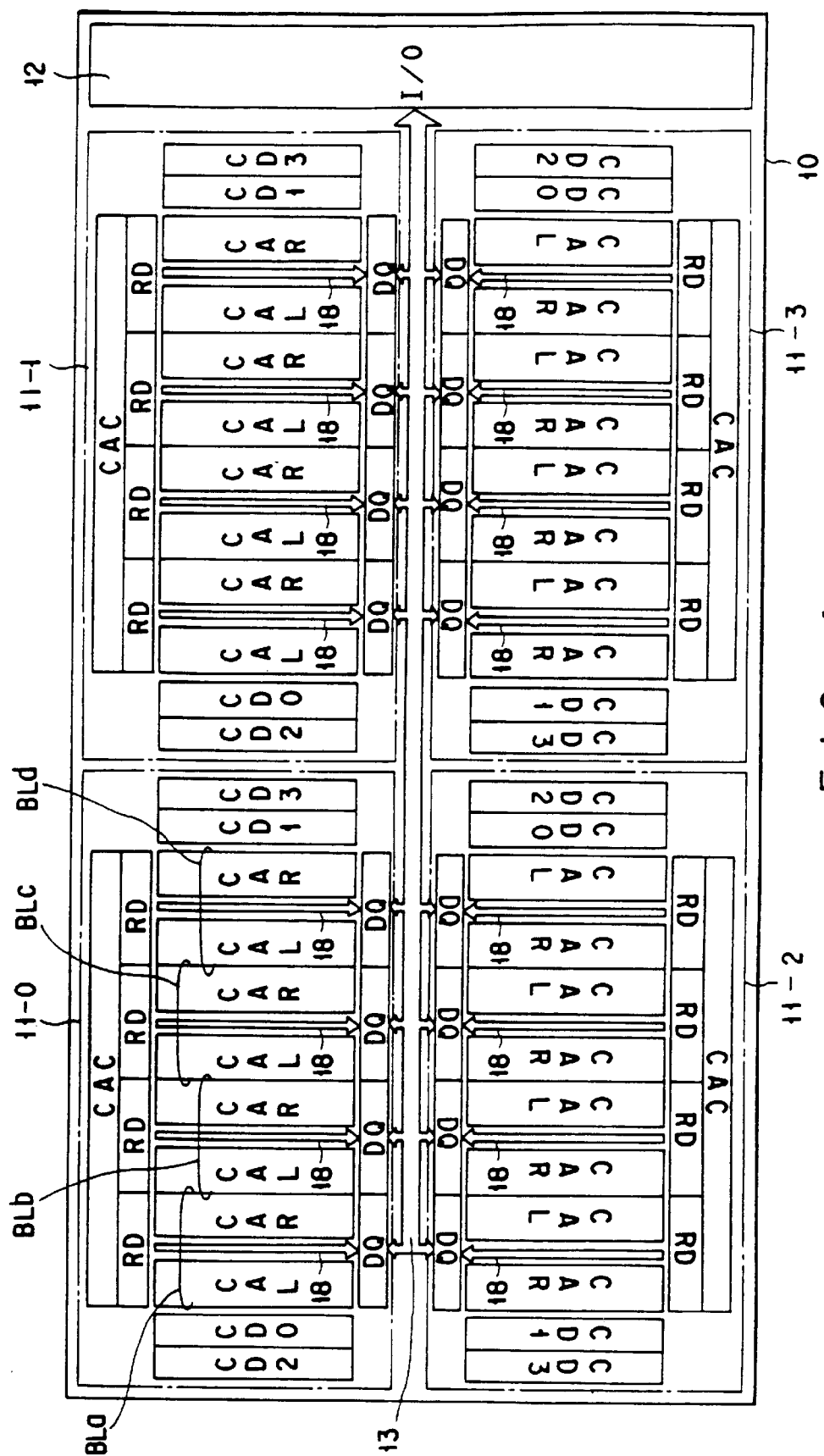
FIG. 4 is a diagram showing the layout of a second comparative semiconductor memory chip.
Figure 5:
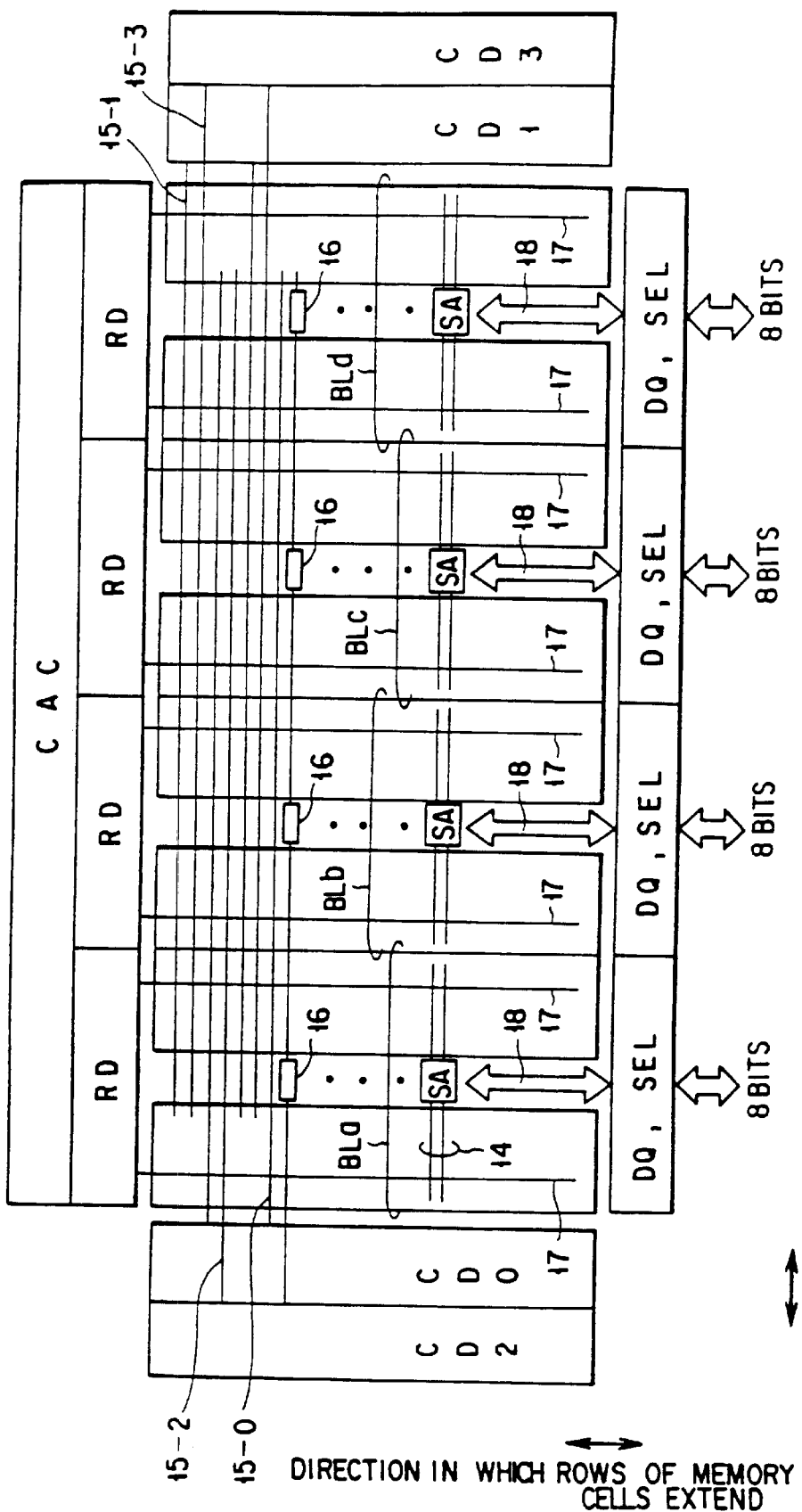
FIG. 5 is a diagram showing the layout of one of the identical banks incorporated in the second comparative memory chip.

A second comparative semiconductor memory chip 10 will be described, with reference to FIGS. 4 and 5. FIG. 4 shows the layout of the second comparative memory chip 10, and FIG. 5 illustrates the layout of one of the identical banks incorporated in this comparative memory chip 10.

The second comparative memory chip 10 is a 32-bit (×32) type which can store and output 32 bits at the same time.

As shown in FIG. 4, the memory chip 10 has four banks 11-0 to 11-3, a data input/output (I/O) region 12, and a data bus 13. The banks 11-0 to 11-3 are arranged in the same plane and side by side. They are identical in structure, each comprises four memory cell arrays CAL and four memory cell arrays CAR. Each bank further comprises circuits peripheral to the cell arrays CAL and CAR. The peripheral circuits are: a cell-array controller CAC, four row decoders RD, four column decoders CD0 to CD3, and four DQ buffers DQ. (The DQ buffers DQ are provided in the input/output section of the bank.)

In each bank, the memory cell arrays CAL and CAR constitute four memory-cell blocks BLa, BLb, BLc and BLd. Each memory-cell block consists of two sub-blocks CAL (i.e., a memory cell array CAL) and CAR (i.e., a memory cell array CAR). Hence, each bank has eight sub-blocks.

The four row decoders RD are provided for the four memory-cell blocks BLa, BLb, BLc and BLd, respectively. Each row decoder RD selects the sub-block CAL or CAR and further selects one of the memory-cells rows (or word lines 17) provided in the sub-block selected, in accordance with a row-address signal.

As indicated above, each bank has four column decoders CD0 to CD3. Each of the column decoders CD0 to CD3 selects at least one of the memory-cell columns provided in the memory-cell blocks BLa to BLd in accordance with a column-address signal.

When the column decoders CD0 and CD1 select, for example, column-selecting lines 15-0 to 15-3, the column-selecting switches 16 connected to the column-selecting lines 15-0 to 15-3 are turned on. In this case, the data on one or more data-line pairs 14 is supplied to the DQ buffers DQ through sense amplifiers SA and data-line pairs 18 (i.e., DQ-line pairs).

In any bank of the second comparative memory chip 10, each column decoder can select two columns of memory cells. Since the bank has four column decoders, the memory-cell blocks BLa, BLb, BLc and BLd store and output eight bits each. Namely, each bank stores and outputs a 32-bit (4-byte) data. Thus, 32-bit data is transferred between one of the four banks 11-0 to 11-3 and the data I/O region 12 through the data bus 13.

In each of the memory-cell blocks BLa to BLd, the sense amplifiers SA and the column-selecting switches 16 are located between the sub-block CAL and the sub-block CAR as is illustrated in FIG. 5. In each bank, the row decoders RD are located at one end of the sub-blocks CAL and CAR, and the DQ buffers DQ at the other end thereof. Thus, one row decoder RD and one DQ buffer DQ oppose each other, with one sub-block of memory-cell arrays. The column decoders CD0 and CD2 are located at one end of every column of memory cells, and the column decoders CD1 and CD3 at the other end thereof.

In each bank, the cell-array controller CAC is arranged adjacent to the row decoders RD. The controller CAC controls the data input/output operation of the bank. Four bank selectors SEL are provided, each for one DQ buffer DQ. Each bank selector SEL is located at the output of the associated DQ buffer DQ.

Data is supplied to the DQ-line pairs 18 from the data-line pairs 14 via the sense amplifiers SA and the column-selecting switches 16. As shown in FIGS. 4 and 5, each DQ-line pair 18 extends between the sub-blocks CAL and CAR which constitute one block BLa, BLb, BLc or BLd. The data is therefore transferred through the DQ-line pairs 18 in the direction parallel to the rows of memory cells which extend at right angles to the direction the memory-cell blocks BLa to BLd of each bank. The data is then output through the DQ buffers DQ, namely from the bank.

As seen from FIG. 4, the data bus 13 shaped by the four banks 11-0 to 11-3 extends between the first and second banks 11-0 and 11-1 on the one hand, and the third and fourth banks 11-2 and 11-3 on the other. The bus 13 is designed to transfer data between each bank and the data I/O region 12. The data bus 13 is designed to enable the memory chip 10 to store and output 32 bits (4 bytes) simultaneously, because the memory chip 10 is a 32-bit type as mentioned earlier.

Provided in the data I/O region 12 are 32 input/output (I/O) circuits (not shown). The I/O circuits input and output one bit each. They cooperate to input and output 32 bits at the same time.

How the second comparative semiconductor memory stores and output data will be explained below.

At first, the bank selectors SEL select one of the four banks 11-0 to 11-3. In the bank selected, the memory cells are accessed in accordance with an address signal.

In the data-output (i.e., data-reading) mode, the bank selected outputs 32-bit data (i.e., 4-byte data) through the DQ-line pairs 18. The $2^n$-bit data is supplied via the data bus 13 to the data I/O region 12. The data is output from the region 12, namely from the semiconductor memory chip 10.

In the data-input (i.e., data-writing) mode, 32-bit data (i.e., 4-byte data) is supplied from an external device to the data I/O region 12. The data is further supplied via the data bus 13 to the bank selected. In the bank selected, the 32-bit data is stored into the memory cells of the array incorporated in the bank, through the DQ-line pairs 18 and the sense amplifiers SA.

The second comparative memory chip 10 is disadvantageous in the same respects as the first comparative memory chip shown in FIGS. 2 and 3. First, the area the data bus 13 occupies increases as the number of wires constituting the bus 13 increases in proportion to the number of bits which the chip 10 can store and output simultaneously. Second, the area the DQ-line pairs 18 occupy increases as the number of DQ-line pairs 18 increases in proportion to the number of bits which the chip 10 can store and output simultaneously. Third, the elements and wires constituting the row decoders RD and cell-array controller CAC are arranged in a complicated pattern, inevitably because the decoders RD and the controller CAC are located at one end of every row of memory cells.

The second comparative memory chip 10 is further disadvantageous in that the elements and wires constituting the column decoders DC0 to DC3 are arranged in a complicated pattern, inevitably because two column decoders are provided at either end of the columns of memory cells.

Figure 1:
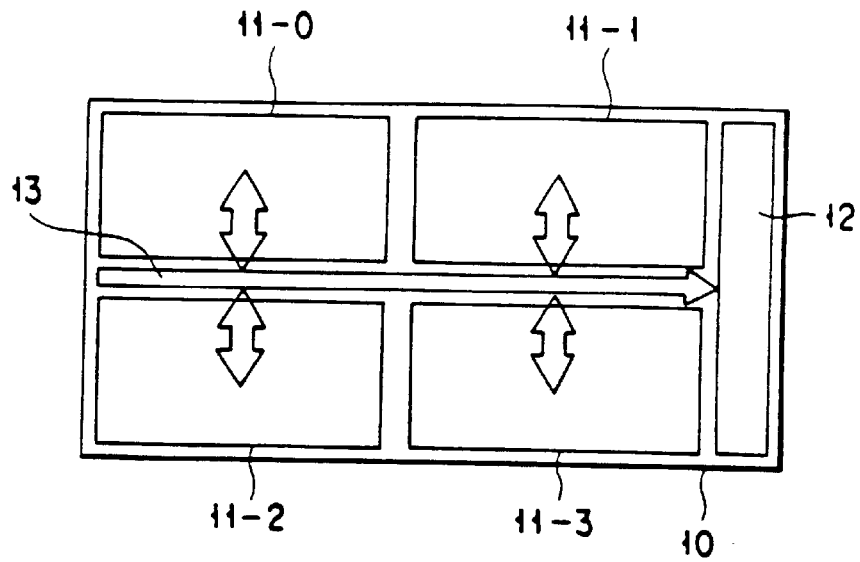
FIG. 1 is a diagram showing the layout of a conventional semiconductor memory.
Figure 6:
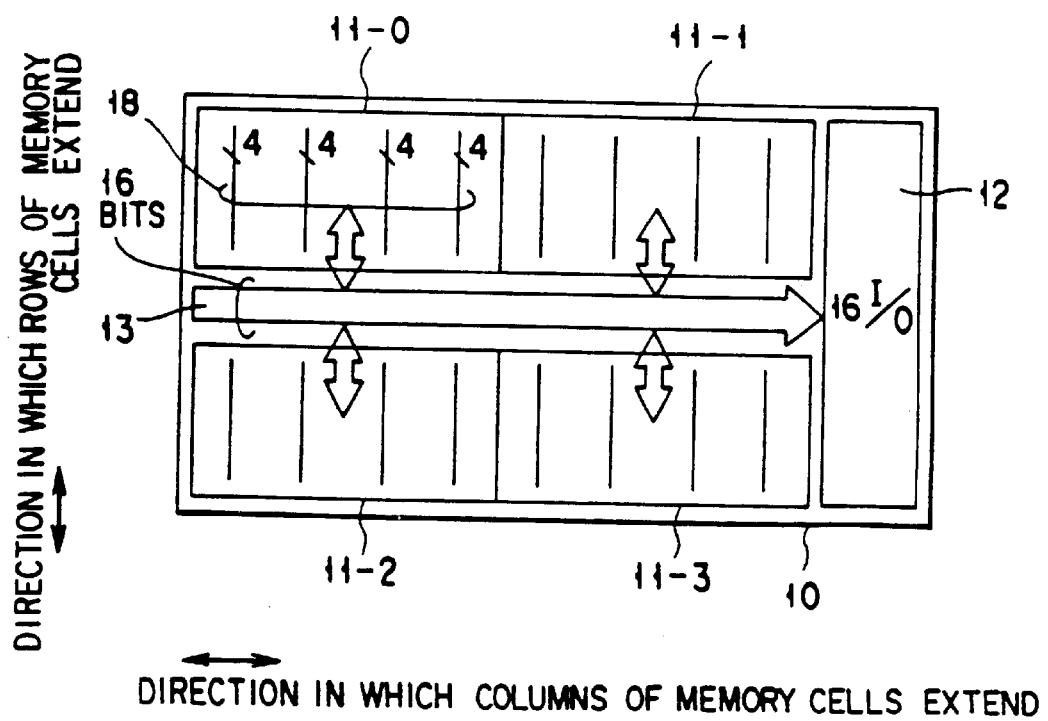
FIG. 6 is a schematic diagram of the first comparative memory chip shown in FIG. 2.

FIG. 6 is a schematic diagram representing the positional relationship which the data bus 13 and the banks 11-0 to 11-3 have in the first comparative memory chip shown in FIG. 2.

As can be seen from in FIG. 6, the banks 11-0 to 11-3 and the data I/O region 12 occupies the upper surface region of the first comparative memory chip 10. The data I/O region 12 is located close to one of those sides of the memory chip 10 which extend in parallel to the rows of memory cells.

Each bank has memory cell arrays which constitute four memory-cell blocks BLa, BLb, BLc and BLd. The blocks extend parallel to the columns of memory cells. Each memory-cell block consists of two sub-blocks. Hence, each bank has eight sub-blocks, which extend also in parallel to the columns of memory cells.

Each sub-block has word lines, data lines and column-selecting lines. The word lines extend along the rows of memory cells. The data lines and the column-selecting lines extend along the columns of memory cells (that is, in the direction in which the sub-blocks are arranged at intervals. Four DQ-line pairs 18 extend along the rows of memory cells, between two sub-blocks, to transfer four bits of data.

The data bus 13 extends between the first and second banks 11-0 and 11-1 on the one hand, and the third and fourth banks 11-2 and 11-3 on the other. The bus 13 is designed to transfer 16-bit (b-byte) data.

Figure 7:
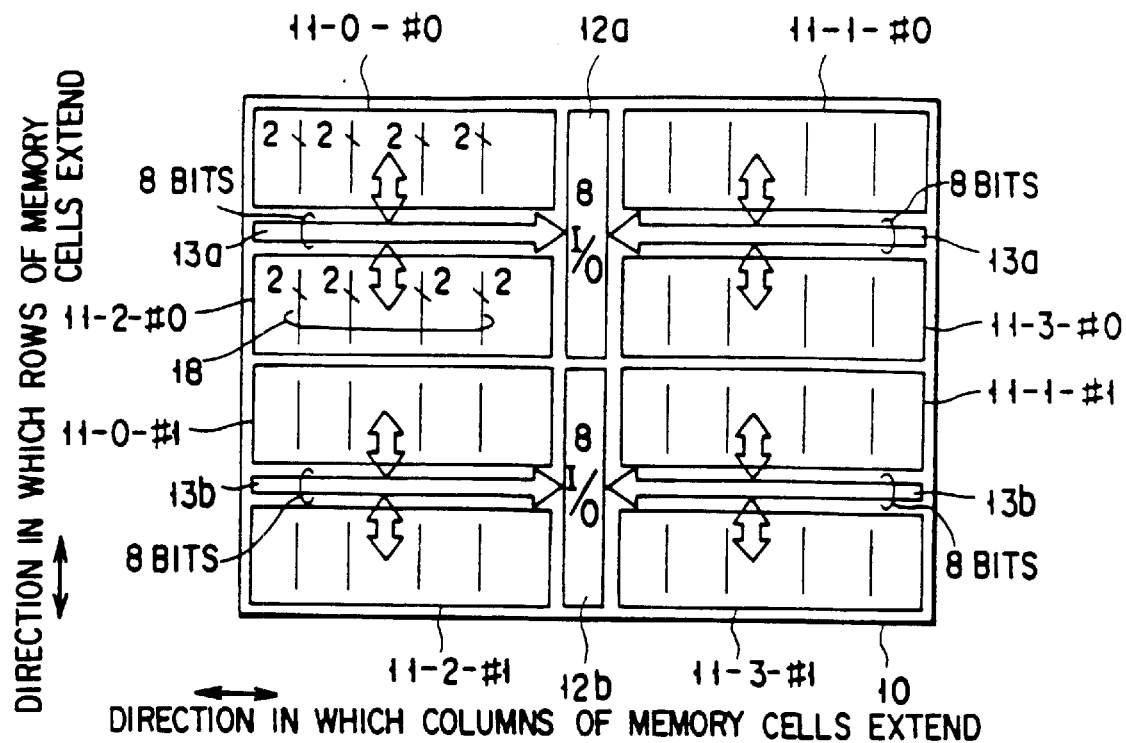
FIG. 7 is a diagram illustrating the layout of a modification of the first comparative memory chip illustrated in FIG. 2.
Figure 8:
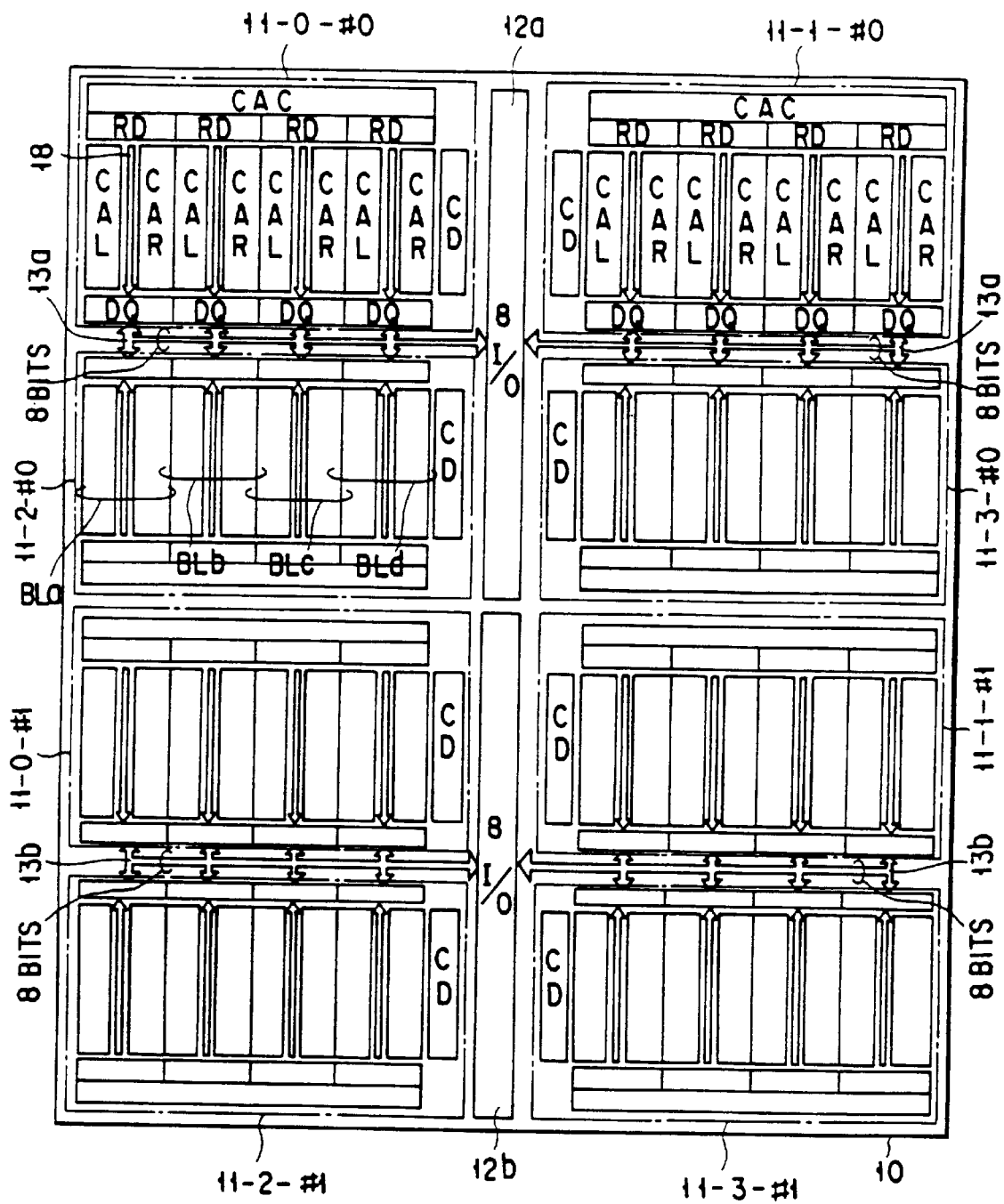
FIG. 8 is a diagram showing, in detail,.the layout of the modified comparative memory chip illustrated in FIG. 7.

FIG. 7 illustrates the layout of a modification of the first comparative memory chip 10. FIG. 8 shows, in detail, the layout of the modified comparative memory chip 10. The modified comparative memory chip 10 is different from the first comparative memory chip (FIGS. 2 and 3) in the following respects.

First, each bank (or main bank) consists of two sub-banks. More precisely, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1 are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-2-#0 and 11-3-#0 form a first group, in which eight bits are simultaneously stored and from which eight bits are simultaneously output. Similarly, the sub-banks 11-0-#1, 11-1-#1, 11-2-#1 and 11-3-#1 form a second group, in which eight bits are simultaneously stored and from which eight bits are simultaneously output.

Second, each bank is designed to store and outputs eight bits (1 byte) at the same time. Each sub-bank has only one column decoder CD, not two as in the first comparative memory chip shown in FIGS. 2 and 3. One column decoder CD is sufficient since the sub-bank stores and output eight bits. The column decoder CD is designed to select two columns of memory cells, as in the first comparative memory chip, whereby the memory-cell blocks BLa to BLd store and output two bits each. Each sub-bank comprises memory cell arrays CAL and CAR, row decoders RD, DQ-line pairs 18 and DQ buffers DQ, which are laid out almost in the same fashion as in the first comparative memory chip shown in FIGS. 2 and 3.

Third, two data input/output (I/O) circuits 12a and 12b are provided in the center part of the memory chip 10, extending in axial alignment along the rows of memory cells. Two data buses 13a are provided for the first group of the sub-banks 11-0-#0, 11-1-#0, 11-2-#0 and 11-2-#0. The data buses 13a extend along the columns of memory cells and are located on two sides of the data I/O circuit 12a, respectively. Two other buses 13b are provided for the second group of the sub-banks 11-0-#1, 11-1-#1, 11-2-#1 and 11-2-#1. These data buses 13b extend along the columns of memory cells and are on the two sides of located data I/O circuit 12b, respectively. Each of the data buses 13a and 13b is located between two associated sub-banks, extending along the columns of memory cells. The data buses 13a are connected to the data I/O circuit 12a, and the data buses 13b to the data I/O circuit 12b. The data buses 13a and 13b are designed to transfer 8-bit data each.

In the modified comparative memory chip shown in FIGS. 7 and 8, when the sub-banks 11-0-#0 and 11-0-#1, for example, are selected, 8-bit data is transferred between the sub-bank 11-0-#0 and the data I/O circuit 12a through the data bus 13a, and 8-bit data is transferred between the sub-bank 11-0-#1 and the data I/O circuit 12b through the data bus 13b.

Figure 9:
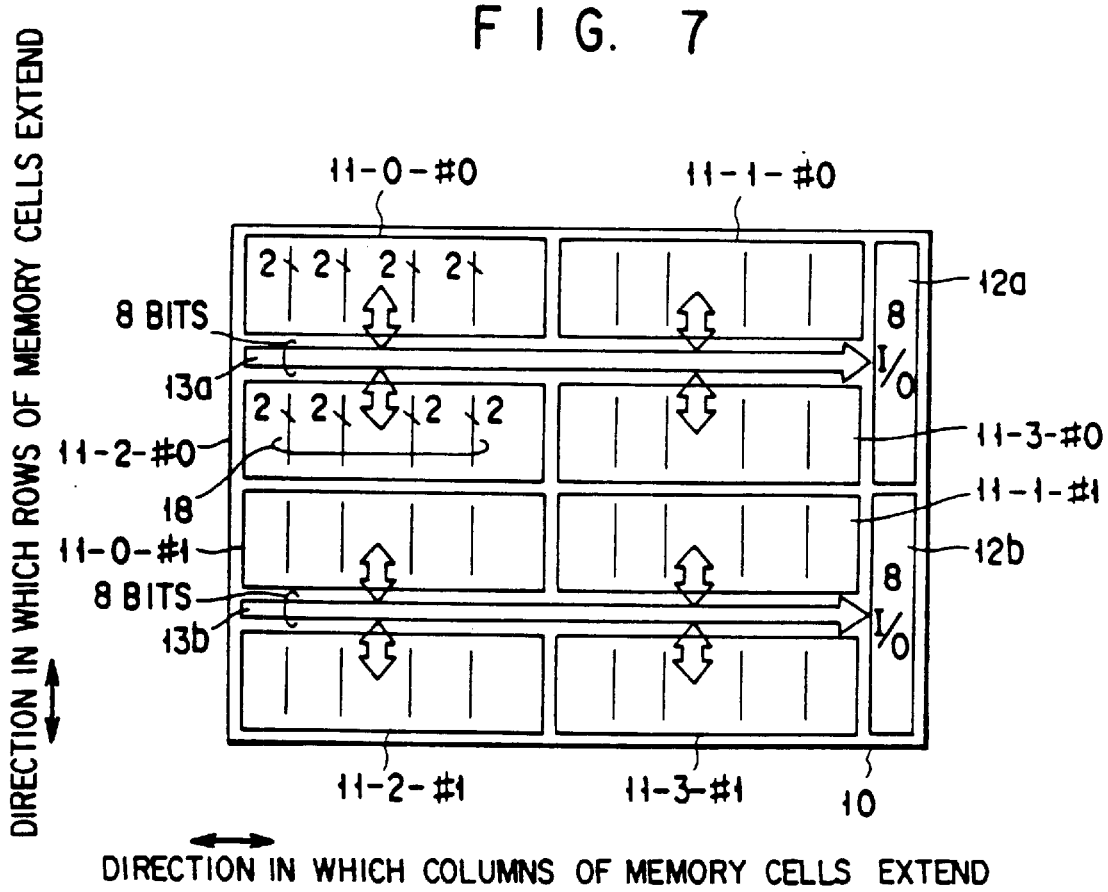
FIG. 9 is a diagram showing the layout of another modification of the first comparative memory chip illustrated in FIG. 2.
Figure 10:
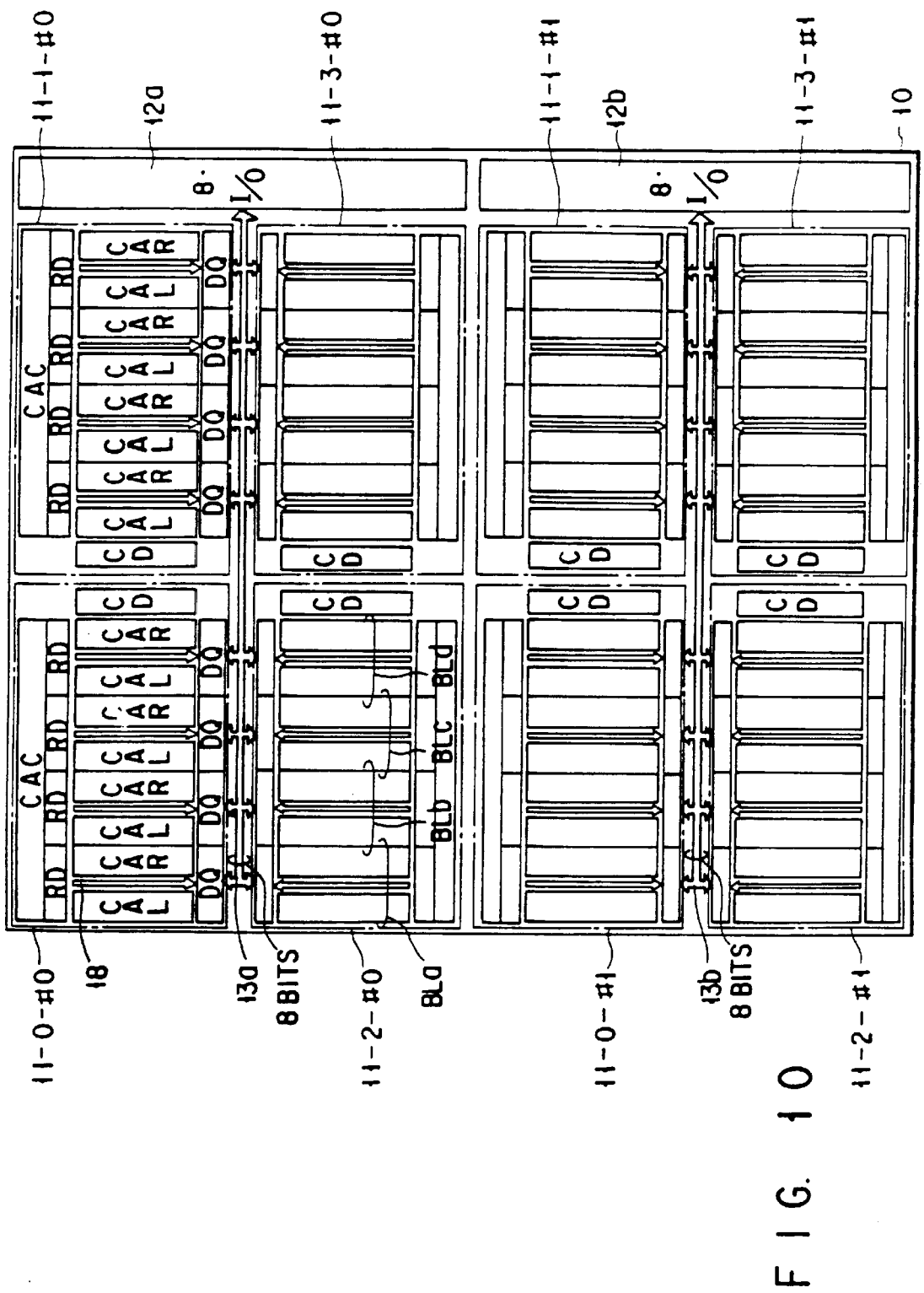
FIG. 10 is a diagram depicting, in detail, the layout of the modified comparative memory chip shown in FIG. 9.

FIG. 9 shows another modification of the first comparative memory chip illustrated in FIG. 2. FIG. 10 illustrates, in detail, the layout of the modified comparative memory chip shown in FIG. 9. This modified comparative memory chip 10 is different from the first comparative memory chip (FIGS. 2 and 3) in the following respects.

First, each bank (or main bank) consists of two sub-banks. To be more specific, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1 are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-2-#0 and 11-3-#0 form a first group, in which eight bits are simultaneously stored and from which eight bits are simultaneously output. Similarly, the sub-banks 11-0-#1, 11-1-#1, 11-2-#1 and 11-3-#1 form a second group, in which eight bits are simultaneously stored and from which eight bits are simultaneously output.

Second, each bank is designed to store and outputs eight bits (1 byte) at the same time. Each sub-bank has only one column decoder CD, not two as in the first comparative memory chip shown in FIGS. 2 and 3. One column decoder CD is sufficient since the sub-bank stores and output eight bits. The column decoder CD is designed to select two columns of memory cells, as in the first comparative memory chip, whereby the memory-cell blocks BLa to BLd store and output two bits each. Each sub-bank comprises memory cell arrays CAL and CAR, row decoders RD, DQ-line pairs 18 and QD buffers QD, which are laid out almost in the same fashion as in the first comparative memory chip shown in FIGS. 2 and 3.

Third, two data buses 13a are provided for the first group of the sub-banks 11-0-#0, 11-1-#0, 11-2-#0 and 11-2-#0 and extend along the columns of memory cells, and two other buses 13b are provided for the second group of the sub-banks 11-0-#1, 11-1-#1, 11-2-#1 and 11-2-#1 and extend along the columns of memory cells. Each of the data buses 13a is located between two associated sub-banks, extends along the columns of memory cells from the data I/O circuit 12a located at one end of every memory-cell column. Similarly, each of the data buses 13b is located between two associated sub-banks, extends along the columns of memory cells from the data I/O circuit 12b located at one end of the every memory-cell column.

In the modified comparative memory chip shown in FIGS. 9 and 10, when the sub-banks 11-0-#0 and 11-0-#1, for example, are selected, 8-bit data is transferred via the data bus 13a between the sub-bank 11-0-#0 and the data I/O circuit 12a, and 8-bit data is transferred via the data bus 13b between the sub-bank 11-0-#1 and the data I/O circuit 12b.

Figure 11:
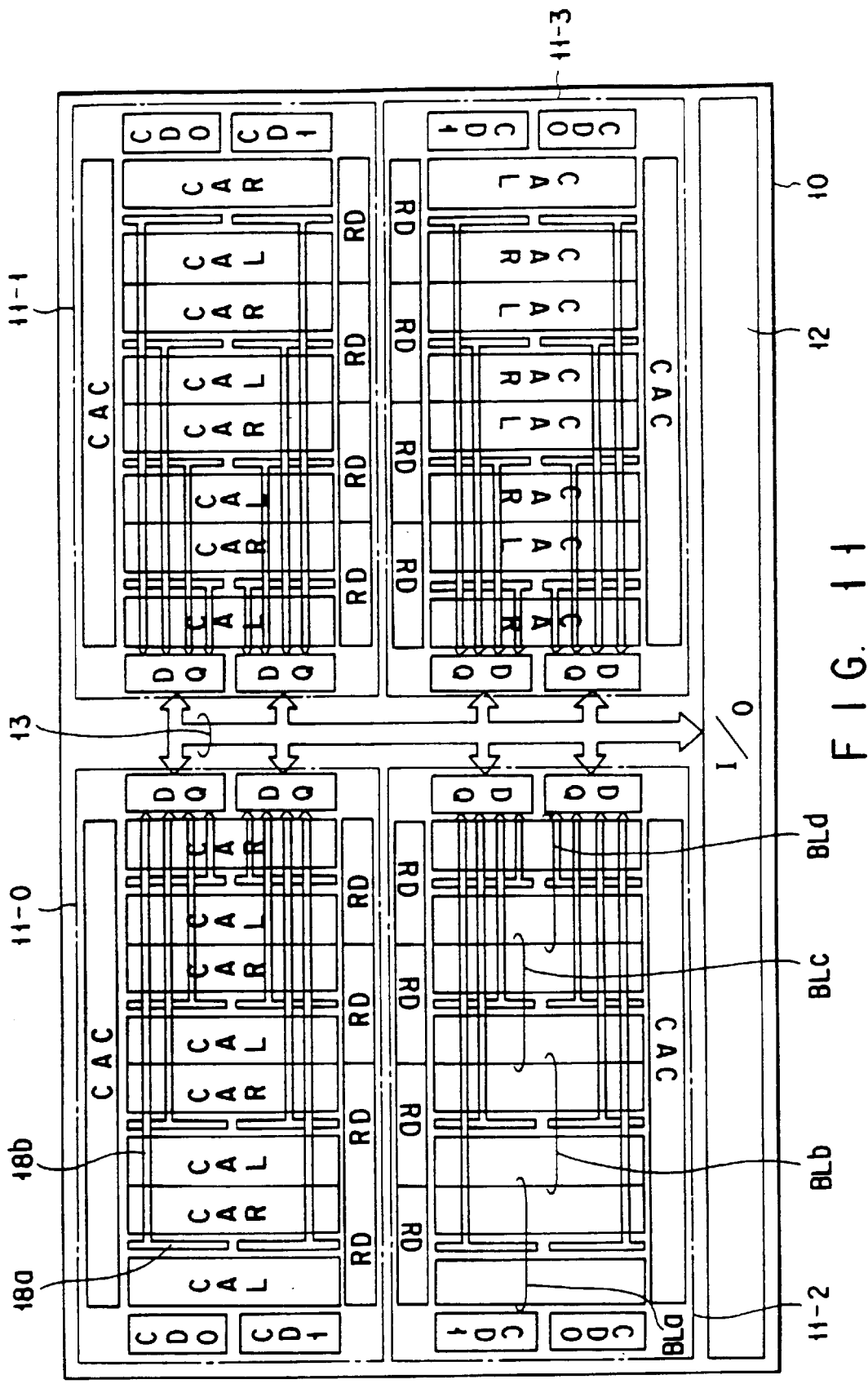
FIG. 11 is a diagram showing the layout of a semiconductor memory chip according to a first embodiment of the present invention.
Figure 12:
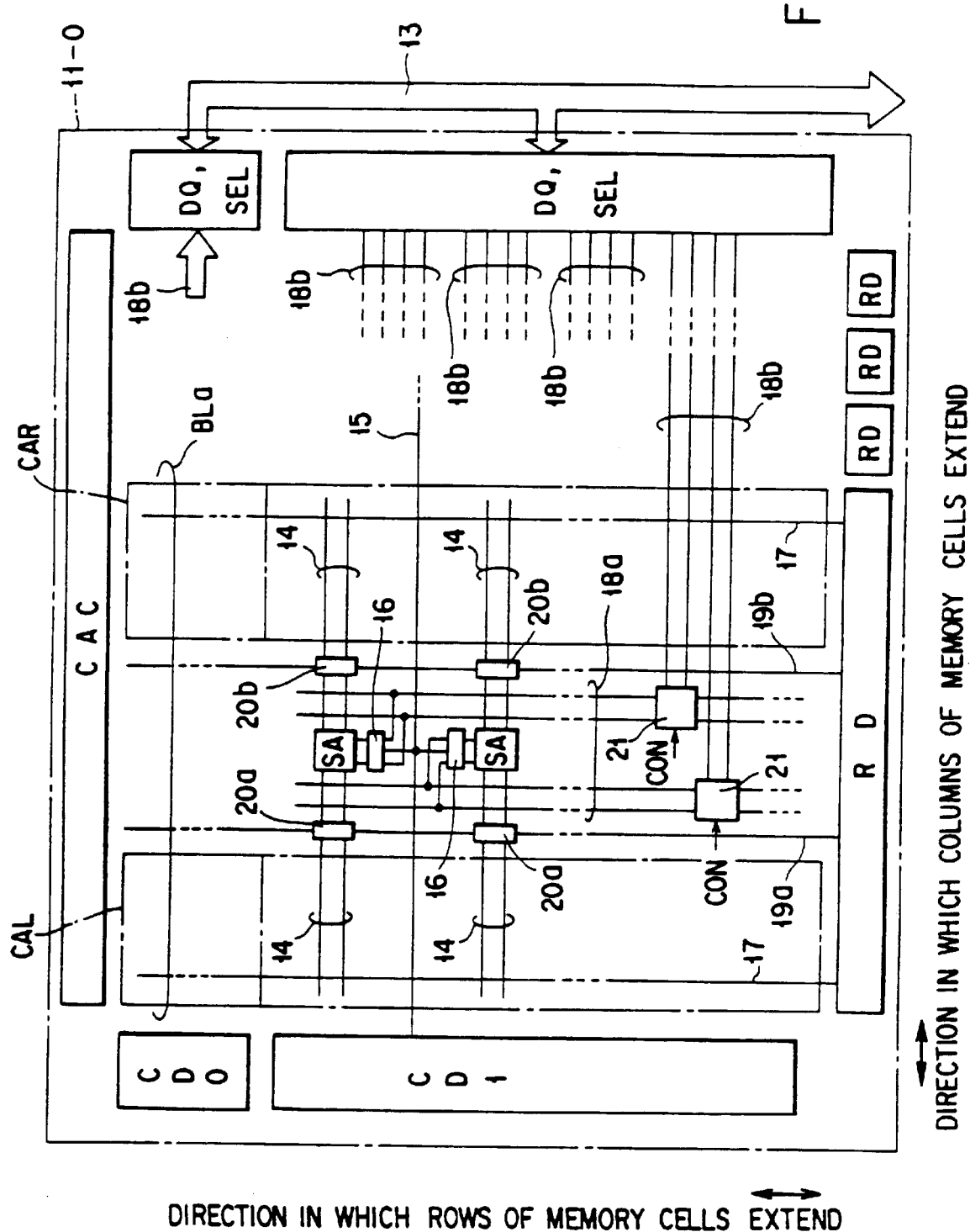
FIG. 12 is a diagram showing, in detail, the layout of one of the identical banks incorporated in the memory chip of FIG. 11.

A semiconductor memory chip 10 according to the first embodiment of the present invention will be described, with reference to FIGS. 11 and 12. FIG. 11 shows the layout of the first embodiment, and FIG. 12 shows the layout of one of the identical banks incorporated in the first embodiment.

The first embodiment is a 16-bit (×16) type semiconductor memory which can store and output 16 bits at the same time.

As shown in FIG. 11, the memory chip 10 has four banks 11-0 to 11-3, a data input/output (I/O) region 12, and a data bus 13. The banks 11-0 to 11-3 are arranged in the same plane and side by side. They are identical in structure, each comprises four memory cell arrays CAL and four memory cell arrays CAR. Each bank further comprises circuits peripheral to the cell arrays CAL and CAR. The peripheral circuits are: a cell-array controller CAC, four row decoders RD, two column decoders CD0 and CD1, and two DQ buffers DQ. (The DQ buffers DQ are provided in the input/output section of the bank.)

In each bank, the memory cell arrays CAL and CAR constitute four memory-cell blocks BLa, BLb, BLc and BLd. Each memory-cell block consists of two sub-blocks CAL (i.e., a memory cell array CAL) and CAR (i.e., a memory cell array CAR). Hence, each bank has eight sub-blocks.

As shown in FIG. 12, the four row decoders RD are provided for the four memory-cell blocks BLa, BLb, BLc and BLd, respectively. Each row decoder RD selects the sub-block CAL or CAR and further selects one of the memory-cells rows (or word lines 17) provided in the sub-block selected, in accordance with a row-address signal.

Each sub-block can be selected by applying a high voltage on one of two word lines 19a and 19b. When a high voltage is applied on the word line 19a, switches 20a are turned on, whereby the sub-block CAL is selected. At this time, a low voltage is applied on the word line 19b, and switches 20b are off. The sub-block CAR is therefore not selected.

As indicated above, each bank has two column decoders CD0 and CD1. Each of the column decoders CD0 and CD1 selects at least one of the memory-cell columns provided in the blocks BLa to BLd in accordance with a column-address signal.

When the column decoder CD1 selects, for example, a column-selecting line 15, the two column-selecting switches 16 connected to the column-selecting line 15 are turned on. In this case, the 2-bit data on two data-line pairs 14 connected to the column-selecting switches 16 is supplied to data-line pairs 18a through sense amplifiers SA and the column-selecting switches 16. (The data-line pairs 18a will hereinafter be referred to as "local DQ-line pairs" so as to be distinguished from the data-line pairs 14.)

In any bank of the first embodiment, each column decoder can select two columns of memory cells. Since the bank has two column decoders, the memory-cell blocks BLa, BLb, BLc and BLd store and output four bits each. Namely, each bank stores and outputs 16-bit (2-byte) data.

In each of the memory-cell blocks BLa to BLd, the sense amplifiers SA and the column-selecting switches 16 are located between the sub-block CAL and the sub-block CAR as is illustrated in FIG. 12. In each bank, the row decoders RD oppose the cell-array controller CAC, with the memory cell arrays CAl and CAR located between the row decoders RD on the one hand and the cell-array controller CAC on the other. Namely, the row decoders RD are located at one end of every block which extends along the columns of memory cells (at right angle to the word lines 17, 19*a* and 19*b*), whereas the cell-array controller CAC is located at the other end of the memory-cell blocks BLa to BLd.

The cell-array controller CAC controls the data input/output operation of the bank.

The column decoders CD0 and CD1 are located at one end of every column of memory cells, along which the blocks BLa to BLd are arranged at intervals and in parallel to which the data-line pairs and column-selecting lines extend. The column decoders CD0 and CD1 are spaced apart along the rows of memory cells. The column decoder CD0 is provided for half of the memory cells provided in the bank, and the column decoder CD1 for the remaining half of the memory cells.

The DQ buffers DQ at the other end of the columns of memory cells, along which the memory-cell blocks BLa to BLd are arranged at intervals and in parallel to which the data-line pairs and column-selecting lines extend. Thus, the DQ buffers DQ oppose the column decoder CD0 and CD1, and the memory cell arrays CAL and CAR are arranged between the DQ buffers DQ on the one hand and the column decoders CD0 and CD1 on the other.

Two bank selectors SEL are provided, each for one DQ buffer DQ. Each bank selector SEL is located at the output of the associated DQ buffer DQ, in order to select the bank.

Data is supplied to the local DQ-line pairs 18*a* from the data-line pairs 14 via the sense amplifiers SA and the column-selecting switches 16. As shown in FIG. 12, each DQ-line pair 18 extends between the sub-blocks CAL and CAR which constitute one memory-cell block BLa, BLb, BLc or BLd. The local DQ-line pairs 18*a* extend parallel to the rows of memory cells (that is, along the word lines).

As shown in FIG. 12, data-line pairs 18*b* are provided, extending over the sub-blocks CAL and CAR in parallel to the columns of memory cells. (Hereinafter referred to as "global DQ-line pairs" so as to be distinguished from the data-line pairs 14). The global DQ-line pairs 18*b* are connected at one end to the local DQ-line pairs 18*a* by switches 21, and at the other end to the DQ buffers DQ. The switches 21 are turned on and off in accordance with a control signal CON.

As illustrated in FIG. 11, the data bus 13 extends along the rows of memory cells, between the banks 11-0 and 11-1 on the one hand, and the banks 11-2 and 11-3 on the other. The data bus 13 is provided to transfer data from the data I/O region 12 to the banks 11-0 to 11-3, and vice versa. The bus 13 is designed to enable the memory chip 10 to store and output 16 bits (2 bytes) simultaneously, because the memory chip 10 is a 16-bit type as mentioned earlier.

The data I/O region 12 is arranged at one end of every row of memory cells. Provided in the region 12 are 16 input/output (I/O) circuits (not shown). The I/O circuits cooperate to write 16-bit data into the memory cell arrays and output 16-bit data therefrom.

How the memory chip 10 according to the first embodiment stores and outputs 16-bit data will be explained.

First, the bank selectors SEL select one of the four banks 11-0 to 11-3 is selected. In the bank selected, the memory cell array is accessed on the basis of an address signal.

In the data-output (i.e., data-reading) mode, the bank selected outputs 16-bit data (i.e., 2-byte data) through the local DQ-line pairs 18*a* and global DQ-line pairs 18*b*. The 16-bit data is thereby output from the bank selected. It is then supplied via the data bus 13 to the data I/O region 12. The data is output from the region 12, namely from the semiconductor memory chip 10.

In the data-input (i.e., data-writing) mode, 16-bit data (i.e., 2-byte data) is supplied from an external device to the data I/O region 12. The data is further supplied via the data bus 13 to the bank selected. In the bank selected, the 16-bit data is stored into the memory cells of the array through the global DQ-line pairs 18*b*, the local DQ-line pairs 18*a* and the sense amplifiers SA.

The comparative semiconductor memory chip 10 according to the first embodiment is advantageous in the respects.

First, the cell-array controller CAC, row decoders RD, column decoders CD0 and CD1 and DQ buffers DQ are arranged near one side of the memory cell arrays CAL and CAR. This is because the controller CAC and the row decoders RD are located at one end of every row of memory cell, and also because the column decoders CD0 are located at one end of every memory-cell column and oppose the CD1 and DQ buffers DQ which are located at the other end of every memory-cell column. Hence, the elements and wires constituting the controller CAC, row decoders RD, column decoders CD0 and CD1 and DQ buffers DQ can be arranged in a simple pattern.

Second, the constituent elements and wires of the DQ buffers DQ can be arranged in a simple pattern, because the DQ buffers DQ are located at one end of every memory-cell column. The DQ buffers DQ can be so located since the local DQ-line pairs 18*a* extend along the memory-cell rows, while the global DQ-line pairs 18*b* extend along the memory-cell columns, making it possible to input and output data at that side of the bank where one end of each memory-cell column is positioned.

Further, it suffices to use local DQ-line pairs at each column decoder DC0 to transfer two bits and local DQ-line pairs at each column decoder DC1 to transfer two bits, even each memory-cell block is designed to store and output four bits simultaneously. This is because the column decoders CD0 and CD1 are located close to each other and spaced apart in the direction in which the memory-cell rows extend, so that one bit is input to and output from the memory-cell block at one end of each memory-cell column. Since a relatively small number of local DQ-line pairs are required to transfer data in each memory-cell block, an area required to accommodate the DQ-line pairs can be small. More precisely, the area is half the area required in the first comparative memory chip shown in FIGS. 2 and 3.

Each bank needs to have as many global DQ-line pairs as is required to transfer 16-bit data if 4-bit data is input to and output from each memory-cell block. Nevertheless, a region need not be provided to accommodate the global DQ-line pairs since the global DQ-line pairs 18*b* are provided on the memory cell arrays CAL and CAR.

Third, the number of wires constituting the data bus 13 can be reduced to minimize the area the bus 13 occupies on the memory chip 10, merely by positioning the banks and the data I/O circuits appropriately. The number of wires can be decreased, because in each bank the DQ buffers DQ are located at one end of every memory-cell column, allowing the data bus 13 to extend along the memory-cell rows and between the banks 11-0 and 11-1 on the one hand, and the banks 11-2 and 11-3 on the other.

FIG. 13 illustrates one of the identical column-selecting switches 16 and one of the identical switches 21, all incorporated in the semiconductor memory shown in FIGS. 11 and 12.

As shown in FIG. 13, the column-selecting switch 16 is composed of N-channel MOS transistors N1 and N2. The gates of the MOS transistors N1 and N2 are connected to a column-selecting line 15. The source-drain regions of the MOS transistors N1 and N2 are connected at one end to a sense amplifier SA and at the other end to a local DQ-line pair 18a.

The switch 21 is composed of N-channel MOS transistors N3 and N4. The gates of the MOS transistors N3 and N4 are connected to a control line 22. The source-drain regions of the transistors N3 and N4 are connected at one end to the local DQ-line pair 18a and at the other end to a global DQ-line pair 18b.

FIG. 14 shows one of the column decoders CD0 and CD1 incorporated in the memory used in the memory chip shown in FIGS. 11 and 12. More correctly, FIG. 14 is a circuit diagram illustrating one column decoder DC0.

As can be seen from FIG. 14, column address signals A0 to A10 are input to the column decoder CD0. In the column decoder CD, the signals A0 to A10 set the output signal of one of predecoders (AND circuits) 23-1, 23-2, . . . , and 23-N at low (L) level, and the output signals of the remaining predecoders at high level. Of the column address signals, signals A8 to A10 set the output signal of one of decoders 24-1, 24-2, . . . , and 24-M at low level, and the output signals of the other decoders at the high level.

The signals output by the predecoders 23-1, 23-2, . . . , and 23-N are input to all memory-cell blocks 25-1, 25-2, . . . , 25-N provided in the column decoder CD0. The signals output by the decoders 24-1, 24-2, . . . , 24-M are input to the memory-cell blocks 25-1, 25-2, . . . , 25-N. The signals output by the predecoders 23-1 to 23-N and decoder 24-1 to 24-M are input to NOR circuits 26-0 to 26-7 provided in each of the memory-cell blocks 25-1 to 25-N.

When the output signals of, for example, the predecoders 23-1 and decoder 26-0 are at low level, the output signal of the NOR circuit 26-0 is at high level, while the outputs signals of the other NOR circuits 26-1 to 26-7 are at low level. The output signals of the NOR circuits 26-0 to 26-7 are input to latch circuits 28-0 to 28-7 through transfer gates 27-0 to 27-7, respectively, while the control signal L supplied to the transfer gates 27-0 to 27-7 remains at high level.

The signals output by the latch circuits 28-0 to 28-7 are supplied to the column-selecting line 15 through AND circuits 29-0 to 29-7, respectively, while a control signal T supplied to the AND circuits 29-0 to 29-7 remains at high level.

When the output signal of, for example, the predecoder 23-1 is at high level, and the output signal of, for example, the decoder 24-1 is at low level, the potential of only the column-selecting wire CSL0 of the column-selecting line 15 is at high level, and the potentials of the remaining wires CSL1 to CSL7 of the line 15 are at low level. The column-selecting switch connected to the column-selecting wire whose potential is at the high level is turned on.

A block-write signal BW is supplied to the decoder 24-1 to 24-M. In normal mode, the block-write signal BW remains at low level. In block-write mode, the signal BW is at high level. Thus, in the block-write mode, the output signals of the decoders 24-1 to 24-M are at low level, not depending upon the levels of column-address signals A8 to A10. Hence, when the output signal of the predecoder 23-1 is at low level, the potentials of all column-selecting wires CSL0 to CSL7 which are controlled by the block 25-1 are at high level. Any column-selecting switch connected to one column-selecting wire which is at high level is turned on. Data can be thereby written into each memory-cell block.

FIG. 15 shows one of the bank selectors SEL provided in the memory chip of FIGS. 11 and 12.

As shown in FIG. 15, the first bank selector SEL comprises transfer gates T01 and T02 connected between the associated DQ buffer DQ and the data bus 13. The second bank selector SEL comprises transfer gates T11 and T12 connected between the associated DQ buffer DQ and the data bus 13. The third bank selector SEL comprises transfer gates T21 and T22 connected between the associated DQ buffer DQ and the data bus 13. The fourth bank selector SEL comprises transfer gates T31 and T32 connected between the associated DQ buffer DQ and the data bus 13. Each of the transfer gates T01, T02, T11, T12, T21, T22, T31 and T32 is comprised of an N-channel MOS transistor and a P-channel MOS transistor.

In the bank 11-0, bank-selecting signals BNK0 and $\overline{BNKU}$ are input to the bank selectors SEL. More precisely, the signal BNK0 is supplied to the gates of the N-channel MOS transistors constituting the transfer gates T01 and T02, whereas the signal $\overline{BNKU}$ is supplied to the gates of the P-channel MOS transistors constituting the transfer gates T01 and T02.

Similarly, in the bank 11-1, bank-selecting signals BNK1 and $\overline{BNR1}$ are input to the bank selectors SEL; in the bank 11-2, bank-selecting signals BNK2 and $\overline{BNK2}$ are input to the bank selectors SEL; and in the bank 11-3, bank-selecting signals BNK3 and $\overline{BNK3}$ are input to the bank selectors SEL.

Of the bank-selecting signals BNK0 to BNK3, any one is at high level, while the other seven bank-selecting signals are at low level. For example, when the bank-selecting signal BNK0 is at high level to select the bank 11-0, the bank-selecting signals BNK1 to BNK3 are at low level. In this case, the DQ buffers DQ of only the bank 11-0 are connected to the data bus 13, and the DQ buffers DQ of the other banks 11-1 to 11-3 are disconnected from the data bus 13. As a result, data can be transferred between the data I/O region 12 and the bank 11-0 only.

The first embodiment shown in FIGS. 11 and 12 is a 16-bit semiconductor memory which stores and outputs 16 bits at the same time. The first embodiment therefore has 16 data I/O circuits. The data I/O circuits are identical in structure as 32 data I/O circuits. Therefore, one of the data I/O circuits will be described, with reference to FIG. 16.

Figure 16:
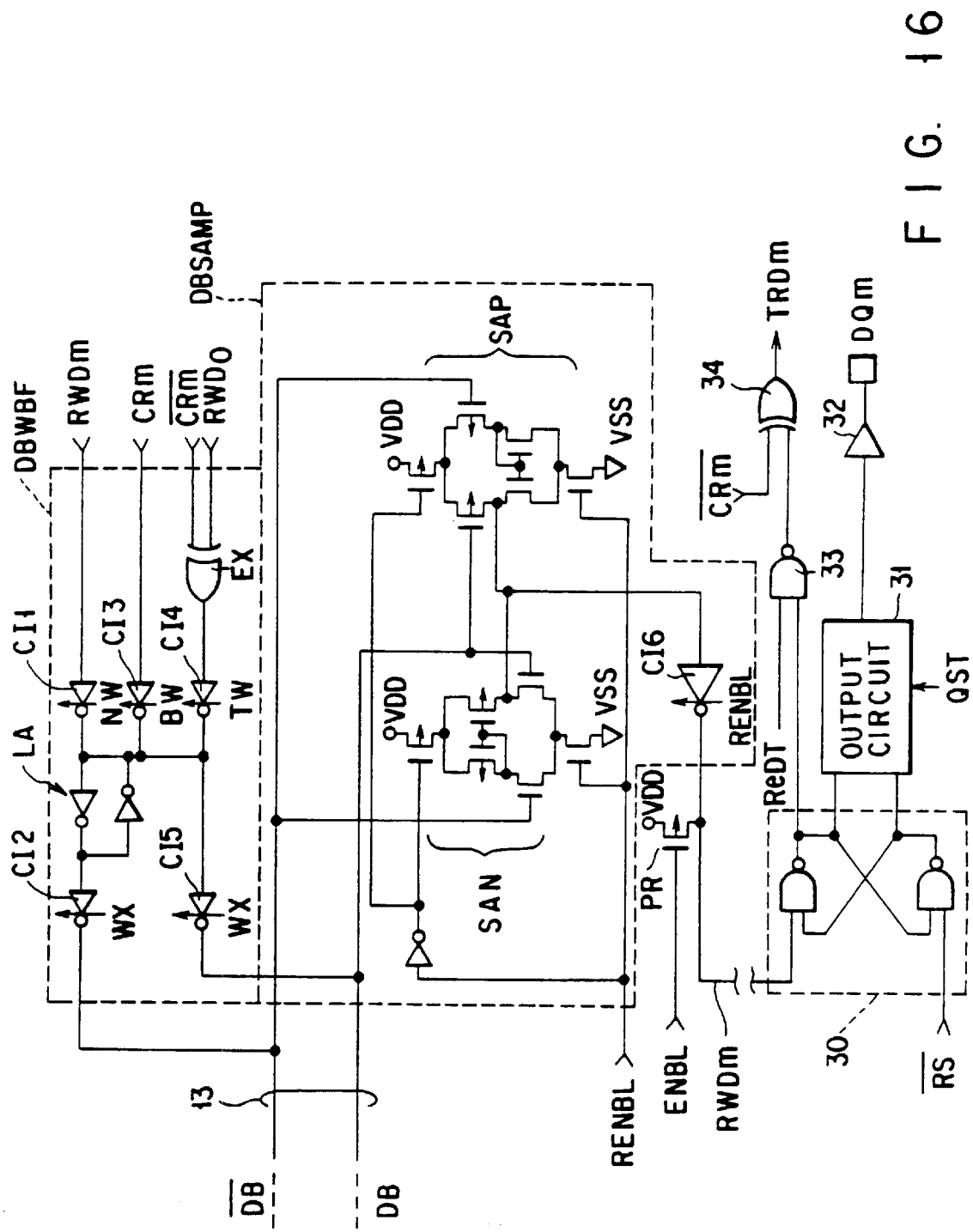
FIG. 16 is a circuit diagram depicting one of the input/output circuits incorporated in the memory chip shown in FIGS. 11 and 12.

As shown in FIG. 16, the data I/O circuit comprises a data-bus sense amplifier DBSAMP, a data-bus write buffer DBWBF, an output latch circuit 30, an output circuit 31 and an output buffer 32.

The data-bus write buffer DBWBF is used to write data into the memory cell array. In the buffer DBWBF, a control signal NW is input to a clocked inverter CI1, and a control signal WX to clocked inverters CI2 and CI5. In ordinary write mode, the control signal NW is at high level, activating the clocked inverter CI1. While the control signal WX remains at high level, input data RWDm (m=0, 1, 2, ... or 31), which is to be written into the memory cell array, is supplied to the data bus 13 through the clocked inverter CI1, a latch circuit LA and the clocked inverters CI2 and CI5. The data is supplied through the data bus 13 to the bank selected.

In the data-bus write buffer DBWBF, a block-write signal BW is input to a clocked inverter CI3. The signal BW is at high level in the block write mode, activating the clocked inverter CI3. While the control signal WX remains at high level, color-resister data CRm (m=0, 1, 2, ... or 31) is supplied to the data bus 13 through the clocked inverter CI3, the latch circuit LA and the clocked inverters CI2 and CI5. The data CRm is then supplied through the data bus 13 to the bank selected.

The color-register data CRm is supplied from a color register. The color register stores a pattern of data which will be written into a plurality of memory cells simultaneously in the block-write mode. The color register is provided in an image memory, as in most cases, and is used to write data of a prescribed pattern into a plurality of memory cells at the same time. The contents of the color register (i.e., data pattern) can be changed, whenever necessary, in a so-called data-changing mode.

Further, in the data-bus write buffer DBWBF, a control signal TW is input to a clocked inverter CI4. The signal TW is at high level in the test mode, activating the clocked inverter CI4. While the control signal WX remains at high level, the output signal of an exclusive-OR circuit EX is supplied to the data bus 13 via the clocked inverter CI4, the latch circuit LA and the clocked inverters CI2 and CI5. The signal is supplied through the data bus 13 to the bank selected. Color-register data $\overline{CRm}$ and data RWD0 are input to the exclusive-OR circuit EX. In the first embodiment, the data pattern used in the test mode is obtained from the color register.

The test circuit incorporated in the semiconductor memory according to the first embodiment and designed to test the memory cell arrays will be described later.

The data-bus sense amplifier DBSAMP is used to read data from the memory cell arrays. As seen from FIG. 16, the amplifier DBSAMP comprises an N-channel type operation amplifier SAN and a P-channel type operation amplifier SAP. The amplifier DBSAMP is activated when an activation signal RENBL rises to high level, and deactivated when the signal RENBL falls to low level.

In the data-bus sense amplifier DBSAMP, a clocked inverter CI6 is deactivated when the activation signal RENBL falls to low level. The amplifier DBSAMP is thereby disconnected from a read/write data line RWD. The data line RWD serves not only as a path of the output data (the data read from the memory cell arrays), but also as a path of the input data (the data to be stored into the memory cell arrays).

The data I/O circuit further comprises a pre-charged transistor PR. The transistor PR is provided to precharge the read/write data line RWD to the high level before the output data RWDm (m=0, 1, 2, ... or 31) is output to the read/write data line RWD. The output data RWDm output from the data-bus sense amplifier DBSAMP is input to the output circuit 31 via the output latch circuit 30.

The output latch circuit 30 is reset by a reset signal $\overline{RS}$. A sync signal QST is input to the output circuit 31. Hence, the data DQm (m=0, 1, 2, ... or 31) is supplied from the output circuit 31 in synchronism with the sync signal QST and then output through the output buffer 32. The data DQm is thus output from the memory chip 10.

As shown in FIG. 16, the data I/O circuit further comprises a NAND circuit 33 and an exclusive-OR circuit 34. These circuits 33 and 34 are part of the test circuit designed to test the memory chip 10. The Input to the NAND circuit 33 are the data supplied from the output latch circuit 30 and a test signal ReDT. The test signal ReDT remains at high level in the test mode. Input to the exclusive-OR circuit 34 are the signal supplied from the NAND circuit 33 and the color-register data $\overline{CR}$. The exclusive-OR circuit 34 outputs a signal TRDm (m=0, 1, 2, ... or 31) which represents the results of the test performed on the memory chip 10. That is, the signal TRDm indicates whether the chip 10 is flawless or not.

Figure 17:
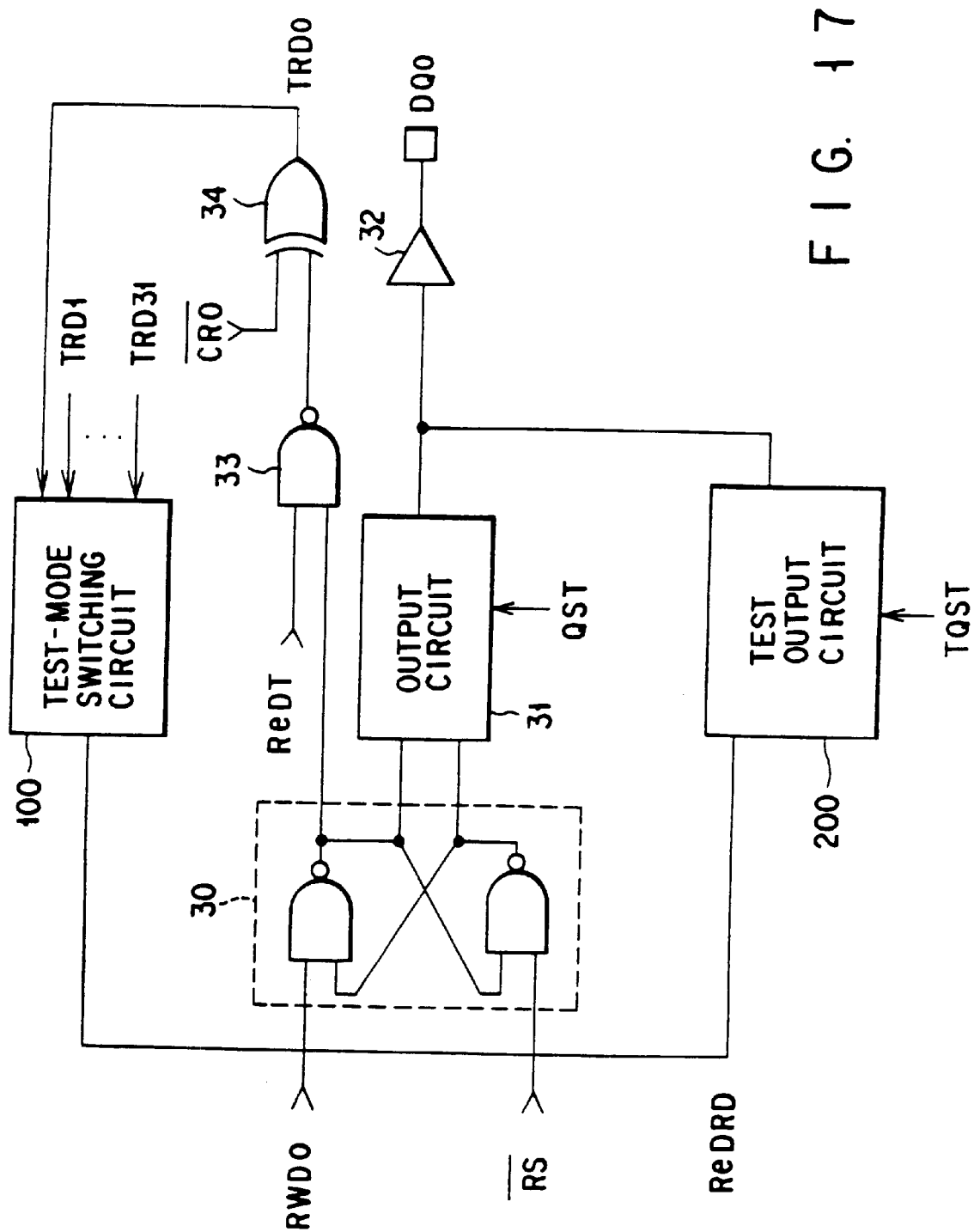
FIG. 17 is a diagram illustrating the main components of the a circuit designed to test the memory chip shown in FIGS. 11 and 12.

The test circuit will be described, with reference to FIG. 17. In FIG. 17, the components of the data I/O circuit are shown at the same reference numerals as those used in FIG. 16.

The test circuit is designed for use in 32-bit (×32) type semiconductor memories. As shown in FIG. 17, the test circuit comprises the NAND circuit 33, the exclusive-OR circuits 34, a test-mode switching circuit 100, and a test output circuit 200.

In the test mode, the test signal ReDT remains at high level. The output signal TRDm (m=0, 1, 2, ... or 31) of the exclusive-OR circuit 34 is input to the test-mode switching circuit 100. The 32-bit data representing the result of the test is input to the switching circuit 100. The switching circuit 100 sequentially outputs 32 bits of this data to the test output circuit 200.

The test output circuit 200 is activated when a control signal TQST rises to high level. When the circuit 200 is activated, a control signal QST input to the output circuit 31 is at low level. The output circuit 31 is therefore deactivated. The circuit 31 is activated and used in the normal mode.

Figure 18:
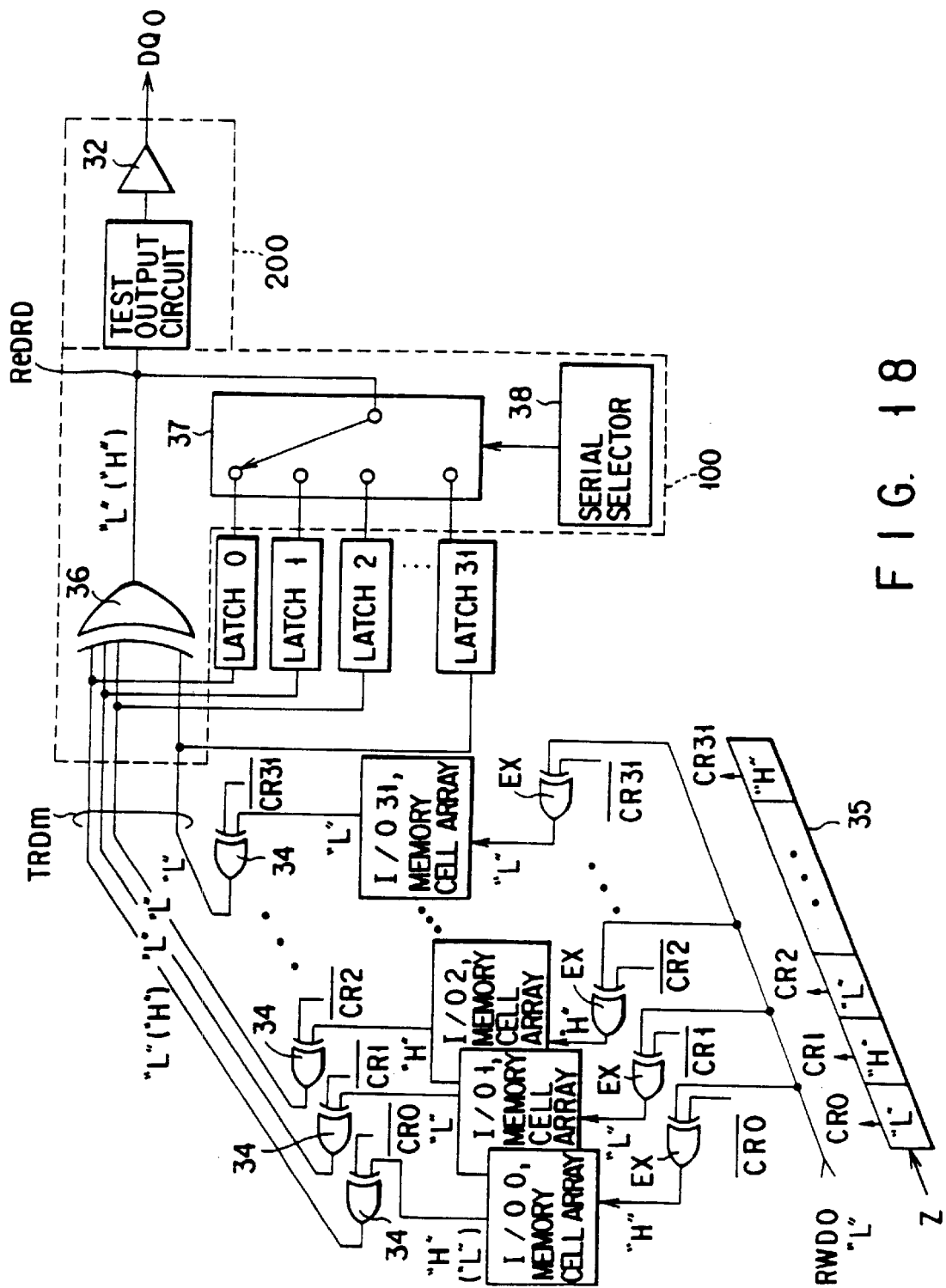
FIG. 18 is a diagram showing, in detail, the test circuit of FIG. 17.

The test circuit will be described in detail, with reference to FIG. 18. In FIG. 18, the same components as those shown in FIG. 16 are designated at the same reference numerals.

As described above, the test circuit is designed for use in 32-bit (×32) type semiconductor memories.

The test circuit has a color register 35, which stores data (0, 1, 0, ... 1) having a predetermined pattern. The contents of the color register 35, i.e., a data pattern, can be changed in a pattern-changing mode, in accordance with a control signal Z. The data items $\overline{CR0}$, $\overline{CR1}$, ... $\overline{CR3}$ Istored in the color register 35 are input to exclusive-OR circuits EX. Also input to the exclusive-OR circuits EX is input data RWD0. The input data RWD0 is at either low level or high level. When the input data RWD0 is at low level, an data item at high level is input to a cell array 0, a data item at low level to a cell array 1, a data item at high level to a cell array 2, and so forth. Thus, an data item at low level is input to a cell array 31.

When all cell arrays 0 to 31, a data item at high level is output from the cell array 0, a data item at low level from the cell array 1, a data item at high level from the cell array 2, and so forth. Thus, an data item at low level is output from the cell array 31. In this case, the signals TRDm output from all exclusive-OR circuits 34 are at low level.

The output signals TRDm of the exclusive-OR circuits 34 are supplied through the test-mode switching circuit 100 and the test output circuit 200. Finally it is output from the memory chip, as a decision signal DQ0. The test-mode switching circuit 100 determines whether the memory cell arrays 0 to 31 are flawless or not. More precisely, if all signals TRDm output from the exclusive-OR circuits 34 are at low level, the switching circuit 100 determines that the memory cell arrays 0 to 31 are flawless and generates a signal at low level.

If any one of the memory cell arrays 0 to 31 is defective, the exclusive-OR circuit 34 connected to the defective memory cell array outputs a signal TRDm at high level. In this case, the test-mode switching circuit 100 outputs a signal which is at high level, indicating that at least one of the memory cell arrays 0 to 31 is defective. If the output signal of the circuit 100 is at high level, it is determined which memory cell array or arrays are defective. This can be achieved by first latching the output signals of the exclusive-OR circuits 34 in latch circuits LATCH0 to LATCH31, respectively, and then reading these signals one after another.

In the test circuit shown in FIG. 18, the data stored in the color register 35 is utilized to test the semiconductor memory (more specifically, the memory cell arrays 0 to 31), and the signals indicating whether the memory cells of the arrays 0 to 31 are defective or not are output sequentially. The test circuit is therefore simple in structure, requiring only one testing pad (terminal) on the memory chip 10. This helps to reduce the size and manufacturing cost of the memory chip 10.

The test-mode switching circuit 100 will be described in detail, with reference to FIG. 19.

As shown in FIG. 19, the switching circuit 100 comprises an exclusive-OR section 36, a switch section 37, and a serial selector 38.

The exclusive-OR section 36 is designed to determine whether the memory cell arrays 0 to 31 are defective or not. The section 36 comprises exclusive-OR circuits EX-OR0 to EX-OR30, an inverter I and a clocked inverter CI7. The exclusive-OR circuits EX-OR0 to EX-OR30 receives the output signals TRD0 to TRD31 of the exclusive-OR circuits 34. When the signals TRD0 to TRD31 are all at low level, all exclusive-OR circuits EX-OR0 to EX-OR30 output signals at low level. The inverter I and the clocked inverter CI7 is connected to the output of the exclusive-OR circuit EX-OR30. The inverter CI7 is activated when a control signal/SRCH rises to high level. Thus activated, the clocked inverter CI7 outputs a signal ReDRD which shows the result of the test.

When the signals TRD0 to TRD31 are all at low level, the output signal ReDRD of the clocked inverter CI7 is at low level, indicating that the memory cell arrays 0 to 31 are flawless. When at least one of the signals TRD0 to TRD31 is at high level, the output signal ReDRD of the clocked inverter CI7 is at high level, showing that at least one of the the memory cell arrays 0 to 31 is defective.

The switch section 37 is designed to determine which memory cell array or arrays are defective when the output signal ReDRD of the exclusive-OR section 36 indicates that at least one of the the memory cell arrays 0 to 31 is defective. The section 37 comprises transfer gates TG0 to TG31 and a clocked inverter CI8. Each of the transfer gates TG0 to TG31 is composed of an N-channel MOS transistor and a P-channel MOS transistor. The transfer gates TG0 to TG31 are switched on and off by the serial selector 38.

The serial selector 38 is activated when a control signal SRCH rises to high level, and outputs control signals Q0 to Q31 in synchronism with a clock signal CLK. One of the control signals Q0 to Q31 is at high level, while all others are at low level. The high-level control signal shifts, sequentially from the signal Q0 toward the signal Q31. In other words, the output signals TRD0 to TRD31 of the exclusive-OR circuits 34 are output via the clocked inverter CI8, one after another. The clocked inverter CI8 is activated when the control signal SRCH rises to high level.

Figure 20:
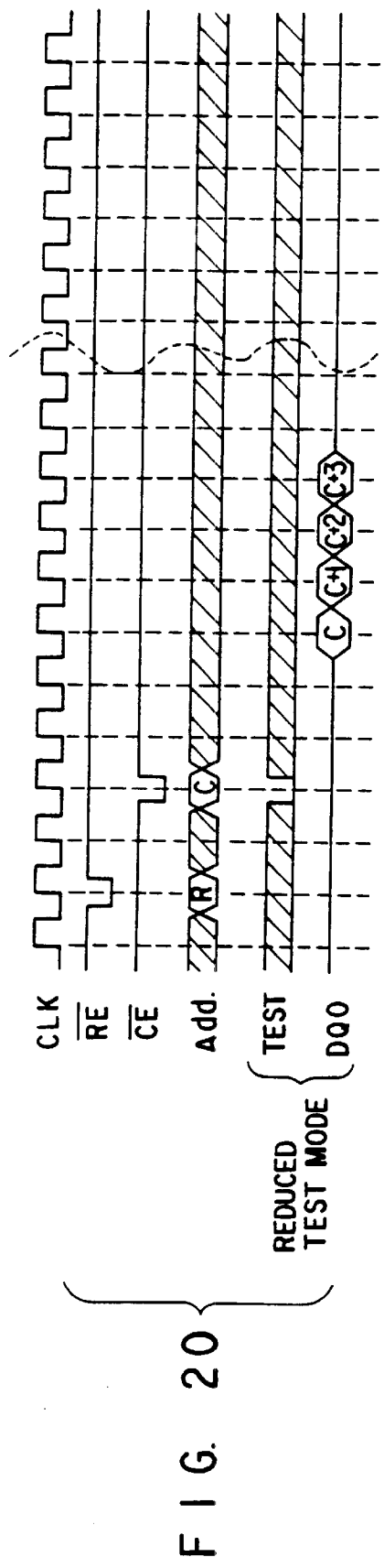
FIG. 20 is a diagram representing the wave forms the signals assume in a test mode.
Figure 21:
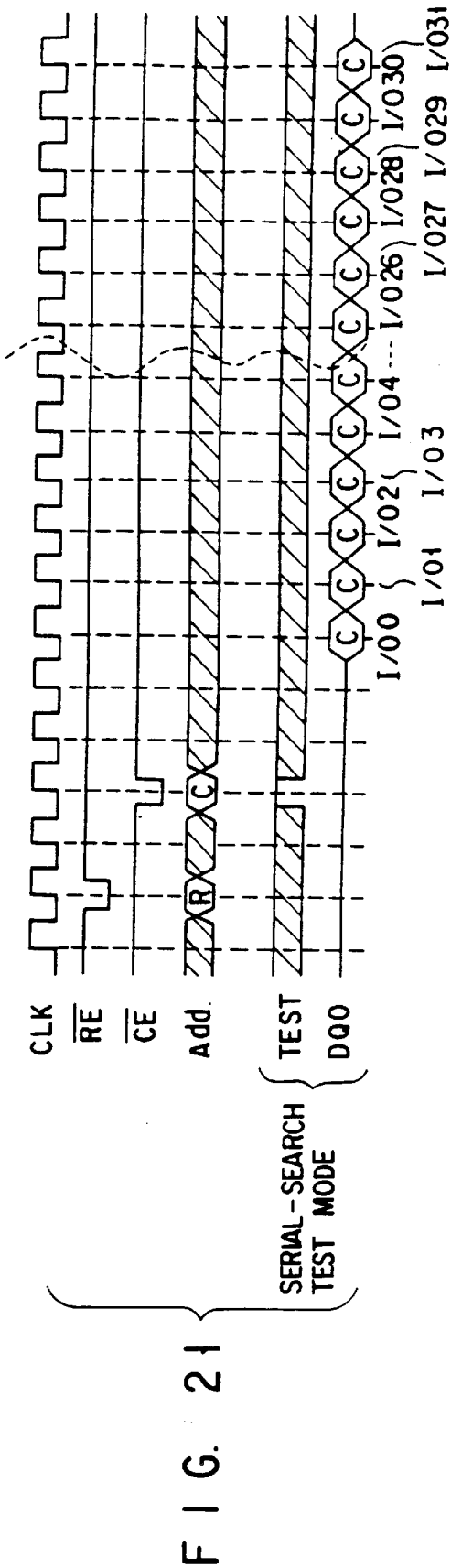
FIG. 21 is a diagram representing the wave forms the signals assume in another test mode.

FIG. 20 is a diagram representing the wave forms the signals assume in a test mode;

How the semiconductor memory according to the first embodiment operate in reduced test mode will be explained, with reference to FIG. 20, and how it operates in serial search mode will be described, with reference to FIG. 21.

In the reduced test mode, the test circuit tests the memory chip 10 to see whether the memory cell arrays are defective or not. In the serial search test mode, the test circuit determines which memory cell array or arrays are defective.

A signal $\overline{\text{RE}}$ determines the time at which to supply a row-address signal into the semiconductor memory chip 10. More correctly, a row-address signal is input into the chip 10 when the signal $\overline{\text{RE}}$ is at low level. A signal $\overline{\text{CE}}$ determines the time at which to supply a column-address signal into the memory chip 10. More precisely, a column-address signal is supplied into the chip 10 when the signal $\overline{\text{CE}}$ is at low level.

The test circuit starts operating in the reduced test mode, when a test signal TEST falls to low level while the signal $\overline{\text{CE}}$ remains at low level. The test circuit starts operating in the serial search test mode, when a test signal TEST rises to high level while the signal $\overline{\text{CE}}$ remains at low level.

Figure 22:
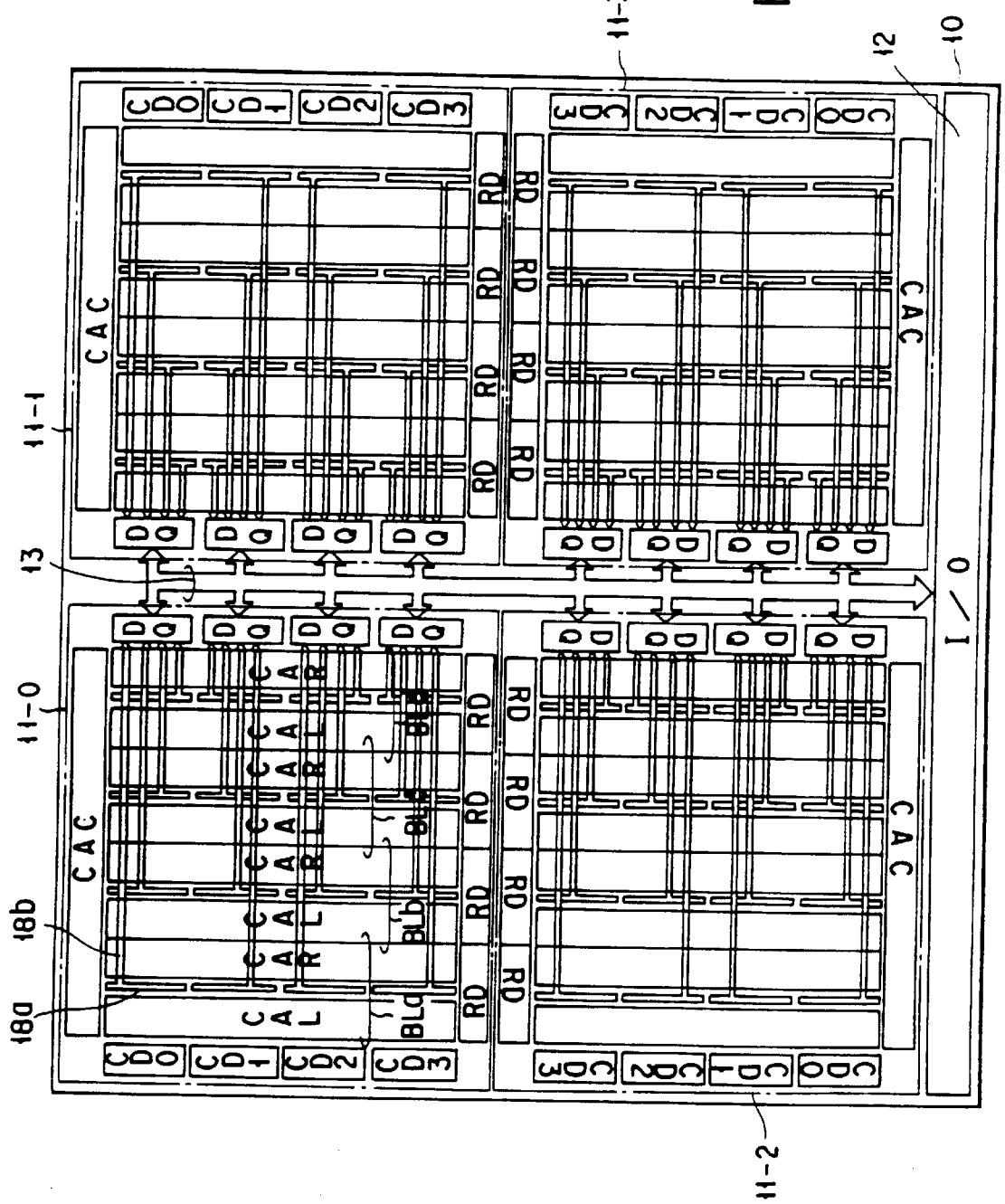
FIG. 22 is a diagram showing the layout of a semiconductor memory chip according to a second embodiment of the invention.

A semiconductor memory chip 10 according to the second embodiment of the present invention will be described, with reference to FIGS. 22 and 23. FIG. 22 shows the layout of the memory chip 10.

The second embodiment is a 32-bit (×32) type semiconductor memory which can store and output 32 bits at the same time.

As shown in FIG. 22, the memory chip 10 has four banks 11-0 to 11-3, a data input/output (I/O) region 12, and a data bus 13. The banks 11-0 to 11-3 are arranged in the same plane and side by side. They are identical in structure, each comprises four memory cell arrays CAL and four memory cell arrays CAR. Each bank further comprises circuits peripheral to the cell arrays CAL and CAR. The peripheral circuits are: a cell-array controller CAC, four row decoders RD, four column decoders CD0 to CD3, and four DQ buffers DQ. (The DQ buffers DQ are provided in the input/output section of the bank.)

In each bank, the memory cell arrays CAL and CAR constitute four memory-cell blocks BLa, BLb, BLc and BLd. Each memory-cell block consists of two sub-blocks CAL (i.e., a memory cell array CAL) and CAR (i.e., a memory cell array CAR). Hence, each bank has eight sub-blocks.

As shown in FIG. 22, the four row decoders RD are provided for the four memory-cell blocks BLa, BLb, BLc and BLd, respectively. Each row decoder RD selects the sub-block CAL or CAR and further selects one of the memory-cells rows (or word lines 17) provided in the sub-block selected, in accordance with a row-address signal.

As mentioned above, each bank has four column decoders CD0 to CD3. Each of the column decoders CD0 to CD3 selects at least one of the memory-cell columns provided in the associated memory-cell block BLa, BLb, BLc or BLd, in accordance with a column-address signal.

When the column decoder CD0 selects, for example, a column-selecting line, the two column-selecting switches connected to this column-selecting line are turned on. In this case, the 2-bit data on two data-line pairs connected to the column-selecting switches is supplied to local DQ-line 18a.

In any bank of the second embodiment, each column decoder can select two columns of memory cells. Since the bank has four column decoders, the memory-cell blocks BLa, BLb, BLc and BLd store and output eight bits each. Namely, each bank stores and outputs 32-bit (4-byte) data.

In each of the memory-cell blocks BLa to BLd, sense amplifiers and column-selecting switches are located between the sub-block CAL and the sub-block CAR as is illustrated in FIG. 22. In each bank, the row decoders RD oppose the cell-array controller CAC, with the memory cell arrays CAl and CAR located between the row decoders RD on the one hand and the cell-array controller CAC on the other. Namely, the row decoders RD are located at one end of every block which extends along the-column of memory cells (at right angle to the word lines), whereas the cell-array controller CAC is located at the other end of the memory-cell blocks BLa to BLd.

The cell-array controller CAC controls the data input/output operation of the bank.

The column decoders CD0 to CD3 are located at one end of every column of memory cells, along which the blocks BLa to BLd are arranged at intervals and in parallel to which the data-line pairs and column-selecting lines extend. The column decoders CD0 to CD3 are spaced apart along the rows of memory cells. Each of the column decoders CD0 to CD3 is provided one quarter of the memory-cell columns provided in the bank.

The DQ buffers DQ at the other end of the columns of memory cells, along which the memory-cell blocks BLa to BLd are arranged at intervals and in parallel to which the data-line pairs and column-selecting lines extend. Thus, the DQ buffers DQ oppose the column decoder CD0 to CD3, and the memory cell arrays CAL and CAR are arranged between the DQ buffers DQ on the one hand and the column decoders CD0 and CD1 on the other.

Data is supplied to the local DQ-line pairs 18a through the sense amplifiers and the column-selecting switches. Each each DQ-line pair 18 extends between the sub-blocks CAL and CAR which constitute one memory-cell block BLa, BLb, BLc or BLd. The local DQ-line pairs 18a extend parallel to the rows of memory cells (that is, along the word lines).

As shown in FIG. 22, global DQ-line pairs 18b are provided, extending over the sub-blocks CAL and CAR in parallel to the columns of memory cells. The global DQ-line pairs 18b are connected at one end to the local DQ-line pairs 18a by switches, and at the other end to the DQ buffers DQ.

The data bus 13 shared by the four banks 11-0 to 11-3 extends along the rows of memory cells, between the banks 11-0 and 11-1 on the one hand, and the banks 11-2 and 11-3 on the other. The data bus 13 is provided to transfer data from the data I/O region 12 to the banks 11-0 to 11-3, and vice versa. The bus 13 is designed to enable the memory chip 10 to store and output 32 bits (4 bytes) simultaneously, because the memory chip 10 is a 32-bit type as mentioned earlier.

The data I/O region 12 is arranged at one end of every row of memory cells. Provided in the region 12 are 32 input/output (I/O) circuits (not shown). The I/O circuits cooperate to write 32-bit data into the memory cell arrays and output 16-bit data therefrom.

How the memory chip 10 according to the second embodiment stores and outputs 32-bit data will be explained.

First, the bank selectors (no shown) select one of the four banks 11-0 to 11-3 is selected. In the bank selected, the memory cell array is accessed on the basis of an address signal.

In the data-output (i.e., data-reading) mode, the bank selected outputs 32-bit data (i.e., 4-byte data) through the local DQ-line pairs 18a and global DQ-line pairs 18b. The 32-bit data is thereby output from the bank selected. It is then supplied via the data bus 13 to the data I/O region 12. The data is output from the region 12, namely from the semiconductor memory chip 10.

In the data-input (i.e., data-writing) mode, 32-bit data (i.e., 4-byte data) is supplied from an external device to the data I/O region 12. The data is further supplied via the data bus 13 to the bank selected. In the bank selected, the 32-bit data is stored into the memory cells of the array through the global DQ-line pairs 18b, the local DQ-line pairs 18a and the sense amplifiers.

The comparative semiconductor memory chip 10 according to the second embodiment is advantageous in the respects.

First, the cell-array controller CAC, row decoders RD, column decoders CD0 and CD1 and DQ buffers DQ are arranged near one side of the memory cell arrays CAL and CAR. This is because the controller CAC and the row decoders RD are located at one end of every row of memory cell, and also because the column decoders CD0 to CD3 are located at one end of every memory-cell column and oppose the DQ buffers DQ which are located at the other end of very memory-cell column. Hence, the elements and wires constituting the controller CAC, row decoders RD, column decoders CD0 to CD3 and DQ buffers DQ can be arranged in a simple pattern.

Second, the constituent elements and wires of the DQ buffers DQ can be arranged in a simple pattern, because the DQ buffers DQ are located at one end of every memory-cell column. The DQ buffers DQ can be so located since the local DQ-line pairs 18a extend along the memory-cell rows, while the global DQ-line pairs 18b extend along the memory-cell columns, making it possible to input and output data at that side of the bank where one end of each memory-cell column is positioned.

Further, it suffices to use local DQ-line pairs at each of the column decoders DC0 to DC3 to transfer two bits and local DQ-line pairs at each column decoder DC1 to transfer two bits, even each memory-cell block is designed to store and output eight bits simultaneously. This is because the column decoders CD0 to CD3 are located close to each other and spaced apart in the direction in which the memory-cell rows extend, so that one bit is input to and output from the memory-cell block at one end of each memory-cell column. Since a relatively small number of local DQ-line pairs are required to transfer data in each memory-cell block, an area required to accommodate the DQ-line pairs-can be small.

Each bank needs to have as many global DQ-line pairs as is required to transfer 32-bit data if 8-bit data is input to and output from each memory-cell block. Nevertheless, a region need not be provided to accommodate the global DQ-line pairs since the global DQ-line pairs 18b are provided on the memory cell arrays CAL and CAR.

Third, the number of wires constituting the data bus 13 can be reduced to minimize the area the bus 13 occupies on the memory chip 10, merely by positioning the banks and the data I/O circuits appropriately. The number of wires can be decreased, because in each bank the DQ buffers DQ are located at one end of every memory-cell column, allowing the data bus 13 to extend along the memory-cell rows and between the banks 11-0 and 11-1 on the one hand, and the banks 11-2 and 11-3 on the other.

Figure 23:
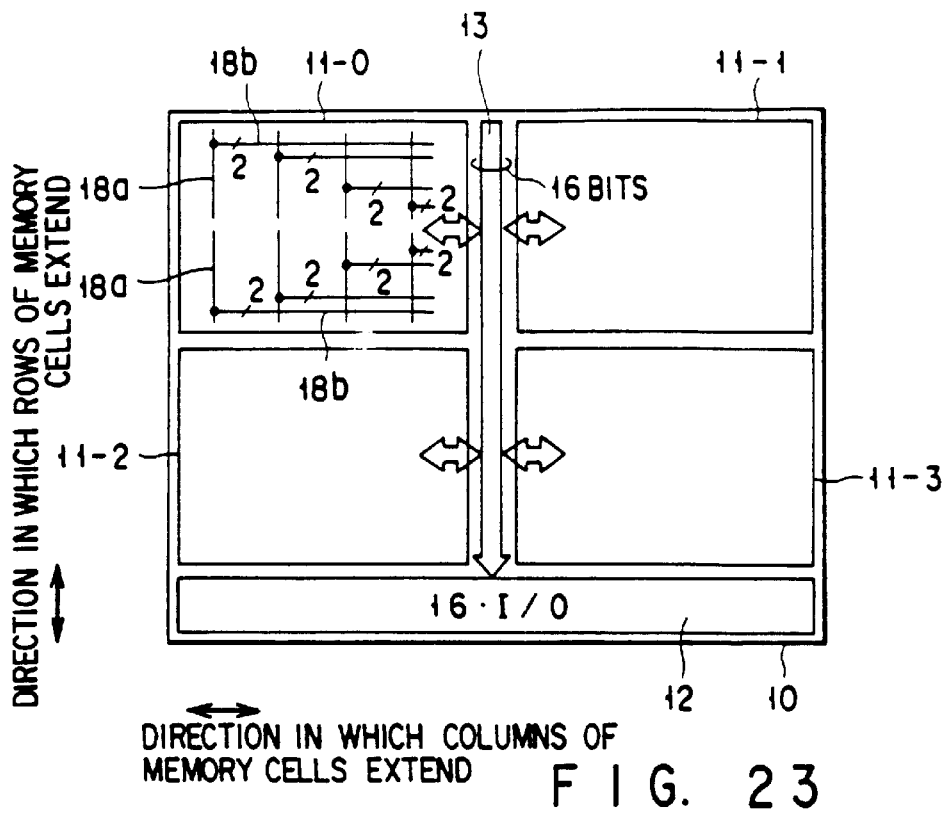
FIG. 23 is a schematic diagram showing the layout of the memory chip illustrated in FIG. 11.

FIG. 23 is a schematic diagram showing the layout of the memory chip 10 according to the first embodiment, which is illustrated in FIG. 11.

As seen from FIG. 23, the banks 11-0 to 11-3 and the data I/O region 12 occupies the upper surface region of the memory chip 10. The data I/O region 12 is located close to one of those sides of the memory chip 10 which extend in parallel to the columns of memory cells.

Each bank has memory cell arrays which constitute four memory-cell blocks BLa, BLb, BLc and BLd. The blocks extend parallel to the rows of memory cells. Each memory-cell block consists of two sub-blocks. Hence, each bank has eight sub-blocks, which extend also in parallel to the column of memory cells.

Each sub-block has word lines, data lines and column-selecting lines. The word lines extend along the rows of memory cells. The data lines and the column-selecting lines extend along the columns of memory cells. Local DQ-line pairs 18 extend along the rows of memory cells, between two sub-blocks. Global DQ-line pairs 18b extend over the memory cell array, along the columns of memory cells. The global DQ-line pairs 18b are connected to the local DQ-line pairs by switches.

The data bus 13 is provided between the banks 11-0 and 11-1, on the one hand, and the banks 11-2 and 11-3, on the other, extending in parallel to the rows of memory cells. The bus 13 is designed to transfer 16 bit (2-byte) data.

Figure 24:
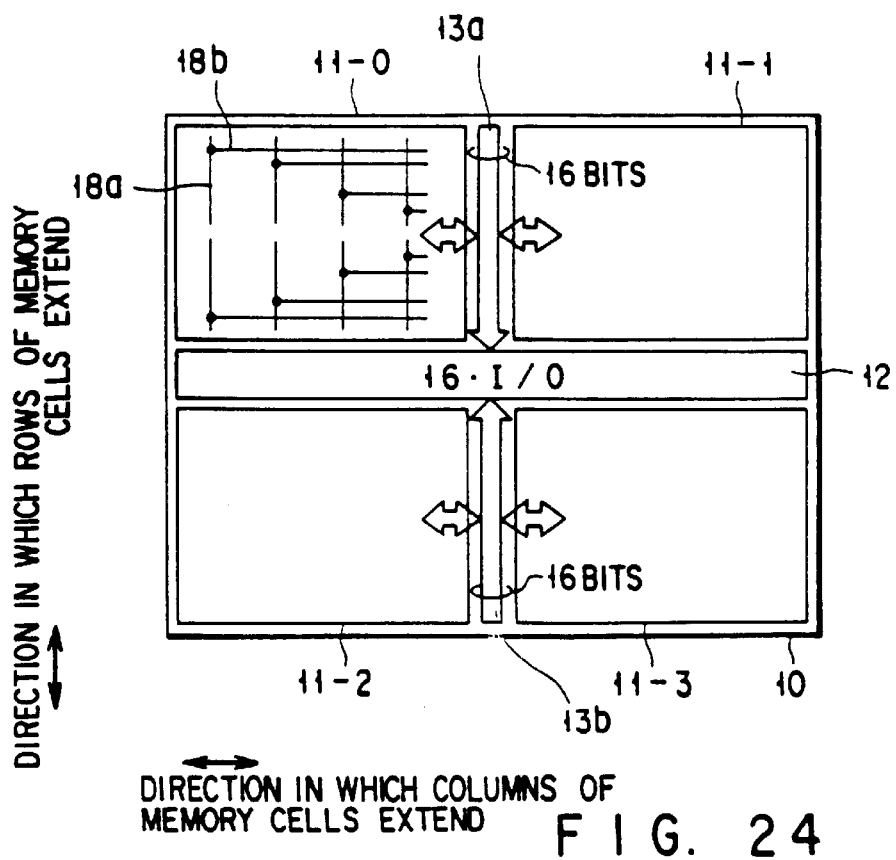
FIG. 24 is a diagram illustrating the layout of a first modification of the memory chip shown in FIG. 23.

FIG. 24 is a diagram illustrating the layout of a first modification of the first embodiment, i.e., the memory chip 10 shown in FIGS. 11 and 23.

The modified memory chip 10 is characterized in that banks 11-0 and 11-1 and a data bus 13a are arranged on one side of a data input/output (I/O) circuit 12 and that banks 11-2 and 11-3 and a data bus 13b are arranged on the other side of the data I/O circuit 12.

As can be seen from in FIG. 24, the banks 11-0 to 11-3 and the data I/O circuit 12 occupies the upper surface region of the first comparative memory chip 10. The data I/O circuit 12 is located in the center part of the memory chip 10 and extends parallel to the columns of memory cells.

Each bank has memory cell arrays which constitute four memory-cell blocks. The blocks extend parallel to the columns of memory cells. Each memory-cell block consists of two sub-blocks. Each sub-block has word lines, data lines and column-selecting lines. The word lines extend along the rows of memory cells. The data lines and the column-selecting lines extend along the columns of memory cells.

Local DQ-line pairs 18 extend along the rows of memory cells, between two sub-blocks. Global DQ-line pairs 18b extend over the memory cell array, along the columns of memory cells. The global DQ-line pairs 18b are connected to the local DQ-line pairs by switches.

The data bus 13a is provided between the banks 11-0 and 11-1, extends parallel to the rows of memory cells and is connected to the data I/O circuit 12. Similarly, the data bus 13b is provided between the banks 11-2 and 11-3, extends parallel to the rows of memory cells and is connected to the data I/O circuit 12. Both data buses 13a and 13b are designed to transfer 16-bit (2-byte) data.

Figure 25:
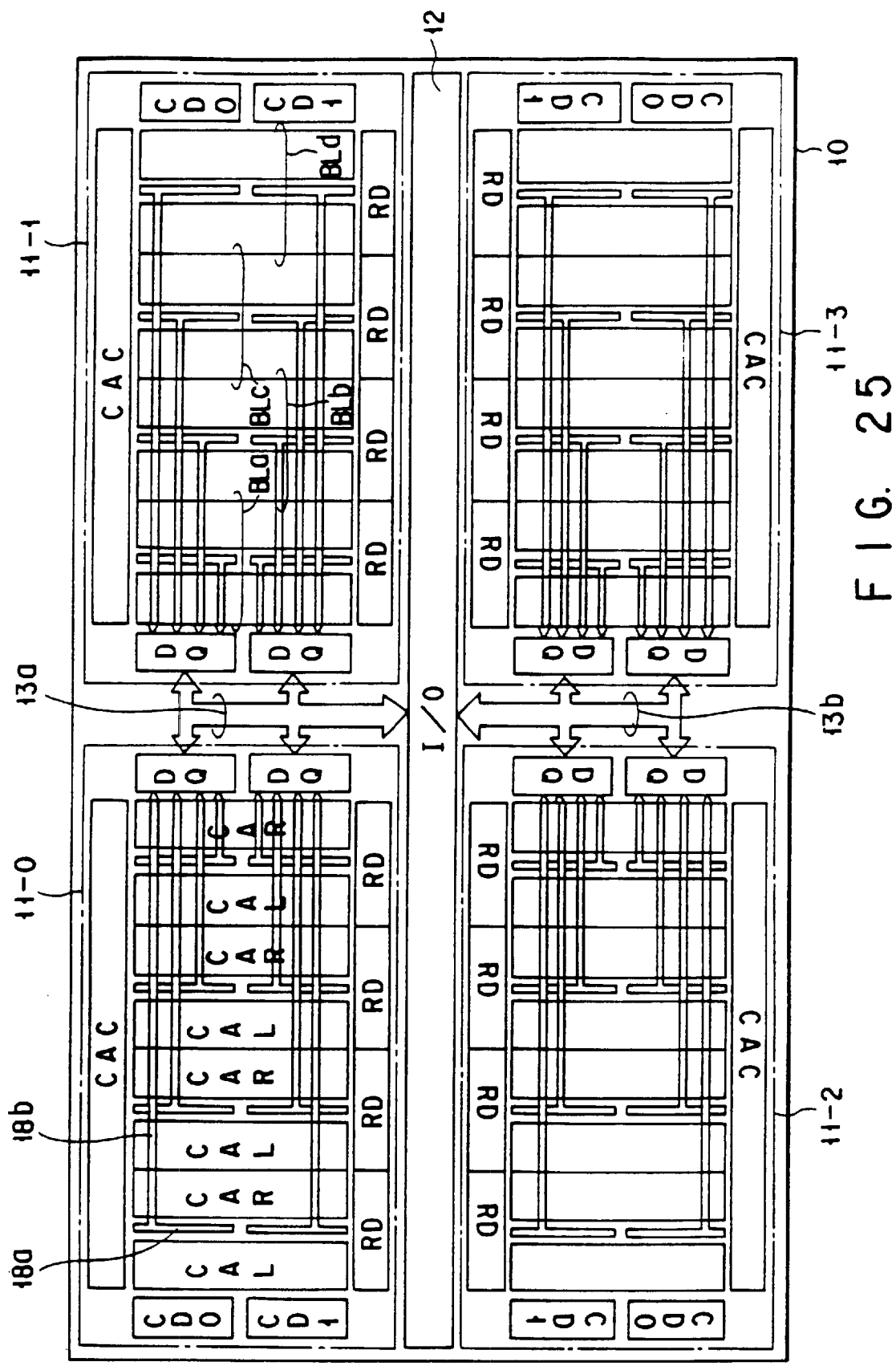
FIG. 25 is a diagram depicting, in detail, the layout of the modified memory chip shown in FIG. 24.

FIG. 25 shows, in detail, the layout of the modified memory chip shown in FIG. 24. As can be understood from FIG. 25, the components of each bank are laid out in the same fashion as in the semiconductor memory chip illustrated in FIG. 22.

Figure 26:
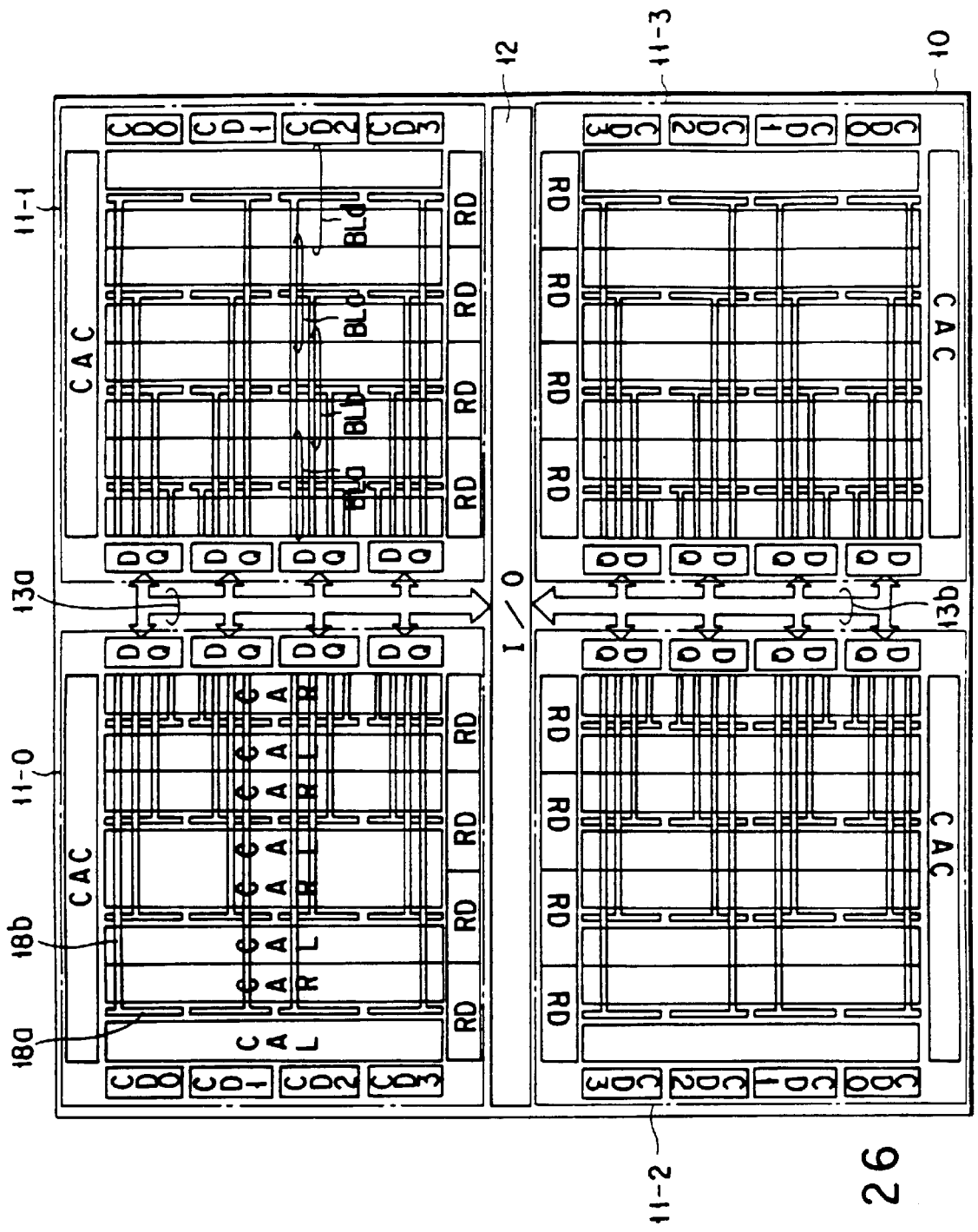
FIG. 26 is a diagram illustrating the layout of a first modification of the memory chip shown in FIG. 22.

FIG. 26 diagram illustrating the layout of a first modification of the memory chip shown in FIG. 23.

The modified memory chip 10 is characterized in that a data input/output (I/O) circuit 12 is provided on the center part of the memory chip 10 and that banks 11-0 and 11-3 and a data bus 13a are arranged on one side of the data (I/O) circuit 12 and that banks 11-2 and 11-3 and a data bus 13b are arranged on the other side of the data I/O circuit 12.

As can be seen from in FIG. 26, the banks 11-0 to 11-3 and the data I/O circuit 12 occupies the upper surface region of the first comparative memory chip 10. The data I/O circuit 12 extends parallel to the columns of memory cells.

Each bank has memory cell arrays which constitute four memory-cell blocks. The blocks extend parallel to the columns of memory cells. Each memory-cell block consists of two sub-blocks. Each sub-block has word lines, data lines and column-selecting lines. The word lines extend along the rows of memory cells. The data lines and the column-selecting lines extend along the columns of memory cells.

Local DQ-line pairs 18 extend along the rows of memory cells, between two sub-blocks. Global DQ-line pairs 18b extend over the memory cell array, along the columns of memory cells. The global DQ-line pairs 18b are connected to the local DQ-line pairs by switches.

The data bus 13a is provided between the banks 11-0 and 11-1, extends parallel to the rows of memory cells and is connected to the data I/O circuit 12. Similarly, the data bus 13b is provided between the banks 11-2 and 11-3, extends parallel to the rows of memory cells and is connected to the data I/O circuit 12. Both data buses 13a and 13b are designed to transfer 32-bit (4-byte) data. As can be seen from FIG. 16, the components of each bank are laid out in the same fashion as in the semiconductor memory chip illustrated in FIG. 22.

Figure 28:
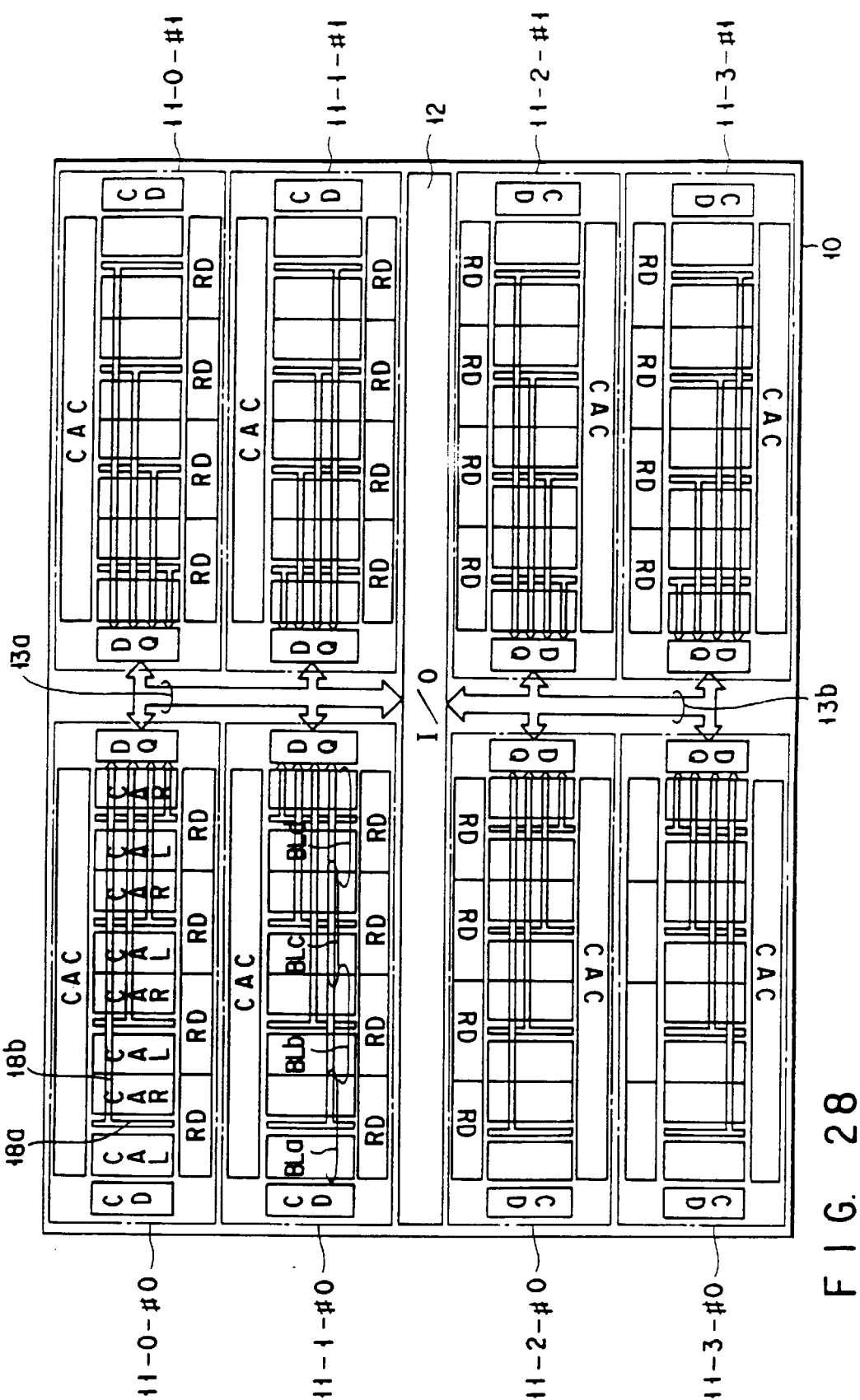
FIG. 28 is a diagram showing, in detail, the layout of the memory chip depicted in FIG. 27.

FIG. 27 shows the layout of a second modification of the memory chip 10 illustrated in FIGS. 11 and 23. FIG. 28 illustrates, in detail, the layout of the memory chip depicted in FIG. 27.

This modified memory chip is different from the chip 10 shown in FIGS. 11 and 23 in the following respects.

First, each bank (or main bank) consists Of two sub-banks. More specifically, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1, are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-0-#1 and 11-1-#1 form a first group and are connected to the data bus 13a. Similarly, the sub-banks 11-2-#0, 11-3-#0, 11-2-#1 and 11-3-#1 form a second group and are connected to the data bus 13b.

Second, each of the sub-banks is designed to store and output eight bits (1 byte) at the same time. Each sub-bank has only one column decoder CD, not two as in the first comparative memory chip shown in FIG. 11. One column decoder CD is sufficient since the sub-bank stores and output eight bits. The column decoder CD is designed to select two columns of memory cells, as in the memory chip shown in FIG. 11, whereby the memory-cell blocks BLa to BLd store and output two bits each. Each sub-bank comprises memory cell arrays CAL and CAR, row decoders RD, local DQ-line pairs 18a, and global DQ-line pairs 18b and QD buffers QD, which are laid out almost in the same manner as in the memory chip shown in FIG. 11.

Third, the data I/O circuit 12 is provided in the center part of the chip 10, extending parallel to the columns of memory cells, the data bus 13a is provided for the first group of the sub-banks 11-0-#0, 11-1-#0, 11-0-#1 and 11-1-#1 and located on one side of the data I/O circuit 12, and the data bus 13b is provided for the second group of the sub-banks 11-2-#0, 11-3-#0, 11-2-#1 and 11-3-#1 and located on the other side of the data I/O circuit 12. The data bus 13a is located between two associated sub-banks, extends along the rows of memory cells and is connected to the data I/O circuit 12 located in the center part of the chip 10. Similarly, the data bus 13b is located between two associated sub-banks, extends along the columns of memory cells and is connected to the data I/O circuit 12. Each of the data buses 13a and 13b is designed to transfer 16 bits.

In the modified memory chip shown in FIG. 27, when the sub-banks 11-0-#0 and 11-0-#1, for example, are selected, 8-bit data is transferred via the data bus 13a between the sub-bank 11-0-#0 and the data I/O circuit 12, and 8-bit data is transferred via the data bus 13a between the sub-bank 11-0-#1 and the data I/O circuit 12.

Figure 29:
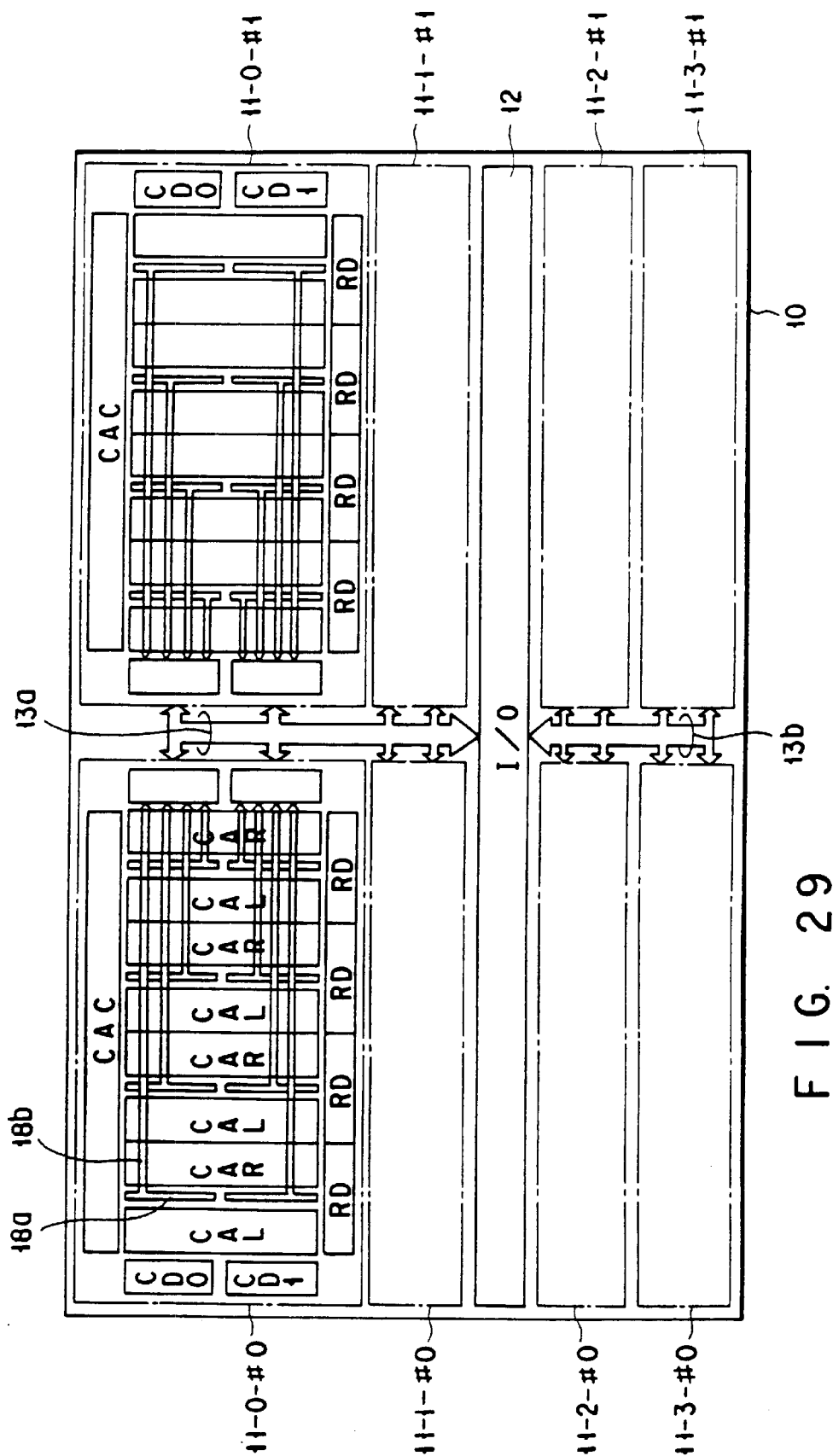
FIG. 29 is a diagram showing the layout of a second modification of the memory chip illustrated in FIG. 22.

FIG. 29 shows the layout of a second modification of the memory chip illustrated in FIG. 22.

This modified memory chip is different from the chip 10 shown in FIGS. 11 and 23 in the following respects.

First, each bank (or main bank) consists of two sub-banks. More specifically, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1, are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-0-#1 and 11-1-#1 form a first group and are connected to the data bus 13a. Similarly, the sub-banks 11-2-#0, 11-3-#0, 11-2-#1 and 11-3-#1 form a second group and are connected to the data bus 13b.

Second, each of the sub-banks is designed to store and output 16 bits (2 byte) at the same time. Each sub-bank has two column decoder CD, not four as in the memory chip shown in FIG. 22. In other words, each sub-bank is of the same structure as its counterpart of the memory chip 10 shown in FIG. 11. Two column decoders CD are sufficient for each sub-bank since the sub-bank stores and output 16 bits. Each column decoder CD is designed to select two columns of memory cells, as in the memory chip shown in FIG. 22, whereby the memory-cell blocks BLa to BLd store and output four bits each. Each sub-bank comprises memory cell arrays CAL and CAR, row decoders RD, local DQ-line pairs 18a, and global DQ-line pairs 18b and QD buffers QD, which are laid out in the same manner as in the memory chip shown in FIG. 11.

Third, the data I/O circuit 12 is provided in the center part of the chip 10, extending parallel to the columns of memory cells, the data bus 13a is provided for the first group of the sub-banks 11-0-#0, 11-1-#0, 11-0-#1 and 11-1-#1 and located on one side of the data I/O circuit 12, and the data bus 13b is provided for the second group of the sub-banks 11-2-#0, 11-3-#0, 11-2-#1 and 11-3-#1 and located on the other side of the data I/O circuit 12. The data bus 13a is located between two associated sub-banks, extends along the rows of memory cells and is connected to the data I/O circuit 12 located in the center part of the chip 10. Similarly, the data bus 13b is located between two associated sub-banks, extends along the columns of memory cells and is connected to the data I/O circuit 12. Each of the data buses 13a and 13b is designed to transfer 32 bits.

In the modified memory chip shown in FIG. 29, when the sub-banks 11-0-#0 and 11-0-#1, for example, are selected, 16-bit data is transferred via the data bus 13a between the sub-bank 11-0-#0 and the data I/O circuit 12, and 16-bit data is transferred via the data bus 13a between the sub-bank 11-0-#1 and the data I/O circuit 12.

Figure 31:
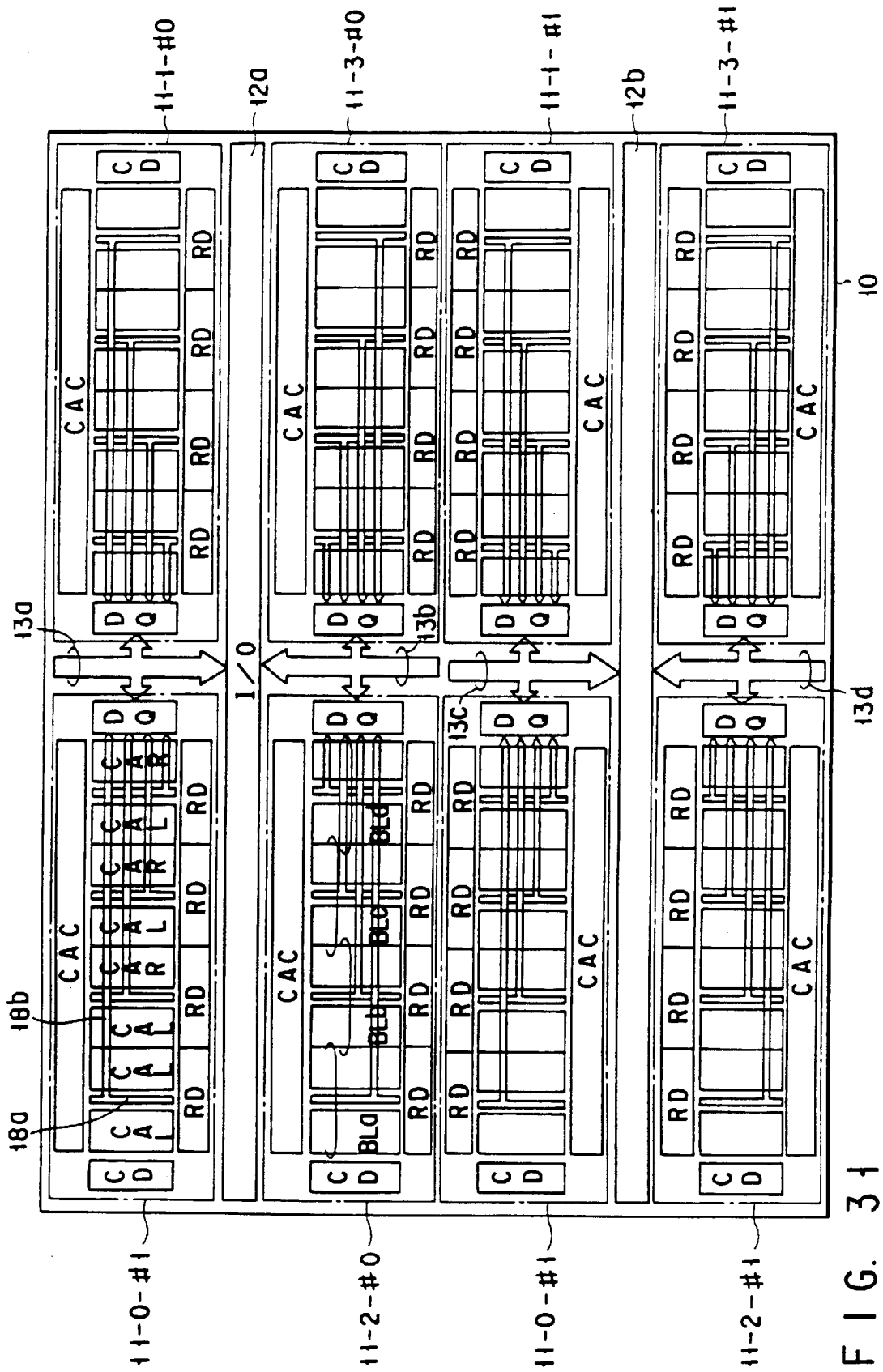
FIG. 31 is a diagram showing, in detail, the layout of the memory chip depicted in FIG. 30.

FIG. 30 illustrates the layout of a third modification of the memory chip illustrated in, FIGS. 11 and 23. FIG. 31 is a diagram showing, in detail, the memory chip depicted in FIG. 30.

The third modified memory chip is different from the chip 10 shown in FIGS. 11 and 23 in the following respects.

First, each bank (or main bank) consists of two sub-banks. More specifically, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1, are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-2-#0 and 11-3-#0 form a first group and are connected to a data I/O circuit 12a by two data buses 13a and 13b. Similarly, the sub-banks 11-0-#1, 11-1-#1, 11-2-#1 and 11-3-#1 form a second group and are connected to a data I/O circuit 12b by two data buses 13c and 13d.

Second, each of the sub-banks is designed to store and output eight bits (1 byte) at the same time. Each sub-bank has only one column decoder CD as shown in FIG. 31, not two as in the first comparative memory chip shown in FIG. 11. One column decoder CD is sufficient since the sub-bank stores and output eight bits. The column decoder CD is designed to select two columns of memory cells, as in the memory chip shown in FIG. 11, whereby the memory-cell blocks BLa to BLd store and output two bits each. Each sub-bank comprises memory cell arrays CAL and CAR, row decoders RD, local DQ-line pairs 18a, and global DQ-line pairs 18b and QD buffers QD, which are laid out almost in the same manner as in the memory chip shown in FIG. 11.

Third, the data I/O circuits 12a and 12b are arranged, extending parallel to the columns of memory cells, the data buses 13a and 13b are provided on the sides of the data I/O circuit 12a, respectively, and the data buses 13c and 13d are provided on the sides of the data I/O circuit 12b, respectively. The data bus 13a is provided for the sub-banks 11-0-#0 and 11-1-#0, the data bus 13b for the sub-banks 11-2-#0 and 11-3-#0, the data bus 13c for the sub-banks 11-0-#1 and 11-1-#1, and the data bus 13c for the sub-banks 11-2-#1 and 11-3-#1. The data buses 13a and 13b extend parallel to the rows of memory cells, each between the two associated sub-banks, and are connected to the data I/O circuit 12a. Similarly, the data buses 13c and 13d extend parallel to the rows of memory cells, each between the two associated sub-banks, and are connected to the data I/O circuit 12b. Each of the data buses 13a to 13d is designed to transfer eight bits.

In the modified memory chip of FIGS. 30 and 31, when the sub-banks 11-0-#0 and 11-0-#1, for example, are selected, 8-bit data is transferred via the data bus 13a between the sub-bank 11-0-#0 and the data I/O circuit 12a, and 8-bit data is transferred via the data bus 13c between the sub-bank 11-0-#1 and the data I/O circuit 12b. Therefore, the data buses 13a to 13d need only eight wires each, to transfer eight bits, though the semiconductor chip 10 is a 16-bit type. The area the data buses 13a to 13d occupy is thus relatively small.

FIG. 32 shows the layout of a third modification of the second embodiment of the invention, i.e., the memory chip illustrated in FIG. 22.

The third modification is different from the chip 10 shown in FIGS. 11 and 23 in the following respects.

First, each bank (or main bank) consists of two sub-banks. More specifically, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1, are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-2-#0 and 11-3-#0 form a first group and are connected to a data I/O circuit 12a by data buses 13a and 13b. Similarly, the sub-banks 11-0-#1, 11-1-#1, 11-2-#1 and 11-3-#1 form a second group and are connected to a data I/O circuit 12b by data buses 13c and 13d.

Second, each of the sub-banks is designed to store and output 16 bits (2 byte) at the same time. Each sub-bank has two column decoder CD, not four as in the memory chip shown in FIG. 22. In other words, each sub-bank is of the same structure as its counterpart of the memory chip 10 shown in FIG. 11. Two column decoders CD are sufficient for each sub-bank since the sub-bank stores and output 16 bits. Each column decoder CD is designed to select two columns of memory cells, as in the memory chip shown in FIG. 22, whereby the memory-cell blocks BLa to BLd store and output four bits each. Each sub-bank comprises memory cell arrays CAL and CAR, row decoders RD, local DQ-line pairs 18a, and global DQ-line pairs 18b and QD buffers QD, which are laid out in the same way as in the memory chip shown in FIG. 11.

Third, the data I/O circuits 12a and 12b are provided, extending parallel to the columns of memory cell, the data buses 13a and 13b are located on one side of the data I/O circuit 12a, and the data buses 13c and 13d are located on one side of the data I/O circuit 12b. The data bus 13a is provided for the sub-banks 11-0-#0 and 11-1-#0, the data bus 13b for the sub-banks 11-2-#0 and 11-3-#0, the data bus 13c for the sub-banks 11-0-#1 and 11-1-#1, and the data bus 13d for the sub-banks 11-2-#1 and 11-3-#1. Each of the data buses 13a and 13b is located between two associated sub-banks, extends along the rows of memory cells, and is connected to the data I/O circuit 12a. Similarly, each of the data buses 13c and 13d is located between two associated sub-banks, extends along the rows of memory cells, and is connected to the data I/O circuit 12b. Each of the data buses 13a to 13d is designed to transfer 16 bits.

In the third modification of the the second embodiment, which is illustrated in FIG. 32, when the sub-banks 11-0-#0 and 11-0-#1, for example, are selected, 16-bit data is transferred via the data bus 13a between the sub-bank 11-0-#0 and the data I/O circuit 12a, and 16-bit data is transferred via the data bus 13c between the sub-bank 11-0-#1 and the data I/O circuit 12b. Hence, the data buses 13a to 13d need only 16 wires each, to transfer eight bits, though the semiconductor chip 10 is a 32-bit type. The area the data buses 13a to 13d occupy is thus relatively small.

Figure 34:
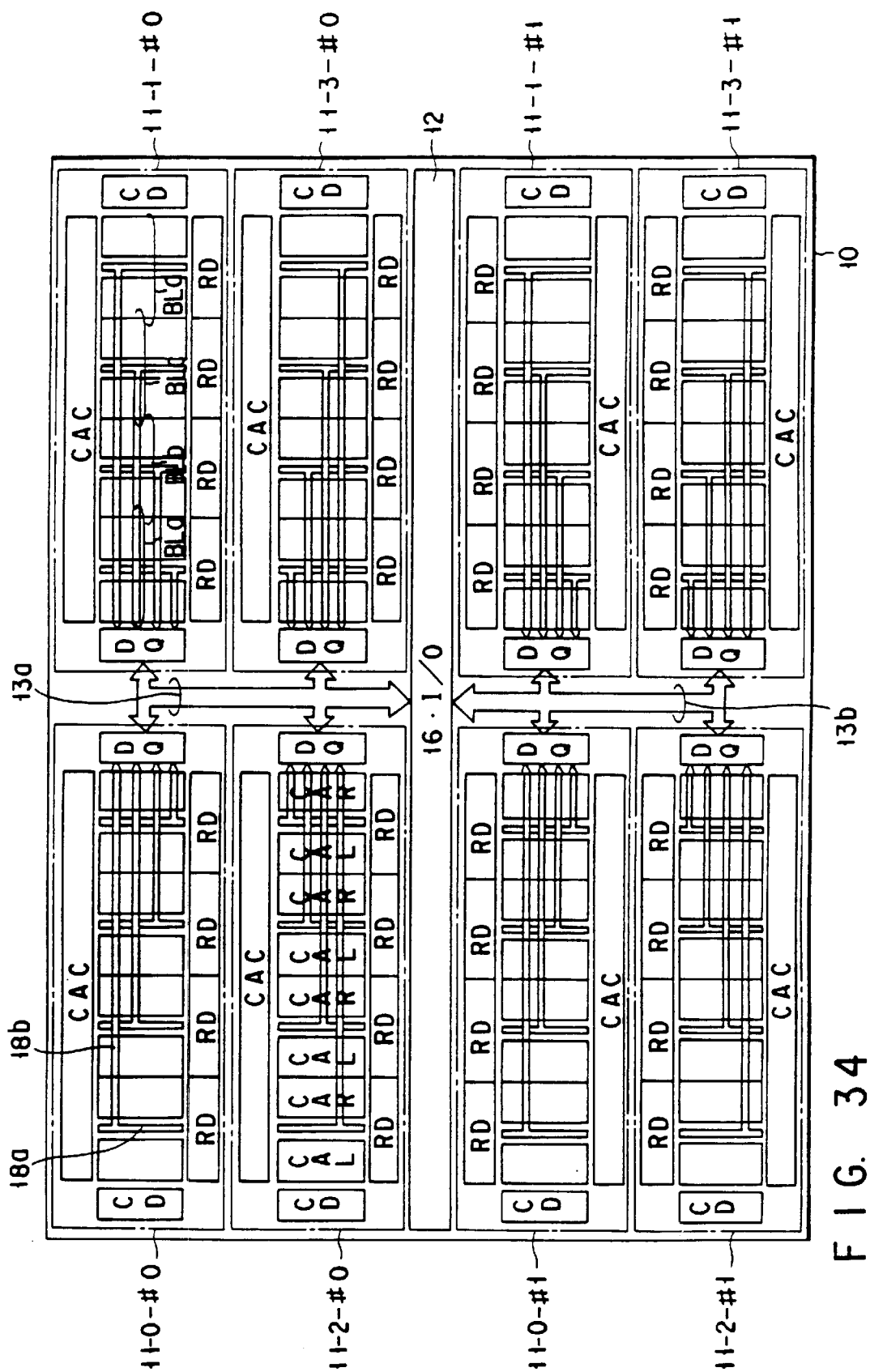
FIG. 34 is a diagram showing, in detail, the layout of the memory chip depicted in FIG. 33.

FIG. 33 illustrates the layout of a fourth modification of the memory chip illustrated in FIGS. 11 and 23. FIG. 34 is a diagram showing, in detail, the memory chip depicted in FIG. 33.

The fourth modified memory chip is different from the chip 10 shown in FIGS. 11 and 23 in the following respects.

First, each bank (or main bank) consists of two sub-banks. More specifically, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1, are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-2-#0 and 11-3-#0 form a first group and are connected to a data I/O circuit 12 by a data bus 13a. Similarly, the sub-banks 11-0-#1, 11-1-#1, 11-2-#1 and 11-3-#1 form a second group and are connected to the data I/O circuit 12 by a data bus 13b.

Second, each of the sub-banks is designed to store and output eight bits (1 byte) at the same time. Each sub-bank has only one column decoder CD as shown in FIG. 34, not two as in the first comparative memory chip shown in FIG. 11. One column decoder CD is sufficient since the sub-bank stores and output eight bits. The column decoder CD is designed to select two columns of memory cells, as in the memory chip shown in FIG. 11, whereby the memory-cell blocks BLa to BLd store and output two bits each. Each sub-bank comprises memory cell arrays CAL and CAR, row decoders RD, local DQ-line pairs 18a, and global DQ-line pairs 18b and QD buffers QD, which are laid out almost in the same way as in the memory chip shown in FIG. 11.

Third, the data I/O circuit 12 is arranged, extending parallel to the columns of memory cells, the data buses 13a and 13b are provided on the sides of the data I/O circuit 12, respectively. The data bus 13a is provided for the sub-banks 11-0-#0, 11-1-#0, 11-2-#0 and 11-3-#0, and the data bus 13b for the sub-banks 11-0-#1, 11-1-#1, 11-2-#1 and 11-3-#1. The data buses 13a and 13b extend parallel to the rows of memory cells, each between the two associated sub-banks, and are connected to the data I/O circuit 12. The data buses 13a and 13b are designed to transfer eight bits each.

In the modified memory chip of FIGS. 33 and 34, when the sub-banks 11-0-#0 and 11-0-#1, for example, are selected, 8-bit data is transferred via the data bus 13a between the sub-bank 11-0-#0 and the data I/O circuit 12, and 8-bit data is transferred via the data bus 13b between the sub-bank 11-0-#1 and the data I/O circuit 12. Therefore, the data buses 13a and 13b need only eight wires each, to transfer eight bits, though the semiconductor chip 10 is a 16-bit type. The area the data buses 13a and 13b occupy is thus relatively small.

FIG. 35 shows the layout of a fourth modification of the second embodiment of the invention, i.e., the memory chip 10 shown in FIG. 22.

The fourth modification of the second embodiment is different from the chip 10 shown in FIG. 22 in the following respects.

First, each main bank consists of two sub-banks. More specifically, the main bank 11-0 consists of sub-banks 11-0-#0 and 11-0-#1; the main bank 11-1 consists of sub-banks 11-1-#0 and 11-1-#1; the main bank 11-2 consists of sub-banks 11-2-#0 and 11-2-#1; and the main bank 11-3 consists of sub-banks 11-3-#0 and 11-3-#1. Two sub-banks of only one main bank are simultaneously selected by a bank-selecting circuit (not shown). Thus, when the sub-banks 11-0-#0 and 11-0-#1, are selected, the sub-banks of the main banks 11-1, 11-2 and 11-3 are not selected. Likewise, when the sub-banks 11-1-#0 and 11-1-#1 are selected, the sub-banks of other main banks 11-0, 11-2 and 11-3 are not selected. The sub-banks 11-0-#0, 11-1-#0, 11-2-#0 and 11-3-#0 form a first group and are connected to a data I/O circuit 12 by a data bus 13a. Similarly, the sub-banks 11-0-#1, 11-1-#1, 11-2-#1 and 11-3-#1 form a second group and are connected to the data I/O circuit 12 by a data bus 13b.

Second, each of the sub-banks is designed to store and output 16 bits (2 byte) at the same time. Each sub-bank has two column decoder CD, not four as in the memory chip shown in FIG. 22. In other words, each sub-bank is of the same structure as its counterpart of the memory chip 10 shown in FIG. 11. Two column decoders CD are sufficient for each sub-bank since the sub-bank stores and output 16 bits. Each column decoder CD is designed to select two columns of memory cells, as in the memory chip shown in FIG. 22, whereby the memory-cell blocks BLa to BLd store and output four bits each. Each sub-bank comprises memory cell arrays CAL and CAR, row decoders RD, local DQ-line pairs 18a, and global DQ-line pairs 18b and QD buffers QD, which are laid out in the same way as in the memory chip shown in FIG. 11.

Third, the data I/O circuit 12 is provided, extending parallel to the columns of memory cell, the data buses 13a and 13b are located on the sides of the data I/O circuit 12, respectively. The data bus 13a is provided for the sub-banks 11-0-#0, and 11-1-#0, 11-2-#0 and 11-3-#0, and the data bus 13b for the sub-banks 11-0-#1, 11-1-#1, 11-2-#1 and 11-3-#1. Both data buses 13a and 13b extend parallel to the rows of memory cells, each located between two associated sub-banks. They are connected to the data I/O circuit 12 and designed to transfer 16 bits each.

In the modified memory chip of FIG. 35, when the sub-banks 11-0-#0 and 11-0-#1, for example, are selected, 16-bit data is transferred via the data bus 13a between the sub-bank 11-0-#0 and the data I/O circuit 12, and 16-bit data is transferred via the data bus 13b between the sub-bank 11-0-#1 and the data I/O circuit 12. Therefore, the data buses 13a and 13b need only 16 wires each, to transfer 16 bits, though the semiconductor chip 10 is a 32-bit type. The area the data buses 13a and 13b occupy is thus relatively small.

Figure 36:
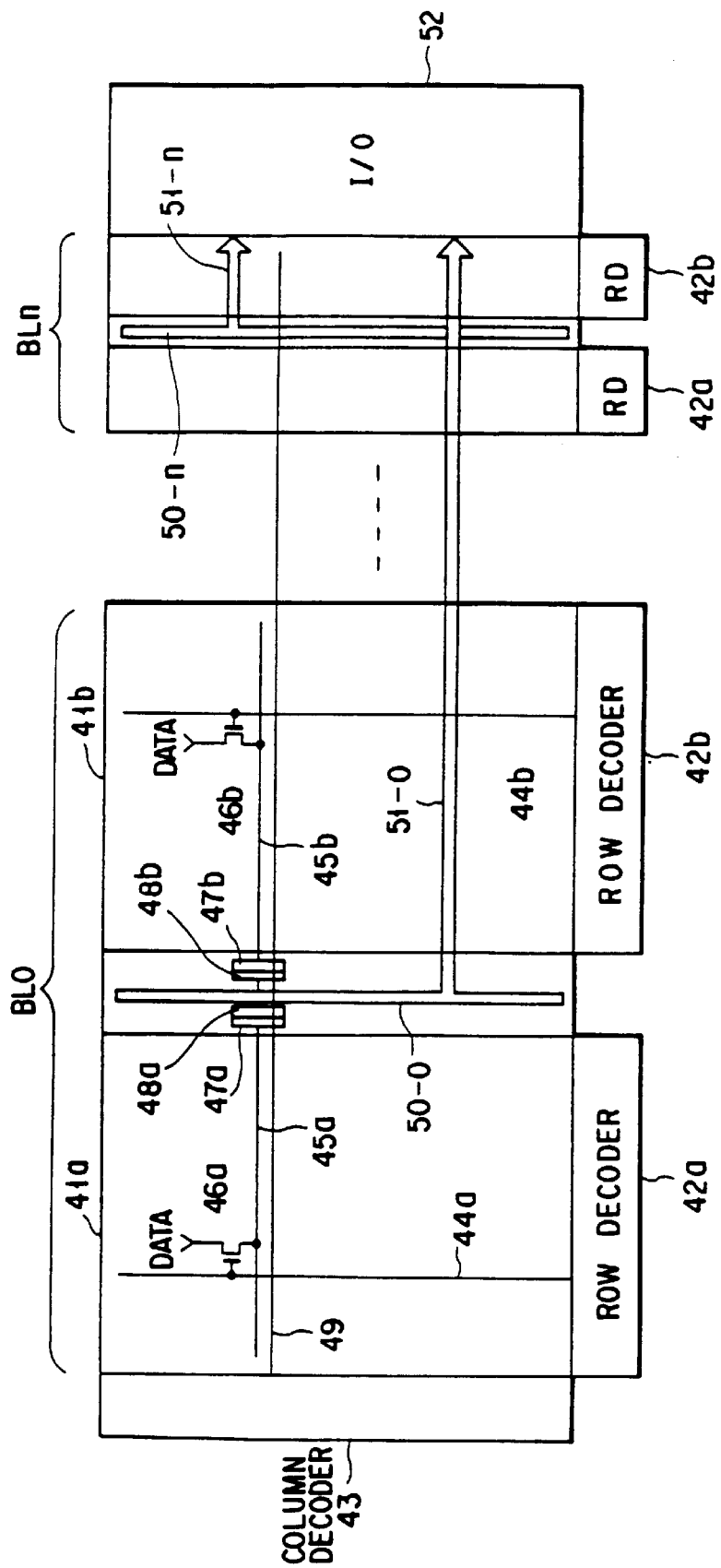
FIG. 36 is a diagram showing a data transfer system of the present invention.

FIG. 36 illustrates a data transfer system according to the present invention.

As shown on FIG. 36, the data transfer system comprises n switch BL0 to BLn and a column decoder 43. The blocks BL0 to BLn are arranged, extending right angle to rows of switches. The blocks BL0 to BLn are identical in structure, each made of the same components. Only the block BL0 will be described below.

The switch block BL0 comprises switch arrays 41a and 41b, row decoders 42a and 42b, word lines 44a and 44b, data lines 45a and 45b, registers 47a and 47b, column-selecting switches 48a and 48b, column-selecting lines 49, and a local DQ line 50-0. Each switch array is composed of a plurality of switches (MOS transistors) 46a and 46b which are arranged in rows and columns, forming a matrix of switches.

The row decoder 42a is provided at one of the sides of the switch array 41a which extend at right angles to the rows of switches. Similarly, the row decoder 42b is located at one of the sides of the switch array 41b which extend at right angles to the rows of switches. The word lines 44a are connected at one end to the row decoder 42a, and the word lines 44b are connected at one end to the row decoder 42b. Connected to each word line 44a are the gates of the switches 46a which are arranged in one row. Connected to each word line 44b are the gates of the switches 46b which are arranged in one row.

The column decoder 43 is provided at one of the sides of the switch array 41a which extend at right angles to the columns of switches. The column-selecting lines 49 are connected at one end to the column decoder 43.

The registers 47a and 47b and the column-selecting switches 48a and 48b are located between the switch arrays 41a and 41b. The data lines 45a are connected at one end to the register 47a and the column-selecting switch 48a. The data lines 45b are connected at one end to the register 47b and the column-selecting switch 48b. Connected to each data line 45a are the output terminals (drains) of the switches 46a which are arranged in a column. Connected to each data line 45b are the output terminals (drains) of the switches 46b which are arranged in a column. The column-selecting lines 49 are connected to the column-selecting switches 48a and 48b.

When the the data transfer system described above operates, data is supplied to the input terminals (sources) of the switches 46a and 46b in each of the switch blocks BL0 to Bln.

The local DQ line 50-0 is provided between the switch arrays 41a and 41b, extending in parallel to the rows of switches. The local DQ line 50-0 is connected to both column-selecting switches 48a and 48b.

The data transfer system has a global DQ line 51-0 and a data input/output circuit 52. The global DQ line 51-0 extends over the n blocks BL0 to BLn, in parallel to the columns of switches. The data input/output (I/O) circuit 52 is located at one of the sides of the memory-cell block BLn which extend at right angles to the columns of switches. The global DQ line 51-0 is connected at one end to the local DQ line 50-0 and at the other end to the data (I/O) circuit 52.

The data transfer system is characterized in that the data items output from the blocks BL0 to BLn are input to the data I/O circuit 52 through the global DQ line 51-0 extending over the switch arrays 41a and 41b. This is because the switch blocks BL0 to BLn are arranged in a line parallel to the columns of switches. Thus, the data items are collected in the data I/O circuit 52 located at one end of the last switch block BLn and finally output from the data transfer system which is an LSI.

Figure 37:
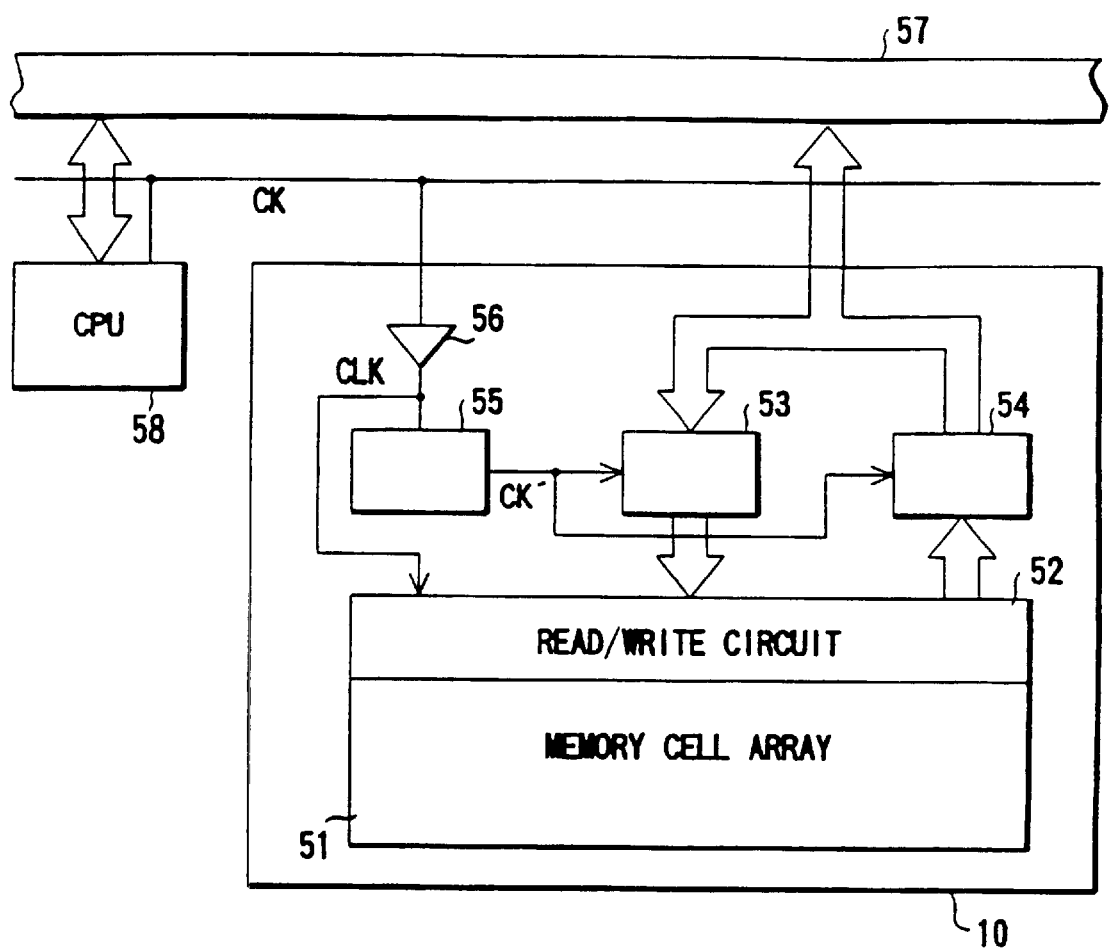
FIG. 37 is a diagram showing a memory system of the present invention.

FIG. 37 is a memory system according to the present invention.

As seen from FIG. 37, the memory system comprises a memory chip 10, an I/O bus 57 and a CPU (Central Processing Unit) chip 58. The memory chip 10 is one selected from the semiconductor memories illustrated in FIGS. 2 to 36. Provided in the memory chip 10 are a memory cell array 51, a read/write circuit 52, an input circuit 53, an output circuit 54, a synchronization circuit 55, and a clock buffer 56.

In operation, the CPU chip 58 generates a clock signal CK, which is supplied to the memory chip 10 and used therein as an internal clock signal CKL. The clock signal CKL is supplied to the read/write circuit 51. The circuit 52 operates in synchronism with the internal clock signal CKL.

The synchronization circuit 55 removes the skew between the clock signal CK and the internal clock signal CKL and generates an internal clock signal CK'. The signal CK' is supplied to the input circuit 53 and the output circuit 54. The circuits 53 and 54 operate in synchronism with the internal clock signal CK'.

The I/O bus 57 connects the memory chip 10 and the CPU chip 58. Data can therefore be transferred through the I/O bus 57 between the memory chip 10 and the CPU chip 58.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A data transfer system comprising:
    a plurality of switch blocks arranged in a line parallel to column of switches, each comprising:
        a switch array each having a plurality of switches arranged in the form of a matrix;
        a row decoder provided at one of two sides of said switch array which extend at right angles to row of switches;
        a local DQ line provided to one side of switch array and extending parallel to the rows of switches; and
        a data line connected to switches of said switch array, for supplying data to said local DQ line;
    a global DQ line extending over said switch blocks, in parallel to the column of switches, and connected at one end to said local DQ line;
    a column decoder provided at one side of said switch blocks, for selecting the column of switches provided in said switch blocks; and
    a data input/output circuit provided at one side of said switch blocks and connected to the other end of said global DQ line, for receiving and outputting data.

2. The data transfer system according to claim 1, further comprising column-selecting lines located on said switch array.

3. The data transfer system according to claim 2, further comprising column-selecting switches located one side of said switch array, and connected to said column-selecting lines.

4. The data transfer system according to claim 1, further comprising registers located one side of said switch arrays, and connected between said data line and said local DQ line.

5. The data transfer system according to claim 1, wherein said data input/output circuits receiving and outputting bits of multi-bit data at the same time.

* * * * *